United States Patent
Akcasu

(10) Patent No.: US 10,510,828 B2
(45) Date of Patent: Dec. 17, 2019

(54) CAPACITOR WITH HIGH ASPECT RADIO SILICON CORES

(71) Applicant: nanoHenry, Inc., San Diego, CA (US)

(72) Inventor: Osman Ersed Akcasu, San Diego, CA (US)

(73) Assignee: Nano Henry, Inc., San Diego, CA (US)

( * ) Notice: Subject to any disclaimer, the term of this patent is extended or adjusted under 35 U.S.C. 154(b) by 0 days.

(21) Appl. No.: 16/217,229

(22) Filed: Dec. 12, 2018

(65) Prior Publication Data

US 2019/0115422 A1 Apr. 18, 2019

Related U.S. Application Data

(63) Continuation-in-part of application No. 15/285,310, filed on Oct. 4, 2016.

(51) Int. Cl.
*H01L 49/02* (2006.01)
*H01L 27/01* (2006.01)
(Continued)

(52) U.S. Cl.
CPC .......... *H01L 28/92* (2013.01); *H01L 21/0217* (2013.01); *H01L 21/0228* (2013.01); *H01L 21/02164* (2013.01); *H01L 21/283* (2013.01); *H01L 21/30604* (2013.01); *H01L 27/016* (2013.01); *H01L 28/10* (2013.01); *H01L 28/88* (2013.01); *H01L 29/94* (2013.01); *H03H 3/00* (2013.01); *H03H 7/0115* (2013.01); *H03H 1/00* (2013.01); *H03H 2001/0064* (2013.01);
(Continued)

(58) Field of Classification Search
CPC ... H01L 28/92; H01L 28/10; H01L 21/02164; H01L 21/0217; H01L 21/0227; H01L 21/283; H01L 21/30604
See application file for complete search history.

(56) References Cited

U.S. PATENT DOCUMENTS

| | | |
|---|---|---|
| 5,208,725 A | 5/1993 | Akcasu |
| 5,501,893 A | 3/1996 | Laermer et al. |
| (Continued) | | |

*Primary Examiner* — Stephen E. Jones
*Assistant Examiner* — Samuel S Outten
(74) *Attorney, Agent, or Firm* — Law Office of Gerald Maliszewski; Gerald Maliszewski

(57) ABSTRACT

High aspect ratio passive electrical components are presented formed from a single-piece silicon (Si) substrate having a textured surface with at least one high aspect ratio structure. The high aspect ratio structure includes a Si core having a width ($C_X$), a height ($C_Z$), and a minimum aspect ratio of $C_Z$-to-$C_X$ of at least 5:1. An electrical conductor layer overlies the Si core. The electrical component may be a capacitor, inductor, or transmission line. In the case of a capacitor, the substrate textured first surface is made up of a plurality of adjacent high aspect ratio conductor-dielectric-Si (CDS) structures. Each CDS structure includes: a Si core, a dielectric layer overlying the Si core, and an electrical conductor layer overlying the dielectric layer. The Si cores may be formed in the geometry of parallel ridges, columns, or as a honeycomb. Each Si core comprises at least 90% of the CDS structure height.

30 Claims, 33 Drawing Sheets

(51) Int. Cl.
*H03H 3/00* (2006.01)
*H01L 21/02* (2006.01)
*H03H 7/01* (2006.01)
*H01L 21/306* (2006.01)
*H01L 21/283* (2006.01)
*H01L 29/94* (2006.01)
*H03H 1/00* (2006.01)

(52) U.S. Cl.
CPC ............ *H03H 2001/0078* (2013.01); *H03H 2001/0085* (2013.01)

(56) References Cited

U.S. PATENT DOCUMENTS

| | | |
|---|---|---|
| 7,790,597 B2 | 9/2010 | Chauhan et al. |
| 9,425,761 B2 | 8/2016 | Zuo et al. |
| 9,893,048 B2 | 2/2018 | Lan et al. |
| 2013/0134553 A1* | 5/2013 | Kuo ................ H01L 23/147 257/532 |
| 2016/0308020 A1* | 10/2016 | Sreenivasan ........ H01L 29/6659 |
| 2018/0167054 A1 | 6/2018 | Min et al. |

* cited by examiner $W_{MIN} = 2\ \mu m \quad W = \dfrac{t_{Si}}{\alpha}$ WHERE $25 < \alpha < 50$

CAPACITOR WITH HIGH ASPECT RADIO SILICON CORES

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to passive electronic components and, more particularly, to components, such as capacitors, using conductors formed with a high aspect ratio silicon core.

2. Description of the Related Art

Silicon and glass interposer structures are in wide use today for generating high density stacked (3D Packaging) applications in a wide range of products where board space is at a premium, such as in personal computers (PC's), laptop computers, Internet of things (IoT) and medical devices, programmable logic and graphics hardware modules, and cell phone handset products [7-15]. Cell phone/Smart phone applications, having in the order of 1,500,000,000 parts/year volume, are probably the largest volume among the above-listed today and is the main driving force behind the research and development (R&D) activity in this field.

A massive miniaturization effort has been going on for some time in the modules for the smart phone market using integrated circuits (IC's), inductors, and capacitors [7-15], [27, 28]. Easily implemented structures to provide high capacitance density in IC technologies have always been an important area of research [3] and it continues to be. For high volume smart phone radio frequency (RF) applications in the multi-gigahertz range, like in 5G filter modules, antenna switches, diplexer, and triplexers, the inductors are in the order of 1-5 nanoHenry (nH) and the capacitors fall within 0.1-10 picoFarad (pF) range. On the other hand, in the high frequency DC/DC converter space with the switching frequencies on the order 50 megahertz (MHz) or higher, the inductors are always greater than 4 nH with low DC resistance ($R_{DC}$) values, and the capacitors are in the range of 1 nanoFarad (nF) or larger [34-42]. In addition, power management integrated circuits (PMICs) can function better with larger valued capacitors, which are in the order of 10 nF and higher.

RF modules manufactured with a single layer integrated interdigitated capacitance structure and enabled in a high-performance silicon interposer [1] can be built smaller and with a higher performance due to the high Q of the inductors, as compared to their glass counterparts [7-15]. However, these modules do not have a high enough capacitance per unit area for many DC/DC module applications, which require off-the-interposer high valued chip capacitors. Therefore, in many applications where silicon interposers are used, having only high performance/high packing density inductors, the lower capacitance density interdigitated comb type capacitors do not adequately address the miniaturization required for DC/DC converter modules.

MOS (metal oxide semiconductor) capacitor physics and processing has been investigated very thoroughly and has been well understood for a long time, even before the widespread use of the MOS device [19-24]. Since aspects of the MOS capacitor are related to the devices presented herein, a very thorough and complete investigation of MOS capacitor physics and its related math is presented herein, as a section with no short cuts—based on only mathematical and physical reasoning with proofs.

HARMS Process Single Layer Interdigitated Comb Capacitor Structure

Reference [1] presents analytical electromagnetic theory to show that spiral inductors built with high aspect ratio windings, on the order of 10 and higher, enable a very high packing density high Q, and high due to their natural internal "favorable" current density distribution. However, IC or microelectromechanical system (MEMS) metallization processes cannot produce a metal thicknesses on the order of 50 microns (μ) and higher, with aspect ratios (height-to-width) of larger than 2-4. In the HARMS (high aspect ratio metallization along with High Aspect Ratio Metal Spacing) process that is explained in [1], the problem is tackled in a different way, taking a totally opposite approach. Instead of depositing a thick metal, patterning it, and using standard metal etching techniques, which cannot produce high aspect ratios, the silicon is etched to produce a "silicon core" or a "fence" with the desired high aspect ratio using Bosch process that creates aspect ratios on the order of 25-50 or even higher, followed by a highly conformal metal deposition and etch [4-7]. Several other processing methods for the HARMS process, along with the Bosch process, are also available that enable the formation of high aspect ratio metal windings.

FIG. 1 is a representation of a scanning electron microscope (SEM) image of silicon trenches formed using the Bosch process (prior art). The main processing parameter of the Bosch process is related to the aspect ratio of the silicon trench that has highly vertical and clean walls as shown, given as, $$\alpha = \frac{t_{Si}}{w_{Si}} \quad (1.1)$$

Aspect ratios of $\alpha$=25-50 and even higher, with a very high yield for many applications, make Bosch a very attractive process in the MEMS world [27, 28].

FIG. 2 is a perspective view of spiral or wound inductor using a high aspect ratio silicon core (prior art). The patterned and etched "silicon core" or "silicon fence" of FIG. 1 can be metalized on 3 sides with a thickness of $\delta_{METAL}$ to form the conductive portion of a spiral inductor [1].

FIGS. 3A and 3B are, respectively, plan view and partial cross-sectional views of an interdigitated comb capacitor formed using HARMS process silicon cores (prior art). The low capacitance per unit area issue associated with the use of interdigitated comb capacitor structure given in [1] can be explained with very simple math related to the parallel plate capacitor formula [16-18], $$C = \varepsilon_0 \varepsilon_r \frac{\text{Area}}{s} \quad (1.2)$$

where $\varepsilon_0$, $\varepsilon_r$, Area, and s are, respectively, the dielectric constant of free space ($\varepsilon_0$=8.87×10$^{-14}$ F/cm), the relative dielectric constant of the dielectric between the parallel plates, the area of the vertical plates, and the spacing between the vertical plates.

Assuming the layout of the interdigitated comb capacitor structure shown in FIGS. 3A and 3B, an equal number of n fingers exist along the y axes for both plates A and B. Furthermore, the length of the capacitance structure along x axes $P_x$, is very large compared to the finger width and spacing written as $P_x \gg w$, s. The SEM of FIG. 1 depicts an exemplary silicon (Si) core height of $t_{Si}=50\mu$.

Ignoring all the fringing electric fields from top and bottom of the structure as well as at the convex and concave corners, the capacitance C between A and B plates can be approximated using the parallel plate approximation given in (1.2) as, $$C \cong \varepsilon_0 \varepsilon_r \frac{(2n-1)[(P_x - w - s) + w]}{s} t \qquad (1.3)$$

The first bracket $(2n-1)$, gives the number of spaces between the electrodes A and B, each with the spacing value of s along y axes between the fingers drawn along x axes which can fit in $P_y$. The first bracket in the square bracket is the length along x axes of each of the fingers written in terms of $P_x$, w and s. Each horizontal finger also has a width w. Therefore, the second term in the square bracket gives the length along y axes.

The spacing s shown in FIGS. 3A and 3B between the fingers can be written as, $$s \equiv s_{Si} - 2\delta_{METAL} \qquad (1.4)$$

Similarly, the width w, of the fingers in terms of the silicon core or "fence" width $w_{Si}$ can be written as, $$w = w_{Si} + 2\delta_{METAL} \qquad (1.5)$$

where $\delta_{METAL}$ is the total thickness of the deposited and electro-plated metal. The total finger thickness t in terms of silicon thickness $t_{Si}$ and $\delta_{METAL}$ simply is, $$t = t_{Si} + \delta_{METAL} \qquad (1.6)$$

The capacitance equation approximation (1.3) is misleadingly in that it shows capacitance to be a linear function of silicon thickness $t_{Si}$, which is the silicon etched by the Bosch process. This wrong conclusion is based upon the assumption that by increasing $t_{Si}$ a larger capacitance plate area is created, therefore increasing the capacitance per unit area. However, due to aspect ratio $\alpha$, increasing $t_{Si}$ gives a larger plate-to-plate separation that reduces the capacitance per unit area. Since the first effect increases the capacitance and the second reduces it, another wrong conclusion follows in assuming that the capacitance might be independent from $t_{Si}$. However, again due to the aspect ratio $\alpha$, a smaller number of fingers can be packed along y axes with increasing $t_{Si}$. This reduces the capacitance per unit area of the structure and therefore the net effect of increasing $t_{Si}$ results in a reduction of the capacitance per unit area. If a complete mathematical analysis is not done, even in a simple problem like this one may result in an incorrect conclusion.

The key final geometry related Bosch processing parameter is the aspect ratio $\alpha$ as given earlier in (1) which also sets the minimum width silicon core, $w_{Si}$, and the minimum silicon core-to-core (fence-to-fence) spacing $S_{Si}$ possible in the etch process for a selected silicon wafer thickness $t_{Si}$. Simplifying (1.3) gives, $$C \cong \varepsilon_0 \varepsilon_r \frac{(2n-1)(P_x - s)}{s} t \qquad (1.7)$$

For a good metallization, the $\alpha_{SPACE}=t/s$ ratio must also be maintained, which happens to be on the same order as $\alpha$, but theoretically cannot be larger than $\alpha$. Introducing the spacing aspect ratio $\alpha_{SPACE}$, which is a metallization processing related process parameter, into (1.4) and (1.6) gives, $$\alpha_{SPACE} = \frac{t}{s} = \frac{t_{Si} + \delta_{METAL}}{s_{Si} - 2\delta_{METAL}} \le \alpha = \frac{t_{Si}}{w_{Si}} \qquad (1.8)$$

Re-writing (1.7) as a function of aspect ratio $\alpha_{SPACE}$ gives, $$C \cong \varepsilon_0 \varepsilon_r (2n-1)(P_x - s)\alpha_{SPACE} \qquad (1.9)$$

The relation between the length along y axes can now be introduced, in other words, the height of the capacitance structure $P_y$, and the number of fingers in each terminal n, w, and s as, $$P_y = nw + (2n-1)s \qquad (1.10)$$

Solving n from (1.10) gives, $$n = \frac{P_y + s}{w + 2s} \qquad (1.11)$$

As it can be seen from (1.11), the smaller the width w and spacing s, the larger the n and the larger the capacitance value. The minimum value of the width w and space s are inversely related to aspect ratios $\alpha$ and $\alpha_{SPACE}$, and directly proportional to silicon thickness $t_{Si}$ through (1.1) and (1.8). Therefore, the larger the silicon thickness $t_{Si}$, the smaller the n value. Substituting n as calculated in (1.11) in the $(2n-1)$ term which appears in (1.9) can be written as, $$2n - 1 = \frac{2P_y - w}{w + 2s} \qquad (1.12)$$

For $P_y \gg w$ equation (1.12) becomes, $$2n - 1 \cong \frac{2P_y}{w + 2s} \qquad (1.13)$$

Substituting (1.13) in (1.9) and for $P_x \gg s$ gives, $$C \cong \varepsilon_0 \varepsilon_r \left(\frac{2P_y P_x}{w + 2s}\right) \alpha_{SPACE} \qquad (1.14)$$

For $\delta_{METAL} \ll t_{Si}$, $w_{Si}$ and by writing w and s as given in (1.1) and (1.14), terms of aspect ratios $\alpha$, $\alpha_{SPACE}$ and silicon thickness $t_{Si}$, (1.14) become, $$C(t_{Si}, \alpha, \alpha_{SPACE}, P_x, P_y) \cong \varepsilon_0 \varepsilon_r \left(\frac{2P_y P_x}{\frac{t_{Si}}{\alpha} + 2\frac{t_{Si}}{\alpha_{SPACE}}}\right) \alpha_{SPACE} \qquad (1.15)$$

Having $\alpha_{SPACE}=\alpha$ gives the very simple and easy to grasp result of, $$C \cong \frac{2}{3}\varepsilon_0\varepsilon_r\left(\frac{P_y P_x}{t_{Si}}\right)\alpha^2 \qquad (1.16)$$

As can be seen from (1.16), the capacitance C is inversely proportional to silicon thickness $t_{Si}$ and quadratically proportional to the aspect ratio $\alpha$. This is a very different conclusion than the initial quick and misleading conclusion, The capacitance per unit area $C_{PUA}$ for the interdigitated capacitor can be written as, $$C_{PUA} = \varepsilon_0\varepsilon_r\left(\frac{2}{\frac{t_{Si}}{\alpha}+2\frac{t_{Si}}{\alpha_{SPACE}}}\right)\alpha_{SPACE} \qquad (1.17)$$

For $\alpha_{SPACE}=\alpha$ condition (1.17) simplifies even further to, $$C_{PUA} = \varepsilon_0\varepsilon_r\frac{2\alpha^2}{3t_{Si}} \qquad (1.18)$$

An important figure of merit is to see how this calculated capacitance per unit area compares to a MOS capacitor capacitance per unit area with an oxide thickness $t_{OX}$ that can block a maximum voltage $V_{MAX}$. Oxide thickness $t_{OX}$ can be calculated with simple relation given by the relation (2.24) and (2.25). $C_{PUA\_MOSCAP}$ is the parallel plate capacitance per unit area derived from (1.2) for the MOS capacitor given as, $$C_{PUA\_MOSCAP} = \varepsilon_0\varepsilon_r\frac{1}{t_{ox}} \qquad (1.19)$$

FIG. 4 is a graph of capacitance per unit area as a function of silicon thickness $t_{Si}$, with $\alpha=\alpha_{SPACE}$ and $\alpha=25$ and 50. The two straight horizontal lines are MOS capacitance values for oxide thicknesses of 10 and 5 nm that give 10 and 5 volts of oxide breakdown voltages, as built in the same area as the interdigitated capacitor. As can be seen, the capacitance per unit area of the interdigitated capacitor reduces as silicon thickness $t_{Si}$ increases as described above.

FIG. 5 is a graph for an exemplary interdigitated capacitor with 10 nF value having its square side dimensions of "a" plotted as a function of silicon thickness. A capacitor of 10 nF, which is a reasonable value for high frequency switcher DC/DC applications, requires an unacceptably large interposer area.

It would be advantageous, as demonstrated in FIG. 5, if much larger capacitance per unit area values could be obtained, as shown in (1.17), in a small interposer package for PMIC applications.

The inventor would like to acknowledge the assistance of Prof. Dr. Yusuf Leblebici and Dr. Seniz E. Kucuk Eroglu of the Microelectronic Systems Laboratory Swiss Federal Institute of Technology, Lausanne, Switzerland for providing technical assistance in manufacturing structures as herein disclosed and Michael Brunolli and Jan C. Diffenderfer of Escondido, Calif., for discussions, simulations, literature survey, and constant encouragements throughout the work.

The following references provide supplemental and background information for this disclosure:

1. "Miniature Inductors and Related Circuit Components and Methods of Making Same", O. E. Akcasu, Ser. No. 15/285,310, filed Apr. 5, 2018, US2018/0096777. This application is incorporated herein by reference.
2. "Miniature Inductors and Related Circuit Components and Methods of Making Same", O. E. Akcasu, World Intellectual Property Organization (WPO) International Publication Number WO 2018/067594 A1, 12 Apr. 2018.
3. "High Capacitance Structure in Semiconductor Device", O. E. Akcasu, USPTO U.S. Pat. No. 5,208,725A, May 4, 1993.
4. "Method of Anisotropically Etching Silicon", Franz Laermer, Andrea Schilp, U.S. Pat. No. 5,501,893, Mar. 26, 1996.
5 "Maximum Achievable Aspect Ratio in Deep Reactive Ion Etching of Silicon due to Aspect Ratio Dependent Transport and Microloading Effect", Junghoon Yeom, Yan Wu, John C. Selby and Mark A. Shannon, Journal of Vacuum Sci. Technol. B 23(6), November/December 2005, pp. 2319-2329.
6. "Very High Aspect Ratio Deep Reactive Ion Etching of Sub-micrometer Trenches in Silicon", Jayalakshmi Parasurman, Anand Summanwar, Frederic Marty, Philippe Basset, Dan E. Angelescu and Tarik Bourouina, IEEE Journal of Micromechanical Systems, 2012-0181
7. "Solder Cap Application Process on Copper Bump Using Solder Power Film", Chauhan et al., U.S. Pat. No. 7,790, 597 B2, Sep. 7, 2010.
8. "Design and Assembly of Double-Sided 3D Package with a Controller and a DRAM Stack", Xi Liu, Ming Li, Don Mullen, Julia Cline and Suresh K. Sitaraman, 2012 IEEE 62nd Electronic Components and Technology Conference.
9. "Passive-on-Glass (POG) Device and Method", Je-Hsiung Jeffrey Lan, Niranjan Sunil Mudakatte, Changhan Hobie Yun, Daeik Daniel Kim, Chenjie Zuo, David Francis Berdy, Mario Francisco Valez and Jonghae Kim, U.S. Pat. No. 9,893,048 B2, Feb. 13, 2018.
10. "High Pass Filters and Low Pass Filters using Through Glass via Technology", Chegjie Zuo, Jonghae Kim, Changhan Hobie Yun, Dacik Daniel Kim, Mario Francisco Valez, Je-Hsiung Lan, Robert Paul Mikula and Matthew Michael Nowak, U.S. Pat. No. 9,425,761, B2, Aug. 23, 2016.
11. "Hybrid Passive-on-Glass (POG) Acoustic Filter", David Francis Berdy, Changhan Hobie Yun, Shiqun Gu, Niranjan Sunil, Mudakatte, Mario Francisco Valez, Chengjie Zuo, and Jonghae Kim, USPTO Publication US2018/0167054A1, Jun. 14, 2018.
12. "Modeling, Design, Fabrication and Demonstration of RF Front-End 3d IPAC Module with Ultra-thin Glass Substrates for LTE Applications", Junki Min, Zihan Wu, Markondeya Raj Pulugurtha, Vanessa Smet, Venky Sundaram and Rao Tummala, Arjun Ravindran and Christian Hoffman, 2016 IEEE 66th Electronic Components and Technology Conference, pp. 1297-1301.
13. "Miniaturized Bandpass Filters as Ultrathin 3-D IPDs and Embeded Thinfilms in 3-D Glass Modules", Srikrishna Sitaraman, Vijay Sukumaran, Markondeya Raj Pulugurtha, Zihan Wu, Yaya Suziki, Yongwoo Kim, Venky Sundaram, Joungho Kim and Rao Tummala, IEEE Transactions on Components, Packaging and Manufacturing Technology, VOL. 7, NO. 9, September 2017, pp. 1410-1418.

14. "Ultrathin High-Q 2-D and 3-D RF Inductors in Glass Packages", Min Suk Kim, Markondeya Raj Pulugurtha, Venky Sundaram, Rao Tummala and Hobie Yun, IEEE Transactions on Components, Packaging and Manufacturing Technology, VOL. 8, NO. 4, April 2018, pp. 643-651.
15. "Ultra-High I/O Density Glass/Silicon Interposers for High Bandwidth Smart Mobile Applications", Gomul Kumar, Tapobrata Bandyopadhyay, Vijay Sukumaran, Venky Sundaram, Sung Kyu Lim and Rao R. Tummala. 2011 Electronic Components and Technology Conference.
16. "Engineering Electromagnetic Fields and Waves," Carl T. A. Johnk, John Willey & Sons, Copyright 1975, ISBN 0-471-44289-5.
17. "Elements of Electromagnetics," Matthew N. O. Sadiku, Oxford University Press, Copyright 2001 Third Edition, 2001, ISBN 0-19-513477-X.
18. "The Feynman Lectures on Physics", Richard P. Feynman, Robert B. Leighton, Matthew L. and Sands, Copyright 1963, 1989 California Institute of Technology, ISBN 0-201-51003-0. Vol. II, pp. 7.9.
19. "MOS Physics and Technology, H. Nicollian and J. R. Brews, Willey and Sons, 1982 pp. 157.
20. "Ideal MOS Curves for Silicon", A. Goetzberger, Bell System Tech. J. Vol. 45, 1966, pp. 1097.
21. "Physics of Semiconductor Devices", S. M. Sze, $2^{nd}$ Edition, Copyright 1981, John Willey& Sons, Inc. ISBN 0-471-05661-8.
22. "Principals of Semiconductor Devices", Bart Van Zeghbroeck, Copy Right, Bart Van Zeghbroeck, 1996, Chapter 6.0. MOS Capacitors.
23. "MOS Capacitors: Theory and Modeling", Dragica Vasileska, Arizona State University, https://nanohub.org/resources/5088/download/mos_tutorial.pdf
24. "Notes on the Solution of the Boltzmann-Poisson Equation for MOS Capacitors and MOSFETS", $2^{nd}$ Edition, Mark Lundstrom and Xingshu Sun, Oct. 24, 2012, Purdue University, West Lafayette, Ind. 47907, https://nanohub.org/sources/5338.
25. "Properties and Characterization of ALD Grown Dielectric Oxides for MIS Structures", S. Gieraltowska, D. Sztenkiel, E. Guziewicz, M. Godlewski, G. Luka, B. S. Witowski, L. Wachinicki, E. Lusakowska, T. Dietl, and M. Sawicki.
26. "High Dielectric Constant Oxides", J. Robertson, The European Journal of Physics, Vol. 28, Applied Physics, 2004, pp. 265-291.
27. "Micro Electronics Packaging Handbook", edited by Rao R. Tummala and Eugene J. Rymaszewski, Van Nostrand Reinhold, N.Y., Copyright 1989, ISBN 0-442-20578-3
28. "History of MEMS", http://scme-nm.org/files/History%20of%20MEMS_Presentsation.pdf
29. "General Relation of Thermal Oxidation of Silicon", Bruce. E. Deal and Andy S. Grove, J. Appl. Physics, Vol. 36, 3770, 1965.
30. "Physics and Technology of Semiconductor Technology", Andy S. Grove, Willey International Edition, 1967, ISBN-13 978 0471329985
31. "Gate Oxide Scaling Limits and Projection", Chenming Hu, IEDM 1996, pp. 319-322.
32. "Convergence Properties of Newton's Method for the Solution of Semiconductor Carrier Transport Equations and Hybrid Solution Techniques for Multidimensional Simulation of VLSI Devices", O. E. Akcasu, Solid-State Electron. Vol. 27, pp. 319-328, April 1984.
33. "Three Dimensional Transient Simulation of Electro-Thermal Behavior in Semiconductor Devices and It's Applications", O. E. Akcasu, J. L. Bouknight, T. Luich, R. Jerome, and S. Leibiger, IEEE IEDM December, 1987, Washington, D.C., pp. 514-517.
34. "FIVR-Fully Integrated Voltage Regulators on $4^{th}$ Generation Intel Core SoCs", Edward A. Burton, Gerhard Schrom, Fabrice Paillet, William J. Lambert, Kaladhar Radhakrishnan and Michael J. Hill, Advanced Power Electronics Conference, Fort Worth, Tex., 2014.
35. "Package Embedded Inductors for Integrated Voltage Regulators," William J. Lambert, Kaladhar Radhakrishnan, Leigh Wojewoda and Anne E. Augustine,
36. "Haswell: A Family of IA 22 nm Processors", N. Kurd, et al., ISSCC 2014, San Francisco, 2014.
37. "Design of a Fully-Integrated Buck Voltage Regulator Using Standard CMOS Technology," Miguel A. Rojas-Gonzales, Joselyn Torres and Edgar Sanchez-Sinencio.
38. "A Switched-Inductor Integrated Voltage Regulator with Nonlinear Feedback and Network-on-Chip Load in 45 nm SOI," IEEE Journal of Solid-State Circuits, Vol. 47, No 8, August 2012, pp. 1935-1945.
39. "A 50-MHz Fully Integrated Low-Swing Buck Converter Using Packaging Inductors," Youngkook Ahn, Hyunseok Nam and Jeongjin Roh, IEEE Transaction on Power Electronics, Vol. 27, No 10, October 2012, pp. 4347-4356.
40. "Voltage Regulators for Next Generation Microprocessors," Toni Lopez, Reinhold Elferich and Eduard Alarcon, ISBN 978-1-4419-7559-1.
41. "Multi-Phase Buck Converters for Integrated Voltage Regulation in High Performance SoC's", Ed (Ted) Burton, ISSCC 2017 San Francisco, Calif.
42. "A 10 nm FINFET 2.8 GHz tri-gear deca-core CPU complex with optimized power delivery network for SoC performance" H. Mair, E. Wang, P. Kao, Y. Tsai, S Gururajarao, R. Ragerquist, J. Son, J. Gammie, G. Lin, A. Thippana, K. Li, M. Rahman, W. Kuo, D. Yen, W. Zhuang, U. Fu, H. Wang, M. Peng, C. Wu, T. Dosluoglu, A. Gelman, D. Dia, G. Gurumurthy, T. Hsieh, W X Lin, R. Tzeng, J. Wu, C H Wang and U. Ko, ISSCC 2017 San Francisco, Calif. pp. 56-57.
43. "An Analytical, Temperature dependent Model for Majority- and Minority-carrier Mobility in Silicon Devices", S. Reggianni, M. Valdinoci, L. Colalongo, M. Rudan and G. Baccarani, VLSI Design, 2000, Vol. 10, No 4, 467-483.
44. "Electron and Hole Mobilities in Silicon as a Function of Concentration and Temperature", N. D. Aurora, J. R. Hauser and D. J. Roulston, IEEE Transactions on Electron Devices, ED-29, Vol. 2, February 1982.

SUMMARY OF THE INVENTION

Disclosed herein are devices incorporating high capacitance density CDS (conductor-dielectric-silicon) structures that may be used, for example, as a silicon interposer capacitor. As integrated with a variation of the high aspect ratio metal spacing (HARMS) process, capacitance/area densities of 8-150 nanoFarads per square millimeter (nF/mm$^2$) are possible with a 10V breakdown voltage, making the device suitable for any PMIC (power management integrated circuit) application. These capacitance densities are 25-50 times higher than standard MOS (metal-oxide-semiconductor) capacitor per unit area values with the same breakdown voltage. Since a CDS capacitor is bias voltage dependent, variations in the fabrication process can also be used in tunable capacitance applications such as in a VCO (voltage controlled oscillators), PLL (phase-locked loop), and RFIC (radio frequency integrated circuits) applications, instead of conventional reverse biased varactor p-n diodes. Modifications in the conventional HARMS process also permit the fabrication of high Q miniature inductors and transmission lines.

Accordingly, a high aspect ratio passive electrical component is presented including a single-piece silicon (Si) substrate having a textured first surface and a high aspect ratio structure. The high aspect ratio structure includes a Si core having a width ($C_X$), a height ($C_Z$), and a minimum aspect ratio of $C_Z$-to-$C_X$ of at least 5:1, and an electrical conductor layer overlying the Si core. As explained in detail below, the electrical component may be a capacitor, inductor, or transmission line. In the case of a capacitor, the high aspect ratio structure further includes a dielectric layer interposed between the Si core and electrical conductor.

In one aspect, a high aspect ratio CDS capacitor is presented composed of a single-piece silicon substrate having a textured first surface and a second planar surface. A textured electrode conformally coats the substrate textured first surface, made up of a plurality of adjacent high aspect ratio CDS structures. Each CDS structure includes: a Si core, a dielectric layer overlying the Si core, and an electrical conductor layer overlying the dielectric layer. The conductive layer may be a metal, polycrystalline semiconductor, a doped semiconductor, or a doped polycrystalline semiconductor. A planar electrode is formed on the substrate second surface, underlying the textured electrode. The CDS Si cores each have a width ($C_X$), a height ($C_Z$), and an aspect ratio (a) of $C_Z$-to-$C_X$ of at least 5:1. Adjacent CDS structure Si core centers are separated by a spacing ($S_X$) and have a spacing aspect ratio ($\alpha_{SPACE}$) of $C_Z$-to-$S_X$ of at least 5:1. Typically, each Si core comprises at least 90% of the CDS structure height.

In one aspect, the substrate textured first surface includes a plurality of parallel trenches formed in the first surface, with unetched Si sidewalls separating the trenches, so that the CDS structure Si cores are formed by the unetched Si sidewalls. In another aspect, the substrate textured first surface includes an array of Si columns in the first surface, with adjacent column centers separated a first separation distance ($S_X$) in a first direction and a second separation distance ($S_Y$) in a second direction orthogonal to the first direction. In this case, the CDS structure Si cores are formed by the columns. In another variation, the substrate includes a trench array formed in the textured first surface, and the CDS structure Si cores are formed as a honeycomb with adjacent honeycomb wall centers separated by a first distance ($S_X$) in a first direction and a second separation ($S_Y$) in a second direction orthogonal to the first direction.

In a typical application, the substrate is an interposer integrated circuit (IC) and the capacitor further includes a first electrically conductive terminal connected to the textured electrode, and a second electrically conductive terminal connected to the planar electrode.

Addition details of the capacitor, a transmission, a filter network including an inductor and capacitor, as well as associated fabrication methods are presented in more detail below.

DETAILED DESCRIPTION

Figure 1:
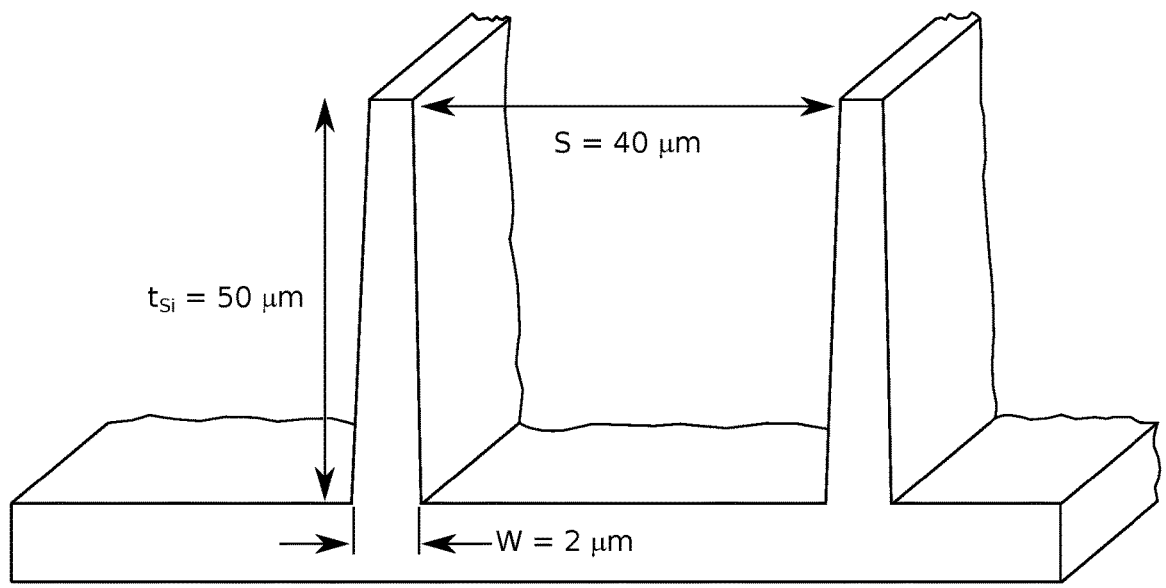
FIG. 1 is a representation of a scanning electron microscope (SEM) image of silicon trenches formed using the Bosch process (prior art).
Figure 2:
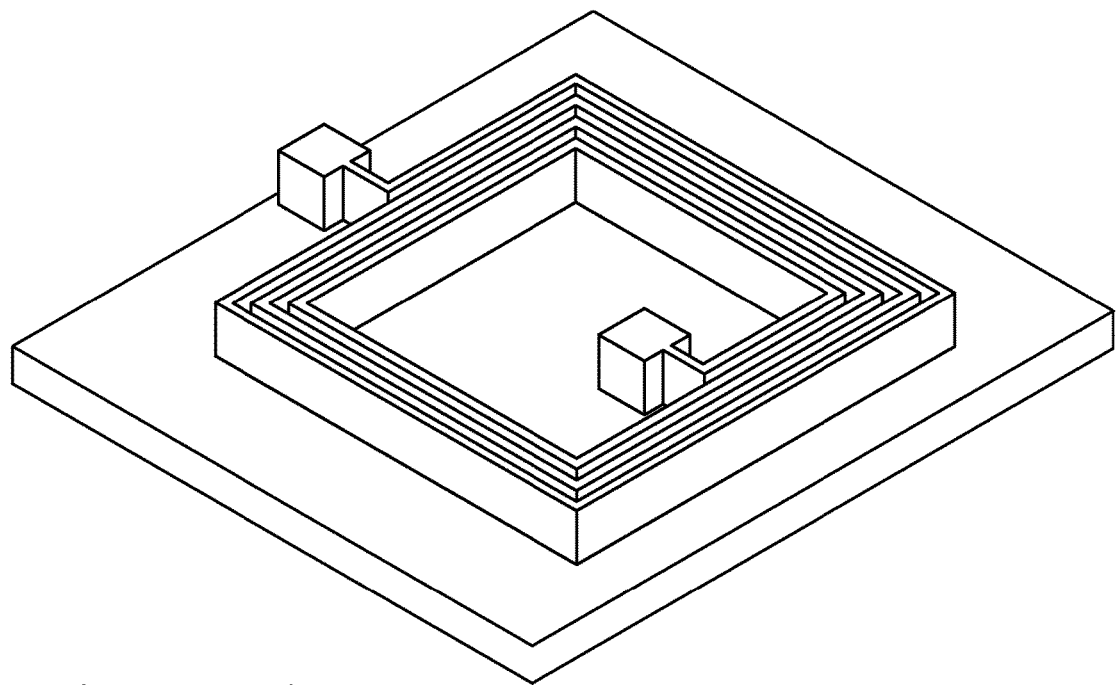
FIG. 2 is a perspective view of spiral or wound inductor using a high aspect ratio silicon core (prior art).
Figure 3A:
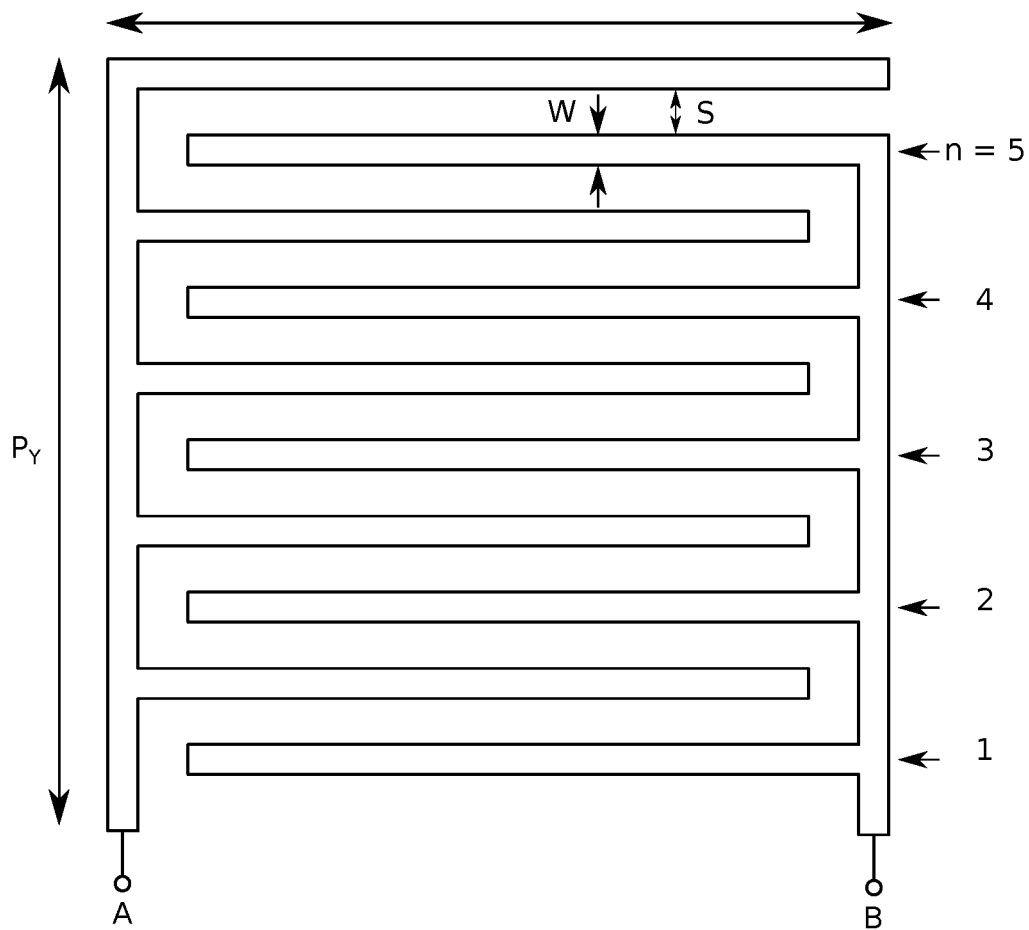
FIGS. 3A and 3B are, respectively, plan view and partial cross-sectional views of an interdigitated comb capacitor formed using HARMS process silicon cores (prior art).
Figure 3B:
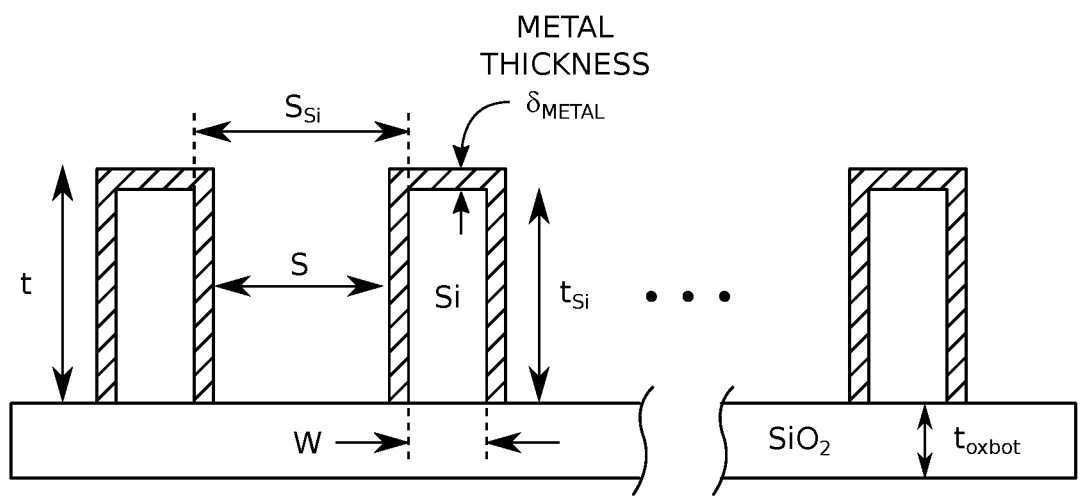
Figure 4:
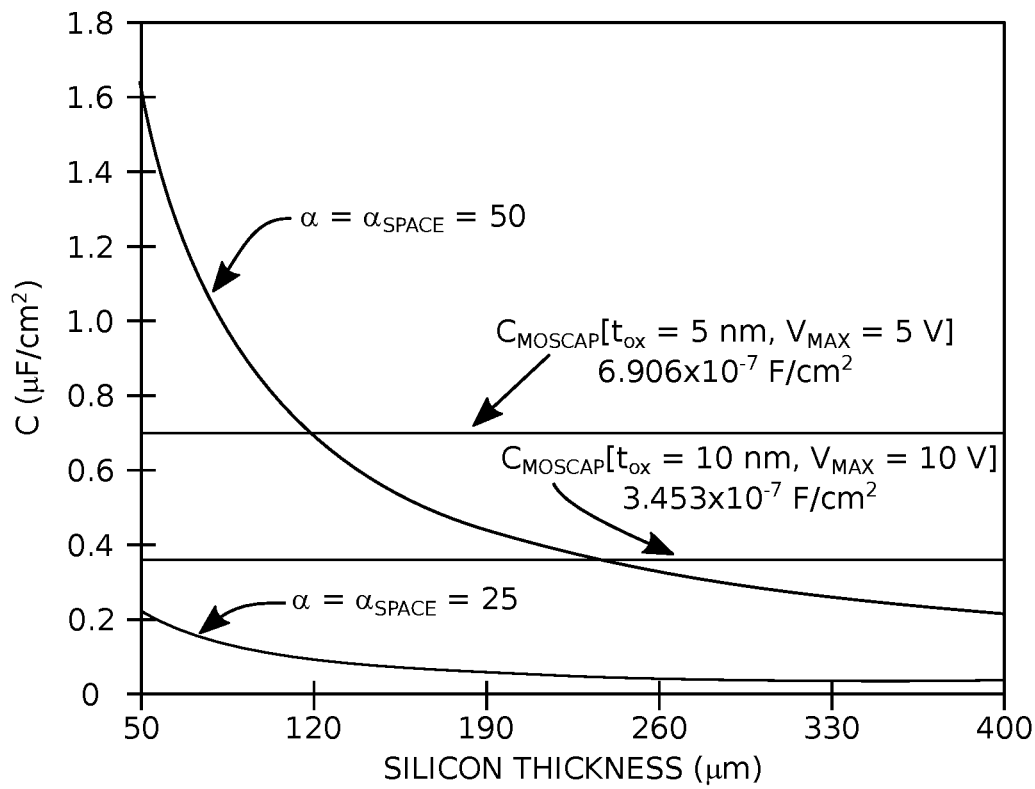
FIG. 4 is a graph of capacitance per unit area as a function of silicon thickness $t_{Si}$, with $\alpha=\alpha_{SPACE}$ and $\alpha=25$ and 50.
Figure 5:
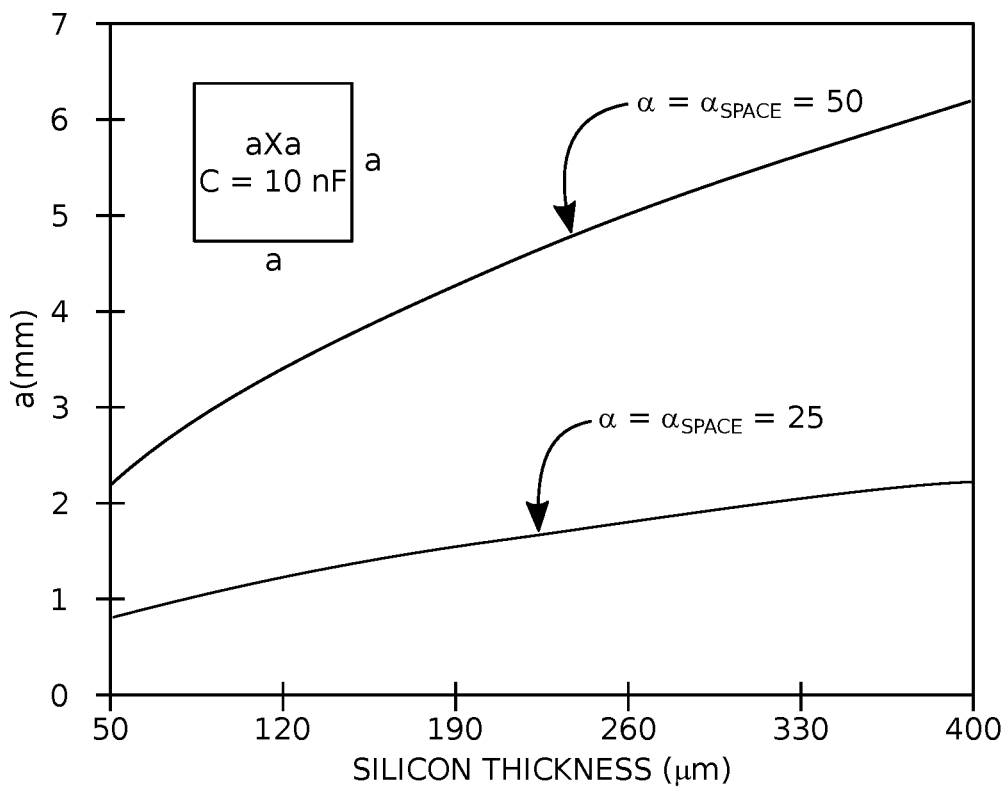
FIG. 5 is a graph for an exemplary interdigitated capacitor with 10 nF value having its square side dimensions of "a" plotted as a function of silicon thickness.
Figure 6:
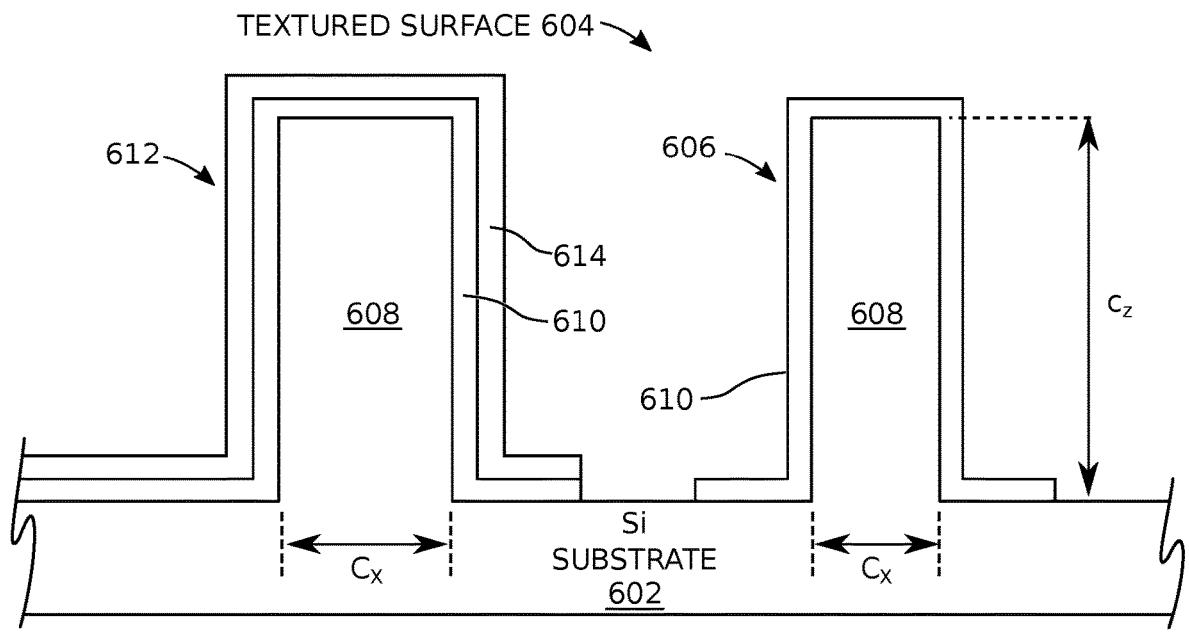
FIG. 6 is a partial cross-sectional view of a high aspect ratio passive electrical component.

FIG. 6 is a partial cross-sectional view of a high aspect ratio passive electrical component. The component 600 comprises a single-piece silicon (Si) substrate 602 having a textured first surface 604 and a high aspect ratio structure 606. The high ratio aspect structure 606 comprises a Si core 608 having a width ($C_X$), a height ($C_Z$), and a minimum aspect ratio of $C_Z$-to-$C_X$ of at least 5:1. An electrical conductor layer 610 overlies the Si core 608, forming a conductor-silicon (CS) structure. For contrast, it should be understand that in conventional thin-film integrated circuit (IC) processes, metal line thicknesses and the spacing between lines is on the order of 1 to 2 microns. Also shown is a high aspect ratio structure 612 that further comprises a dielectric layer 614 interposed between the Si core 608 and electrical conductor 610, forming a conductor-dielectric-silicon (CDS) structure. The depicted components may be part of a capacitor, inductor, high current strap, or transmission line, as described in more detail below.

Figure 7A:
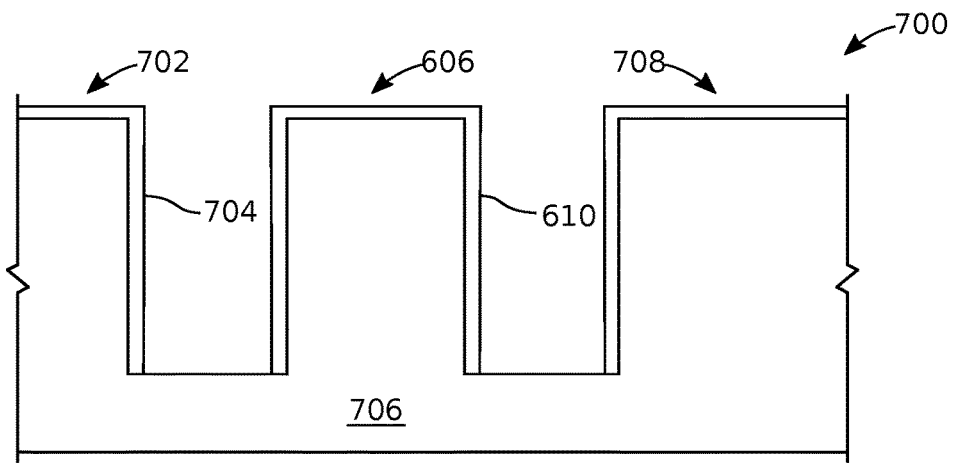
FIGS. 7A and 7B are, respectively, partial cross-sectional and plan views of a microstrip transmission line.
Figure 7B:
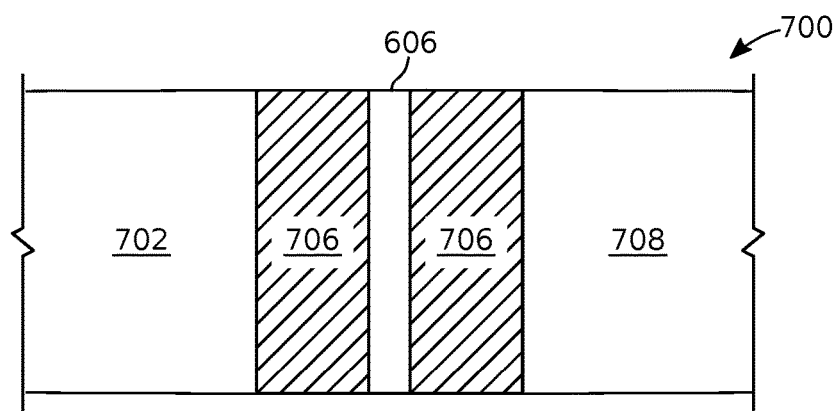

FIGS. 7A and 7B are, respectively, partial cross-sectional and plan views of a microstrip transmission line 700. The transmission line comprises a CD structure 606, a first high aspect ratio ground plane 702 parallel to, and adjacent a first side of the CS structure electrical conductor 610. As shown, the ground plane 702 comprises a metal, or other conductive material, layer 704 overlying Si substrate 706. A second high aspect ratio ground plane 708 is parallel to and adjacent a second side of the electrical conductor 610. In some aspects not shown, a dielectric layer may be interposed between conductive layer and Si core, forming a CDS structure. A CD or CDS structure, without the requirement of closely adjacent ground planes can also be used to form a high current strap.

Figure 8A:
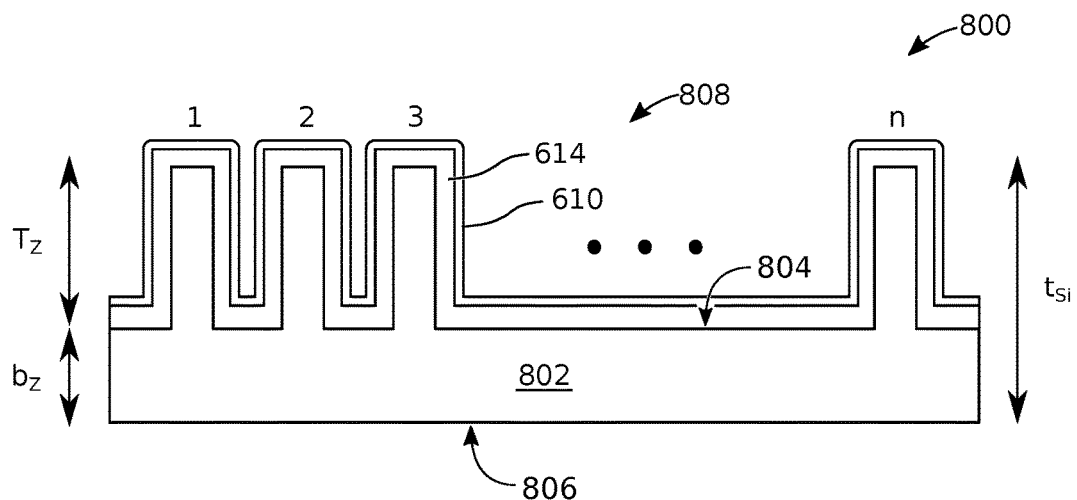
FIGS. 8A through 8C are partial cross-sectional views of a high aspect ratio conductor-dielectric-silicon (CDS) capacitor.
Figure 8B:
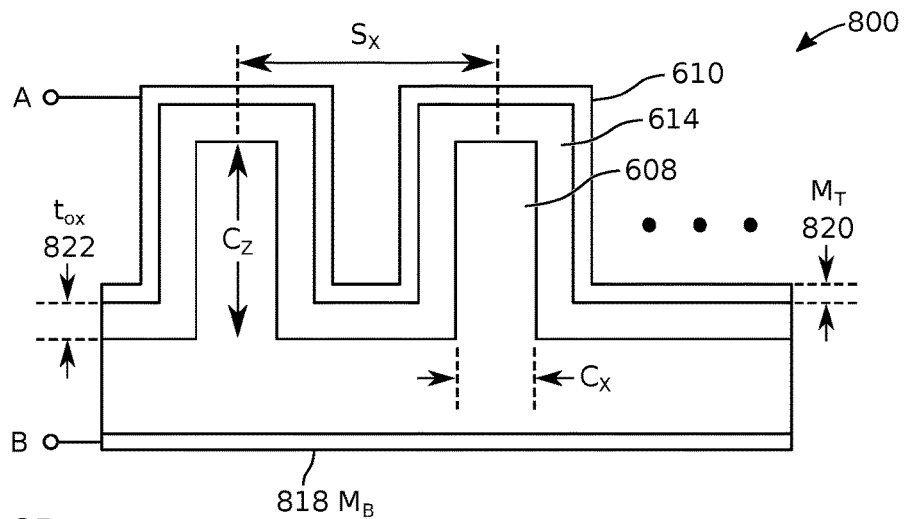
Figure 8C:
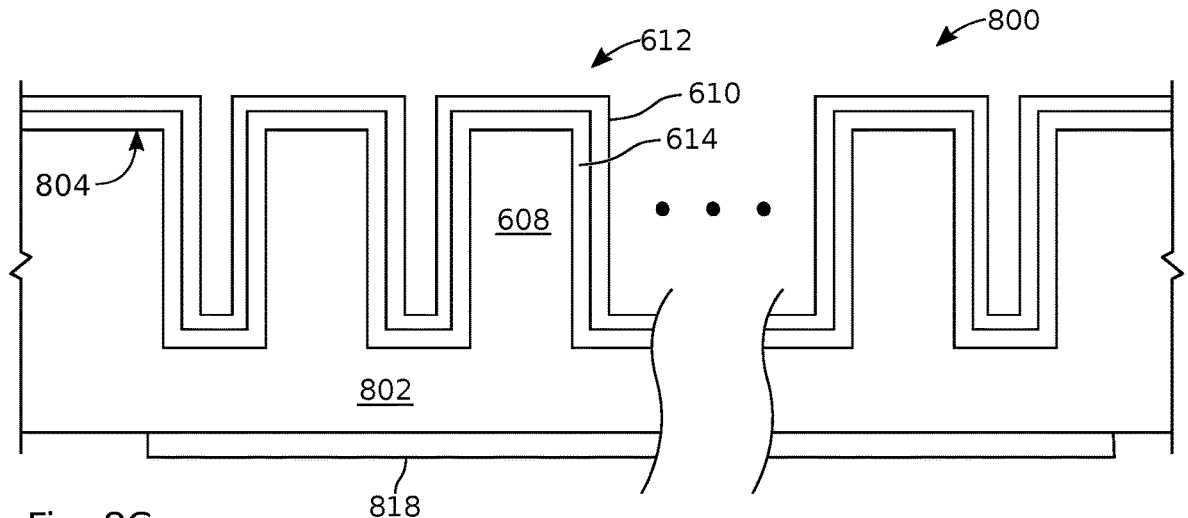

FIGS. 8A through 8C are partial cross-sectional views of a high aspect ratio conductor-dielectric-silicon (CDS) capacitor. The capacitor 800 comprises a single-piece Si substrate 802, although it would be possible to use other semiconductor materials. Such a substrate 802 is typically obtained when a Si wafer is cut into individual dies, in which case the single-piece Si substrate may be referred to as a die. The substrate 802 has a textured first surface 804 and a second surface 806, which is typically planar. As shown, the first and second surfaces 804 and 806 are essentially parallel to a common "horizontal" plane and are on opposite sides of the Si substrate 802. A textured electrode 808 conformally coats the substrate textured first surface 804, creating a plurality of adjacent high aspect ratio CDS structures 810. In FIG. 8A, n number of CDS structures 810 is shown. Each CDS structure 612 comprises a Si core 608, a dielectric layer 614 (e.g., silicon dioxide ($SiO_2$)) overlying the Si core, and an electrical conductor layer 610 overlying the dielectric layer, see FIG. 8B. The CDS structure conductive layer 610 may be a material such as metal, polycrystalline semiconductor, a doped semiconductor, and or doped polycrystalline semiconductor. A planar electrode 818 is formed on the substrate second surface 806, underlying the textured electrode 808. The planar electrode is typically metal, but may also be one of the above-mentioned electrically conductive materials. The electrode terminals are schematically depicted in FIG. 8B as "A" and "B". While electrode 818 is typically planar for ease of fabrication, in some aspects not shown, it may also have a textured shape.

The CDS Si cores have a width ($C_X$), a height ($C_Z$), and an aspect ratio ($\alpha$) of $C_Z$-to-$C_X$ of at least 5:1. As explained below, aspect ratios of 25 to 50 are not uncommon. Adjacent CDS structure Si core 816 centers are separated by a spacing ($S_X$) and have a spacing aspect ratio ($\alpha_{SPACE}$) of $C_Z$-to-$S_X$ of at least 5:1.

Typically, the Si core 608 comprises at least 90% of the CDS structure height ($T_Z$), and any increase in CDS structure height per area results in an increase in capacitance between adjacent CDS structures 612. The CDS structure conductor layer thickness 820 is typically less than or equal to four times the conductor skin depth at the capacitor operating frequency. Likewise, an increase in CDS Si core aspect ratio ($\alpha$) per area results in an increase in capacitance between adjacent CDS structures 612. Ideally, the dielectric thickness is uniform across all surfaces, but in some aspects the dielectric thickness at the top (horizontal) portion of the Si cores is greatest, becoming thinner along the Si core (vertical) sidewalls, with the greatest non-uniformity occurring at the corners. However, non-uniformities in the dielectric thickness can be mitigated if a slow dielectric growth rate is used. Alternatively stated, the combination of the plurality of CDS structure conductive layers 816 forms a textured conductive surface area, and an increase in capacitance density results from an increase in textured conductive surface area. An increase in the CDS structure dielectric layer thickness 822 results in an increase in capacitor breakdown voltage and a decrease in capacitance per unit area.

Figure 9:
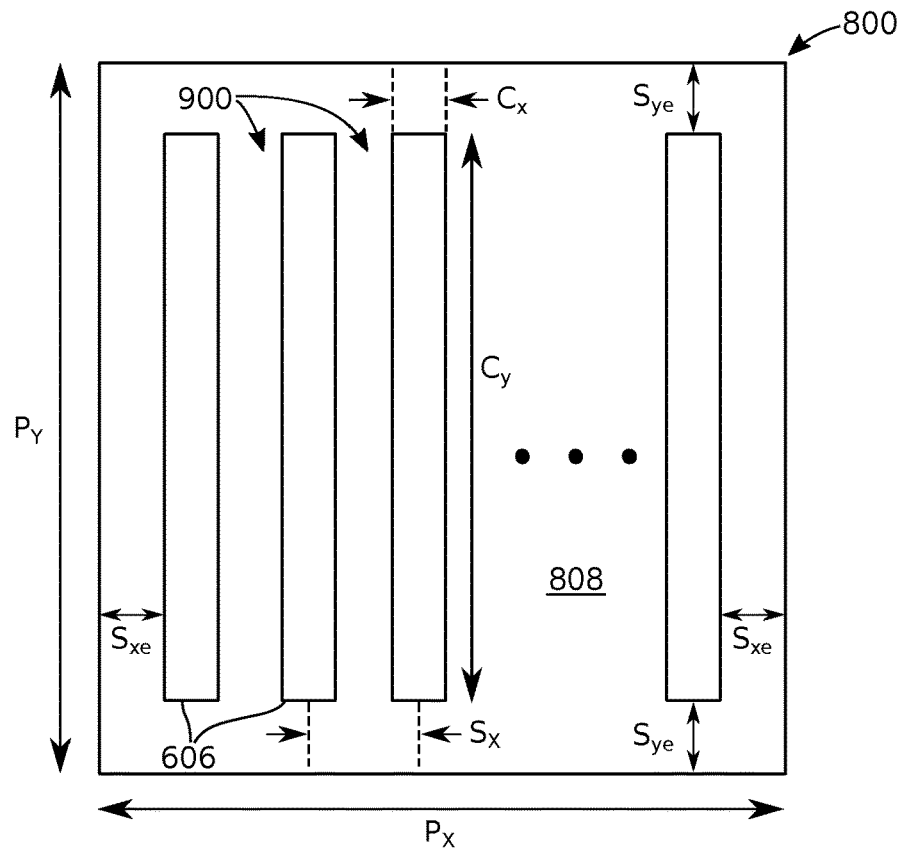
FIG. 9 is a plan view of a first variation of the capacitor of FIGS. 8A and 8B.

FIG. 9 is a plan view of a first variation of the capacitor of FIGS. 8A and 8B. In this aspect the substrate textured first surface and textured electrode 808 includes a plurality of parallel trenches 900 formed in the first surface, with unetched Si sidewalls separating the trenches. The CDS structure 612 Si cores, not shown since they underlie the dielectric and conductive layers, are formed by the unetched Si sidewalls.

Figure 10A:
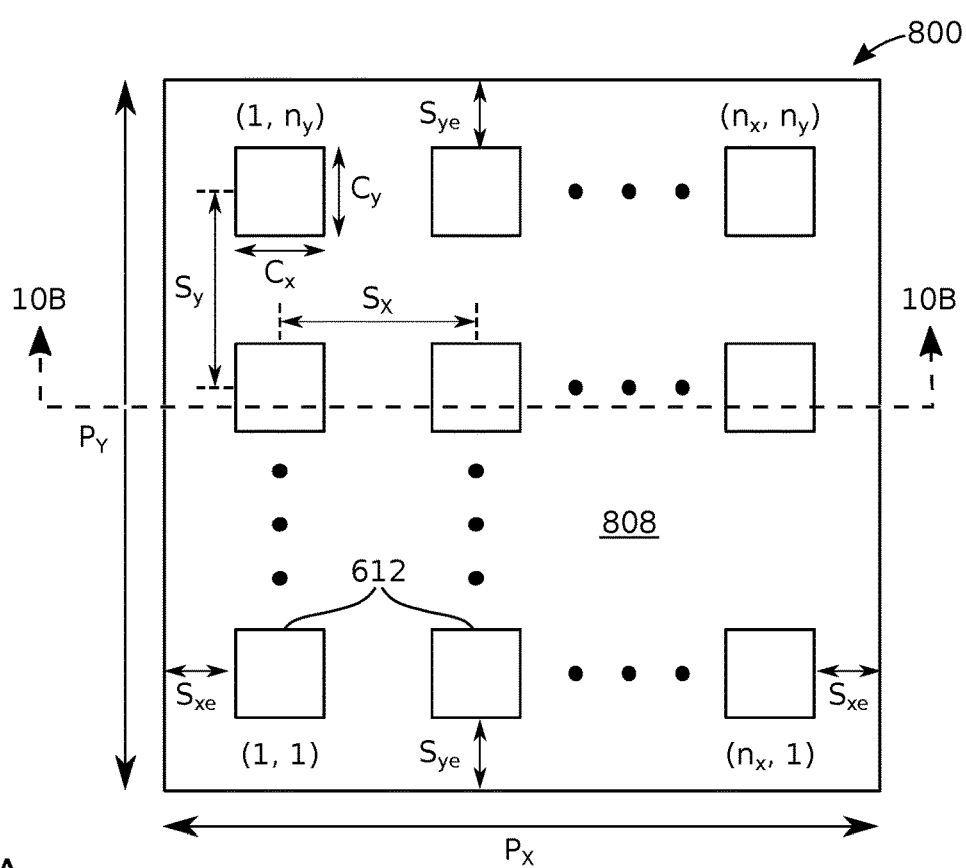
FIGS. 10A through 10C are, respectively, plan, cross-sectional, and perspective views of a second variation of the capacitor of FIGS. 8A and 8B.
Figure 10B:
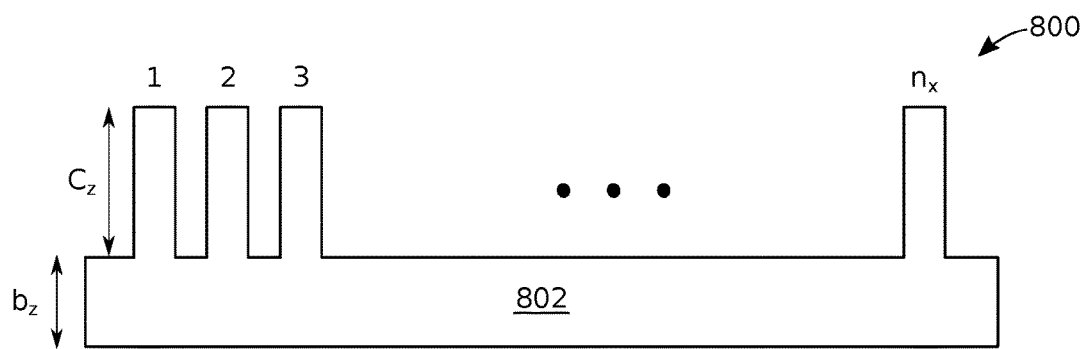
Figure 10C:
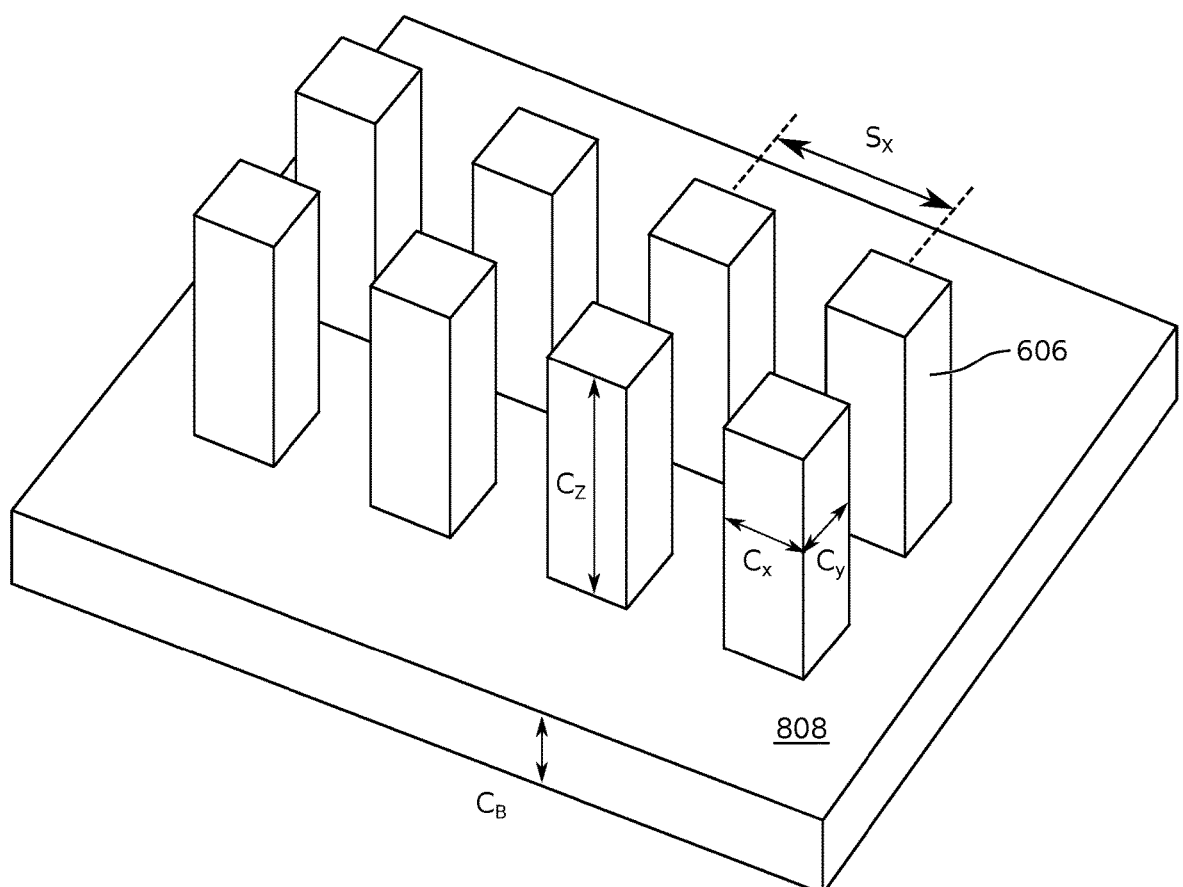

FIGS. 10A through 10C are, respectively, plan, cross-sectional, and perspective views of a second variation of the capacitor of FIGS. 8A and 8B. In this aspect the substrate textured first surface 804 includes an array of Si columns in the first surface, with adjacent column centers separated a first separation distance ($S_X$) in a first direction and a second separation distance ($S_Y$) in a second direction orthogonal to the first direction. The CDS structure 612 Si cores, not shown since they underlie the dielectric and conductive layers, are formed by the columns. Here the columns are depicted as square, but it should be understood that they are not limited to any particular geometry. Dimensions $S_X$ and $S_Y$ are depicted as being equal, but they need not be so. Likewise, even if the columns are rectangular in shape, dimensions $C_X$ and $C_Y$ need not be equal.

Figure 11A:
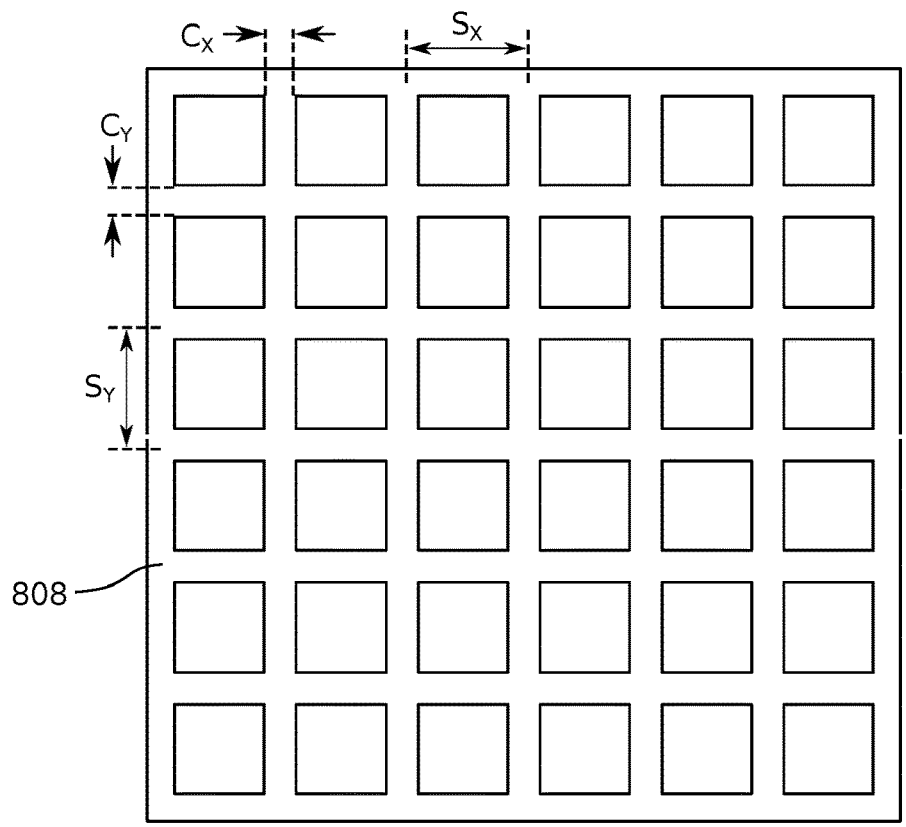
FIGS. 11A and 11B are, respectively, plan and perspective views of a third variation of the capacitor shown in FIGS. 8A and 8B.
Figure 11B:
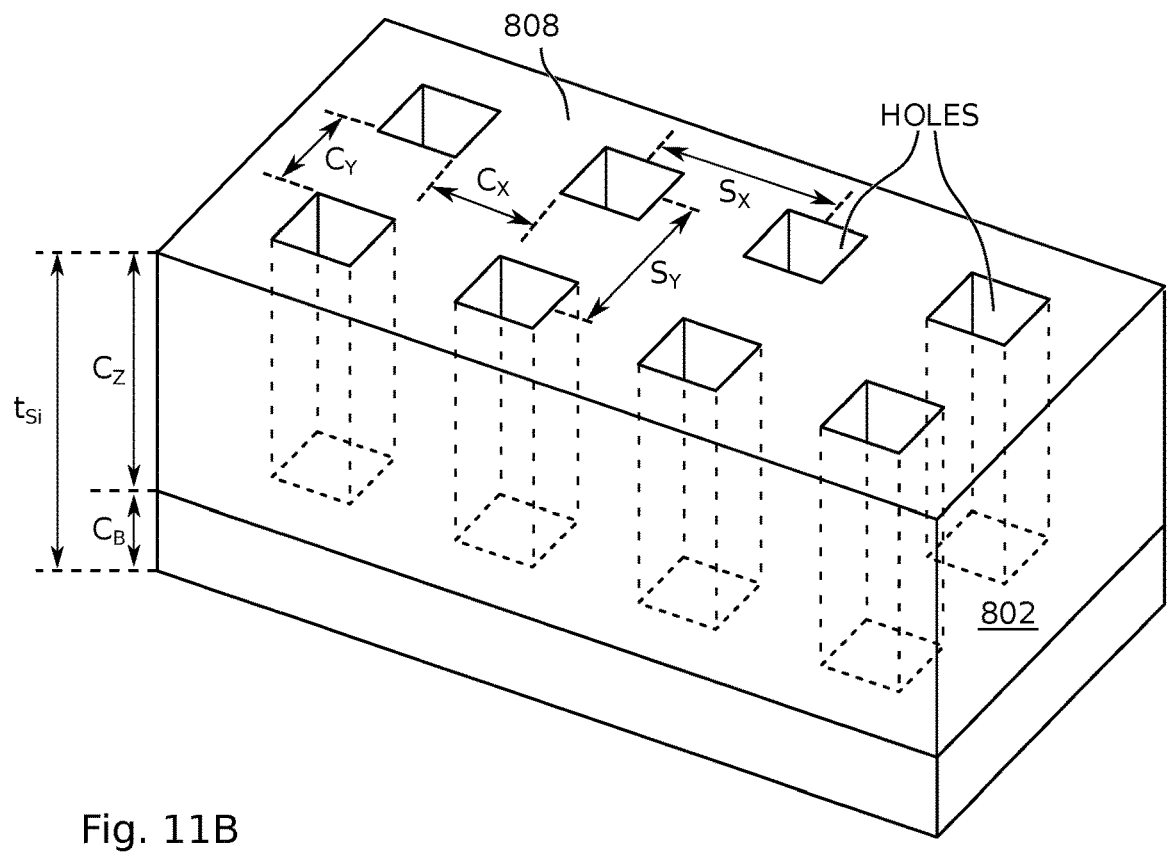

FIGS. 11A and 11B are, respectively, plan and perspective views of a third variation of the capacitor shown in FIGS. 8A and 8B. In this aspect the substrate 802 includes a trench array (or hole array) formed in the textured first surface 804. The CDS structure Si cores are formed as a honeycomb with adjacent honeycomb wall centers separated by a first distance ($S_X$) in a first direction and a second separation ($S_Y$) in a second direction orthogonal to the first direction. The honeycomb CDS textured structure 808 has honeycomb widths $C_X$ and $C_Y$. Here the trenches, which may also be referred to as holes or cavities, are depicted as square, but it should be understood that they are not limited to any particular geometry. Dimensions $S_X$ and $S_Y$ are depicted as being equal, but they need not be so. Likewise, even if the trenches are rectangular in shape, dimensions $C_X$ and $C_Y$ need not be equal.

Figure 12:
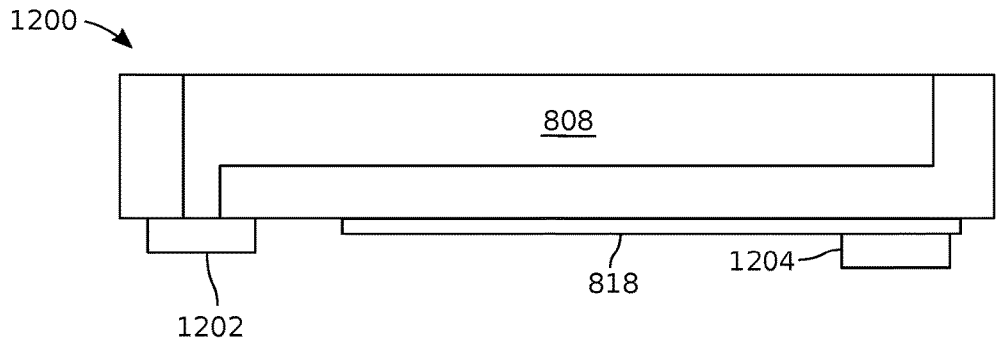
FIG. 12 is a partial cross-sectional view of the CDS capacitor enabled as an interposer integrated circuit (IC).

FIG. 12 is a partial cross-sectional view of the CDS capacitor enabled as an interposer integrated circuit (IC). As such, the interposer capacitor IC 1200 comprises a first electrically conductive terminal 1202 connected to the CDS capacitor 800 and a second electrically conductive terminal 1204 connected to the planar electrode 818. As shown, both terminals are on the same surface (e.g., bottom surface) of interposer 1200, but as would be understood by one with skill in the art, the terminals may be arranged on opposite surfaces to fit the circuit connection requirements.

Figure 13A:
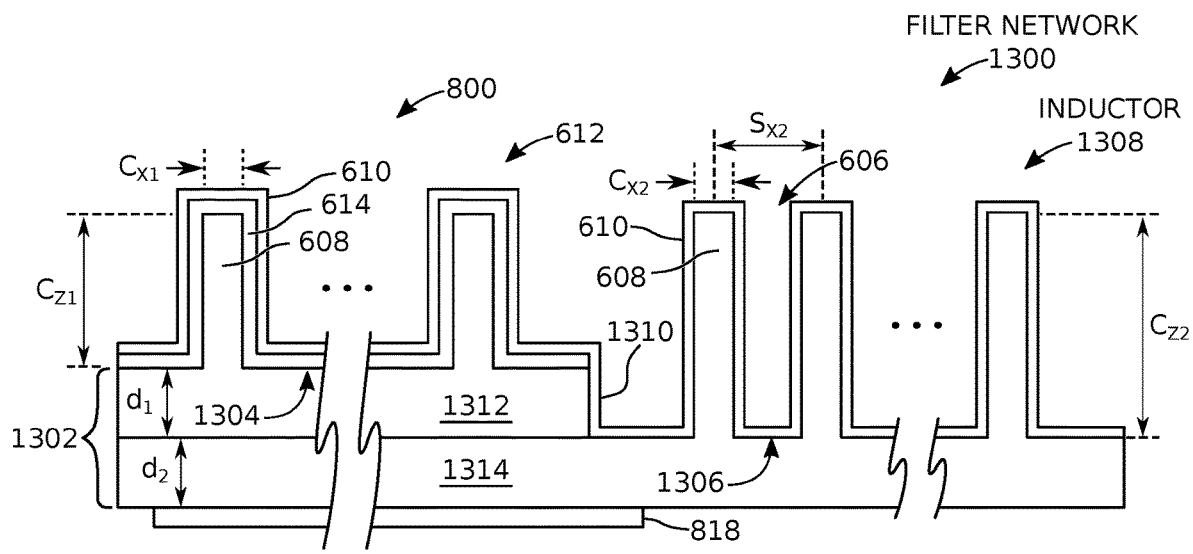
FIGS. 13A and 13B are cross-sectional views and FIG. 13C is a plan view of a filter network.
Figure 13B:
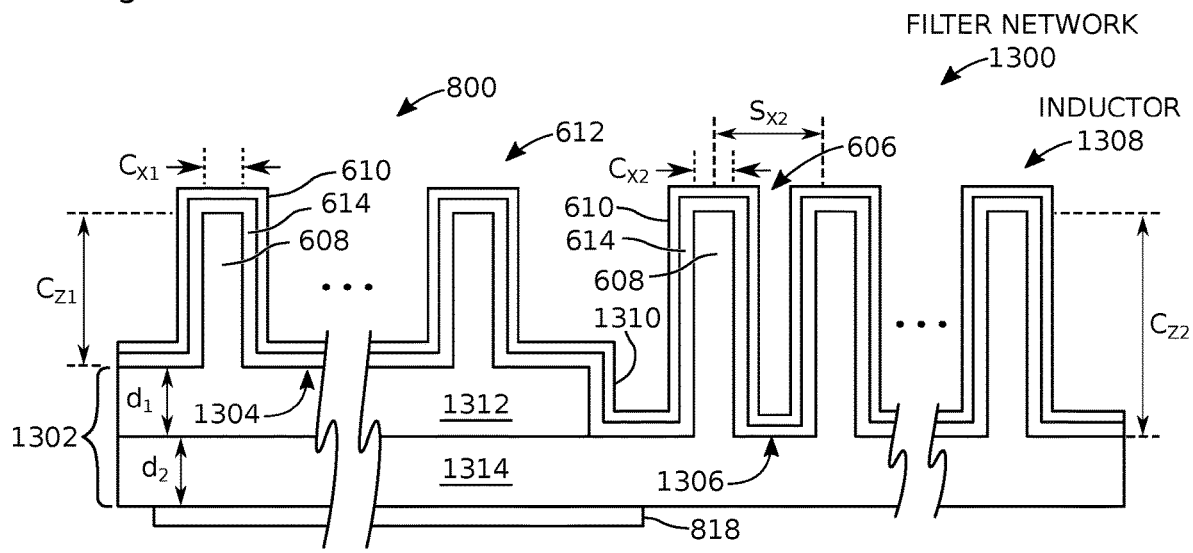
Figure 13C:
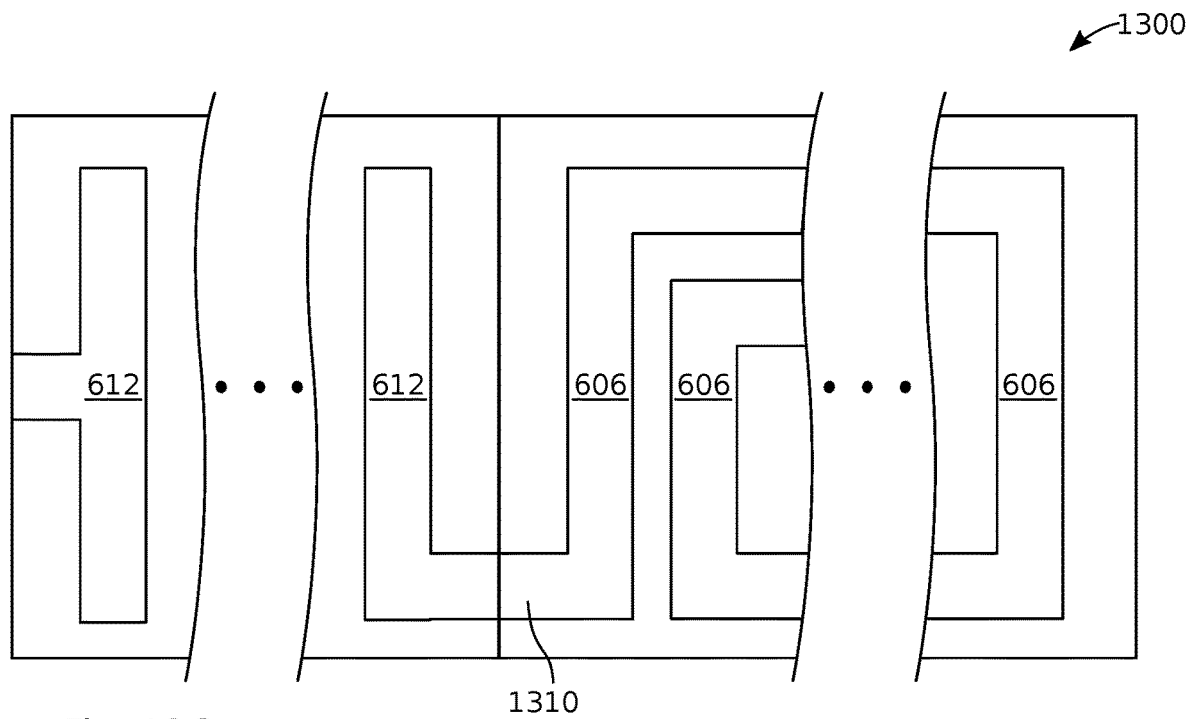

FIGS. 13A and 13B are cross-sectional views and FIG. 13C is a plan view of a filter network. The filter network 1300 comprises at least one capacitor and one inductor formed on a single-piece Si substrate 1302 having a textured first region 1304 and a second region 1306. As described in detail above, the capacitor 800 comprises a textured electrode 808 conformally coating the substrate textured first region 1304 comprising a plurality of adjacent high aspect ratio CDS structures 612. Here the parallel ridge capacitor of FIG. 9 is depicted, but it should be understood that the filter may be enabled using any of the above-described capacitor variations. Each CDS structure 612 includes a first Si core 608, a dielectric layer 614 overlying the first Si core, and an electrical conductor layer 610 overlying the dielectric layer. A planar electrode 818 is formed on the substrate bottom surface, underlying the textured electrode 808. In the interest of brevity, details of the above-described capacitor are not repeated here.

The inductor 1308 comprises a high aspect ratio conductor-silicon (CS) structure 606 having a first terminal 1310 connected to the textured electrode 808 and a second terminal (not shown). The inductor 1308 and capacitor 800 can be connected directly on top of the substrate (as shown) or under the dielectric layer as routing layer. Multi-layer routing can also be used, but for many applications a single layer or maximum of 2 layers of routing is enough. The CS structure 606 comprises a single second Si core 608 formed as a winding. Here the winding is depicted as generally spiral in shape, but it should be understood that the winding is not limited to any particular geometry. An electrical conductor layer 816 overlies the second Si core 608, as shown in FIG. 13A. As shown in FIG. 13B, a dielectric layer 613 may be interposed between the second Si core 608 and the conductor layer 610, in which case the inductor may be more accurately termed as a CDS structure. Details of the inductor can be found in [1; application Ser. No. 15/285,310], which is incorporated herein by reference.

The first Si cores 608 of the capacitor have a width ($C_{X1}$), a trench depth ($C_{Z1}$), and an aspect ratio ($\alpha_1$) of $C_{Z1}$-to-$C_{X1}$ of at least 5:1. The second Si core 608 of the inductor has a width ($C_{X2}$), a trench depth ($C_{Z2}$), and an aspect ratio ($\alpha_2$) of $C_{Z2}$-to-$C_{X2}$ of at least 5:1. Since the inductor trench is deeper, in some aspects the second core aspect ratio may be slightly greater than 5:1. Adjacent first Si core centers of the capacitor are separated by a spacing ($S_{X1}$) and a spacing aspect ratio ($\alpha_{SPACE1}$) of $C_{Z1}$-to-$S_{X1}$ of at least 5:1. These details are not shown in this figure, see FIG. 8B. Adjacent sections of the second Si core winding are separated by a spacing ($S_{X2}$) and a spacing aspect ratio ($\alpha_{SPACE2}$) of $C_{Z2}$-to-$S_{X2}$ of at least 5:1. As shown, $C_{Z2}$ is greater than $C_{Z1}$. In some aspects the aspect ratio for the inductor may be greater than the capacitor aspect ratio. With respect to the relationship between $C_{X1}$ and $C_{X2}$, and between $S_{X1}$ and $S_{X2}$, it should be understood that the winding spacing in the inductor is closely related to the desired frequency of operation. For higher frequencies and peak $Q_S$, the spacing between the inductor windings is increased. The same applies for the width of the inductor windings. On the other hand, capacitor design doesn't have this complexity, so the denser the collection of Si cores, the better. The capacitance frequency response is dominated by the series resistance, which is the Q factor of the capacitor. The doping related dependency of Q is presented in detail below with the presentation of equivalent circuits for column and hole array capacitors.

In this example, the Si substrate 1302 is a silicon-on-insulator (SOI) substrate comprising a Si top layer 1312 having a Si top layer thickness (d1), greater than $C_{Z1}$, and a silicon dioxide layer 1314 with z thickness (d2) underlying the Si top layer. $C_{Z2}$ is greater than d1, but less than (d1+d2). In some aspects not shown, a second Si layer may underlie the dielectric layer 1314. Although an SOI substrate is used in this example, the filter network can also be enabled on relatively thick Si substrates that do not have an insulating layer. As would be understood in the art, the capacitor and inductor may be connected in either series of shunt arrangements. Further, the filter network may include multiple connected inductors and/or capacitors.

"Modified HARMS Process" for Achieving Large Capacitance Per Unit Area

In some aspects, the devices disclosed herein are the result of a modified HARMS process. The parallel plate capacitance formula as given in (1.2) has only 3 parameters that can be adjusted to improve the capacitance per unit area. These are;
 i) The area; Area,
 ii) The relative dielectric constant; $\varepsilon_r$,
 iii) The spacing; s between the capacitor plates.

In the modified HARMS process all 3 parameters are changed favorably to create a much larger capacitance per unit area.

Increasing the Area of the Capacitor (Parameter: Area)

In the modified HARMS process the area between the capacitor plates is increased by generating an ordered "topography" or "texture" along z axes again using the Bosch process. There are many choices of layout creating any topography using Bosch process. The simplest one is creating high aspect ratio trenches, as is done for the inductor, which do not go all the way down to the insulator substrate, as shown in FIG. 13A in the regions where the CDS capacitors are built. In the areas where the inductors and transmission lines are built, the trenches go all the way to the insulator material as given in [1]. The depth differences between the inductor and CDS capacitor trenching are shown clearly in FIG. 13A. After trenching, with any patterning scheme, the wafer goes through an oxidation or insulator deposition process to form the dielectric region between the top and bottom metallization MT and MB, which forms the capacitor terminals A and B of the capacitor shown in FIG. 8B.

After the Bosch trenching, the surface of the silicon where the CDS capacitors are built is no longer flat, with the surface area being greatly increased due to the topography introduced, giving a larger capacitance per area value as desired. The capacitance per unit area increase by Bosch trenching can be calculated as a function of the trenching parameter aspect ratio $\alpha$ and as a function of the trench masking pattern parameters introduced on the silicon surface as shown in FIG. 9 and FIG. 10A. Several choices of trench masking geometries are given as examples. A simple long rectangular trench masking pattern is shown in FIG. 9. Square masking is shown in FIG. 10A and the inverse of the pattern shown in FIG. 11A.

Figure 14:
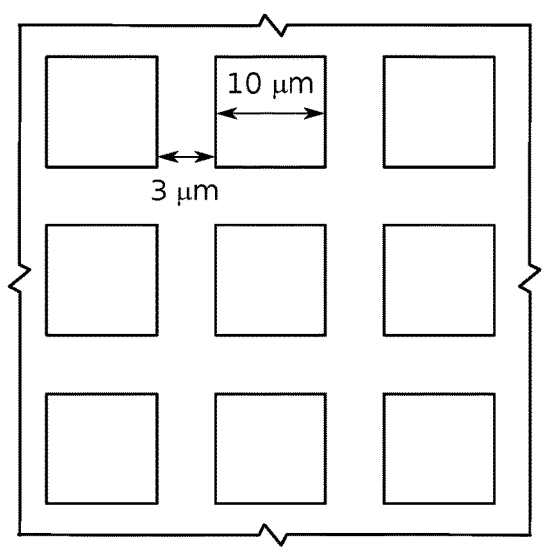
FIG. 14 is a representation of a detailed SEM photo of a honeycomb Si core such as might be used to form the textured electrode of FIG. 11A.

FIG. 14 is a representation of a detailed SEM photo of a honeycomb Si core such as might be used to form the textured electrode of FIG. 11A.

General Formulation Capacitance Per Unit Area as a Function of Pattern Dependent Etching Any pattern of Bosch etching having a non-zero trench depth increases the surface area of the CDS capacitor regions and can be mathematically formulated generally using very simple math. The geometrical origin of area increase by patterning is very straightforward. Any masking pattern at the surface of the silicon exposed to the Bosch process etching creates a number of isolated Si cores that may also be referred as right prisms. The depth of the Bosch etching is the height of the right prisms of silicon, where etching is blocked by masking. The additional silicon surface area, which is the additional capacitance gained by this etching-based process, is the total sidewall surface area of the prisms in any selected area of interest. The right prisms can be the result of organized or randomly generated masking patterns in one or many types of geometries. For example, the following shapes of right angle Si cores may be formed: organized or randomly generated repetitive triangles and rectangles of any type, squares, any type of polygons, circles, ellipses, or any combination of these geometries. The area selected for the CDS textured electrode capacitor can also be a well-defined area like a rectangle or a square, or any complex irregular polygon region which is suitable for "capacitance-fill-in" in a silicon interposer. Therefore, any masking patterned Bosch etch increases the surface area, and the magnitude of the increase in surface area is related to the depth of the etch, density of the etch pattern in the region, and its shape. In this patterned etch, or in other words "mask controlled textured surface", the top of the prisms and the region between them, where the etch is performed (bottom of the etch), are ideally flat xy planes that share the common areas with the flat un-etched surface. Therefore, only prism sidewall surfaces are the cause of the increase in the surface area and capacitance increase, and they can be calculated and formulated.

The right prism sidewall area $S_{SW}$ created by an etch process in any masking pattern is, $$S_{SW}=Ph \quad (2.1)$$

where h and P is the height of the prism, corresponding to the etch depth from the surface and the circumference of the mask geometry respectively, which forms the top or bottom geometry of the etched prism. If the top or bottom geometry of the prism is square, in other words the masking pattern is a square, then P=4a, where "a" is the side of the square. If the top/bottom geometry is a rectangle, then P=2(a+b), where "a" and b are the sides of the rectangle. If the masking pattern is a circle, then P=2πr, where r is the radius of the circle, etc. Assume that there is a combination of variety of k different type prisms each having $P_j$ sidewall areas and $n_j$ of them are formed in the selected area. The total sidewall area of the prisms in such an etched region is, $$S_{TSW}=\Sigma_{j=1}^{k}n_jP_jh \quad (2.2)$$

If the region only has one size and one type of n prisms in the area $A_{TOT}$, which is the intended for CDS capacitor region being built, the total sidewall area of the prisms in the area $A_{TOT}$ simply becomes, $$S_{TSW}=nPh \quad (2.3)$$

Larger values of n result in an increase in the sidewall area. Therefore, the density of the prisms, which is related to their size and how close they can be packed, along with the area of the masking patterns, are the important factors for maximum capacitance increase.

Let the area where the region is patterned, etched, and the CDS capacitor built be called the "capacitor cell" and its area is $A_{CELL}$. The rectangular capacitor cell regions are clearly seen in FIG. 9 and FIG. 10A and their dimensions along x and y axes are labeled as $P_x$ and $P_y$. The areas between the right prisms, which are the etched regions using Bosch process with a depth of $C_Z$ from the silicon surface, may be called the "bottom" with an area of $S_B$. The bottom region is a connected continuous region and the z coordinate of this region is $b_z$ as shown in FIG. 8B, where z=0 corresponds to the bottom of the wafer. The column height or the height of the right prisms is $C_Z$ as shown in FIG. 8B. $S_B$ is calculated by adding all the surface area of the etch mask in the cell area $S_T$ and subtracting it from the cell area $S_{CELL}$. In other words, $S_T$ is the total right prism top or bottom area in the capacitor cell area $S_{CELL}$. In any textured surface with right prisms, as shown in FIG. 9 and FIG. 10A, the sum of the top area of the prisms $S_T$ and the bottom area $S_B$ is equal to the total projected area occupied by the capacitor in the interposer named $S_{CELL}$. $S_{CELL}$ can be written as the sum of $S_B$ and $S_T$ as, $$S_{CELL}=S_T+S_B \quad (2.4)$$

Writing $A_{CELL}$ explicitly in terms of $P_x$ and $P_y$ and $S_T$ in terms of $n_x$, $n_y$, $c_x$ and $c_y$ gives $S_B$ as, $$S_B=P_xP_y-n_xn_yc_xc_y \quad (2.5)$$

where $n_x$, $n_y$, $c_x$ and $c_y$ are number of right prisms, or vertical columns along x and y axes and the mask dimensions of the rectangles along x and y axes respectively. For the purpose of simplifying the mathematics, the terms "Sx" and "Sy", as used in formulas 2.6 through 2.10, are approximated as being the space or distance between Si prisms, as opposed to the distance between Si prism centers. $P_x$ and $P_y$ are calculated with the notations used in FIG. 9 and FIG. 11A as, $$P_x=n_xc_x+(n_x-1)s_x-2s_{xe} \quad (2.6)$$

$$P_y=n_yc_y+(n_y-1)s_y-2s_{ye} \quad (2.7)$$

Bosch process aspect ratio $\alpha$ and $\alpha_{SPACE}$ relate the x, y dimensional values to the vertical column height dimension $C_Z$, same as in the interdigitated capacitor case as, $$c_x, c_y \geq \frac{c_z}{\alpha} \text{ and } s_{xe}, s_{ye}, s_x, s_y \geq \frac{c_z}{\alpha_{SPACE}} \quad (2.8)$$

Solving $n_x$, $n_y$ from (2.6) and (2.7) gives, $$n_x = \frac{P_x + 2s_{xe} + s_x}{c_x + s_x} \quad (2.9)$$

$$n_y = \frac{P_y + 2s_{ye} + s_y}{c_y + s_y} \quad (2.10)$$

For all practical purposes $P_x$, $P_y \gg s_x$, $s_Y$, $s_{xe}$, $s_{ye}$. Therefore, in (2.9) and (2.10), $c_x=c_y=s_x=s_y$, and $n_X$ and $n_Y$ can be closely approximated by, $$n_x \cong \frac{P_x}{2c_x} \text{ for } \alpha = \alpha_{SPACE} \quad (2.11)$$

$$n_y \cong \frac{P_y}{2c_x} \text{ for } \alpha = \alpha_{SPACE} \quad (2.12)$$

where for $c_x=c_y$, $S_T$ becomes, $$S_T = n_x n_y c_x^2 \quad (2.13)$$

Solving $S_B$ from (2.4) gives, $$S_B = S_{CELL} - n_x n_y c_x^2 \quad (2.14)$$

The right prism side-wall area $S_{SW}$ is, $$S_{SW} = 4c_x c_z n_x n_y \quad (2.15)$$

The figure of merit $\eta$, which is the CDS capacitor area to the total projected area occupied by the capacitor in the interposer $S_{CELL}$ achieved by patterning can be expressed as, $$\eta = \frac{S_B + S_{SW} + S_T}{S_{CELL}} \quad (2.16)$$

$$\eta = \frac{(S_{CELL} - n_x n_y c_x^2) + 4c_x c_z n_x n_y + n_x n_y c_x^2}{S_{CELL}} \quad (2.17)$$

Giving an always larger than 1 value for $\eta$ as, $$\eta = \frac{S_{CELL} + 4c_x c_z n_x n_y}{S_{CELL}} = 1 + \frac{4c_x c_z n_x n_y}{S_{CELL}} > 1 \quad (2.18)$$

Writing (2.18) explicitly gives, $$\eta = 1 + \frac{4c_x c_z \left(\frac{P_x}{2c_x}\right)\left(\frac{P_y}{2c_x}\right)}{P_x P_y} \quad (2.19)$$

Resulting in the very simple expression only the function of the Bosch processing parameter $\alpha$ as, $$\eta = 1 + \frac{c_z}{c_x} = 1 + \alpha \quad (2.20)$$

Expression (2.20), which is for square masking, can be generalized for any repetitive unit mask geometry by introducing its circumference P as, $$\eta = 1 + \frac{Pc_z n_x n_y}{S_{CELL}} > 1 \quad (2.21)$$

If the unit repetitive mask geometry is a circle, substituting $C_X$ with 2r will give the same spacing and etching rule as used for square as done earlier. For this case (2.19) explicitly becomes, $$\eta = 1 + \frac{2\pi r c_z \left(\frac{P_x}{4r}\right)\left(\frac{P_y}{4r}\right)}{P_x P_y} \quad (2.22)$$

$$\eta = 1 + \frac{\pi c_z}{8r} = 1 + \frac{\pi}{4}\alpha \quad (2.23)$$

As can be seen using a square prism or a square Bosch etching unit, a repetitive masking pattern with identical spacing is slightly better than circular patterns in terms of area increase, which shows the prism selection choice in the masked texturing.

As explained in [1], the design is based on the etching of patterned silicon using DRE (Deep Reactive Etching), also known as the Bosch Process. Bosch processing [4-7] is a very widely used and very versatile method of making very high aspect ratio trenches and silicon through vias (STV), and is very widely used in many (MEMS) components since its invention in 1994 [28]. Originally developed by Bosch, an automotive electrical component manufacturer, the Bosch process has conventionally been used to manufacture automobile sensors for cars, not inductors or capacitors. As is well understood in the art, the primary application of the Bosch process has in the making of scribe lines, silicon through vias, and in applications such as accelerometers and other types of sensors that require deep trenches with high aspect ratios, but not in the fabrication of active or passive circuit Si components. Neither has the Bosch process been applied to the fabrication of IC trenches, as the trenches in IC's do not require very deep or high aspect ratios. Further, discrete component (e.g., capacitor) manufacturers, such as TDK or Murata, use multi-layer ceramic or low temperature co-fired ceramic (LTCC) processes, never silicon. As a result, there has been no suggestion in either the fabrication of conventional ICs or discrete passive electronic components that silicon can be etched in a manner that would be useful in the manufacture of high aspect ratio Si core inductors or capacitors.

Reverse Mask Etching: "Etching the Prism Regions and Leaving the Continuous Region $S_0$"

To explain the texturing process and show the associated math in a simpler way, the mask that blocks the Bosch etching mask may create isolated regions of polygons that form the top and bottom surfaces of silicon prisms, with an etched continuous region in between prisms with an area of $S_0$ as given above (see FIG. 10A for example). With a reverse etch mask the surface area of the capacitor is the same as explained above, with an advantage of having better mechanical structural stability in the capacitor structure (see FIGS. 11A and 11B).

Decreasing the Distance Between Capacitor Plates (Parameter s)

Instead of using the spacing based "s" on the aspect ratio $\alpha$ of the Bosch process, as in the single layer interdigitated capacitors described in [1], the patterned silicon surface can be exposed to oxidation cycle and a much thinner layer of high quality silicon oxide ($SiO_2$) can form the dielectric region of the CDS capacitor. In this way the dielectric thickness becomes completely independent from aspect ratio $\alpha$, which is the main reason for the lower capacitance per unit area in a comb type capacitor. Another choice of thermally grown dielectric material for the CDS capacitor is silicon nitride ($Si_3N4$). Making very controllable thicknesses, high quality thermally grown very thin oxides and nitrides are probably the most mature processing steps in any form of silicon based semiconductor technology since 1965's. We owe this debt to Bruce E. Deal and Andy S. Grove's work [29, 30] on oxidation kinetics of $SiO_2$, which made silicon based IC technology possible and creation of Silicon Valley through the offspring of the Fairchild Camera and Instrument Corporation, later known as Fairchild Semiconductor. The offspring of Fairchild are rightfully known as "Fair Children", which include Intel, National, AMD, and LSI Logic. Today, high quality, thermally grown $SiO_2$, from 2 nm (tunnel oxide) thicknesses to 2-3µ and even thicker, is mass produced reliably [31].

The electric field breakdown voltage for $SiO_2$ and $Si_3N4$ is $10^7$ V/m and this value determines the minimum thickness required for the oxide or nitride thickness in the modified HARMS process CDS capacitor. Assuming one dimensional electro-static fields [17-24], the minimum oxide thickness can be easily calculated for a given maximum voltage $V_{MAX}$ in an application. Solving $t_{OX}$ from, $$E_{MAX} = \frac{V_{MAX}}{t_{OX}} < 10^7 \left[\frac{V}{cm}\right] \quad (2.24)$$

giving, $$t_{OX}[cm] \geq \frac{V_{MAX}}{E_{MAX}} = 10^{-7} \cdot V_{MAX} \quad (2.25)$$

Since the electric fields in the convex corners of the capacitor structures are larger than the uniform electric field approximation in the parallel capacitor plate given in (2.8), a thicker $SiO_2$ film must be grown by a proper safety margin as indicated with the ≥ in (2.9).

As an example, for a 10V DC/DC application, equation (2.9) gives a $SiO_2$ thickness of $10^{-6}$ cm, which is 0.01µ or 10 nm, or 100 Å. 120 nm $SiO_2$ thickness was a very common MOS gate oxide thickness in 5V supply/0.5µ gate length technologies of mid 1980-early 1990's. Easily produced 10-20 nm thick dielectric thicknesses were not even thinkable for interdigitated capacitors made using the conventional HARMS process and is even challenging for advanced and expensive deposition techniques like ALD today [25, 26].

The relative dielectric constant $\varepsilon_r$ of thermally grown $SiO_2$ and $Si_3N_4$ are 3.9 and 7.5, respectively. Both dielectrics have very good loss tangents [tg(δ)≈0.001-0.002] needed for high frequency applications and are the highest quality dielectrics, as compared to any other deposition methods explained below.

Using High Relative Dielectric Constant (Parameter $\varepsilon_r$)

Using high dielectric constant material deposition instead of thermally grown $SiO_2$ or $Si_3N_4$ is another way of making CDS capacitors. $TiO_2$, ($\varepsilon_r$=85, loss tangent $5\times10^{-4}$) $HfO_2$ ($\varepsilon_r$=25) and $Al_2O_3$ ($\varepsilon_r$=9) are good examples of dielectric materials widely used in MEMS and IC technologies today. Very thin layers of high dielectric constant materials can be deposited using ALD techniques [25, 26] and are in wide use today where the cost is not a major factor. It must be also remembered that theoretically the dielectric quality of any deposition technique cannot be as good as the thermally grown dielectrics.

Texturing Results

Of concern is quantitatively finding the capacitance per unit area increase as a result of silicon texturing. Since the texture patterning can be done in an infinite number of ways, an exemplary analysis is provided for the structure shown in FIG. 10A, in a 500 by 500µ fixed square capacitor area. In this area equally spaced ($S_X=S_Y$) equal size ($C_X=C_Y$) squares are masked and the silicon is etched between the squares leaving the surface full of vertical square prisms all having heights of $C_Z$ which is 90% of the silicon thickness $t_{Si}$.

Figure 15A:
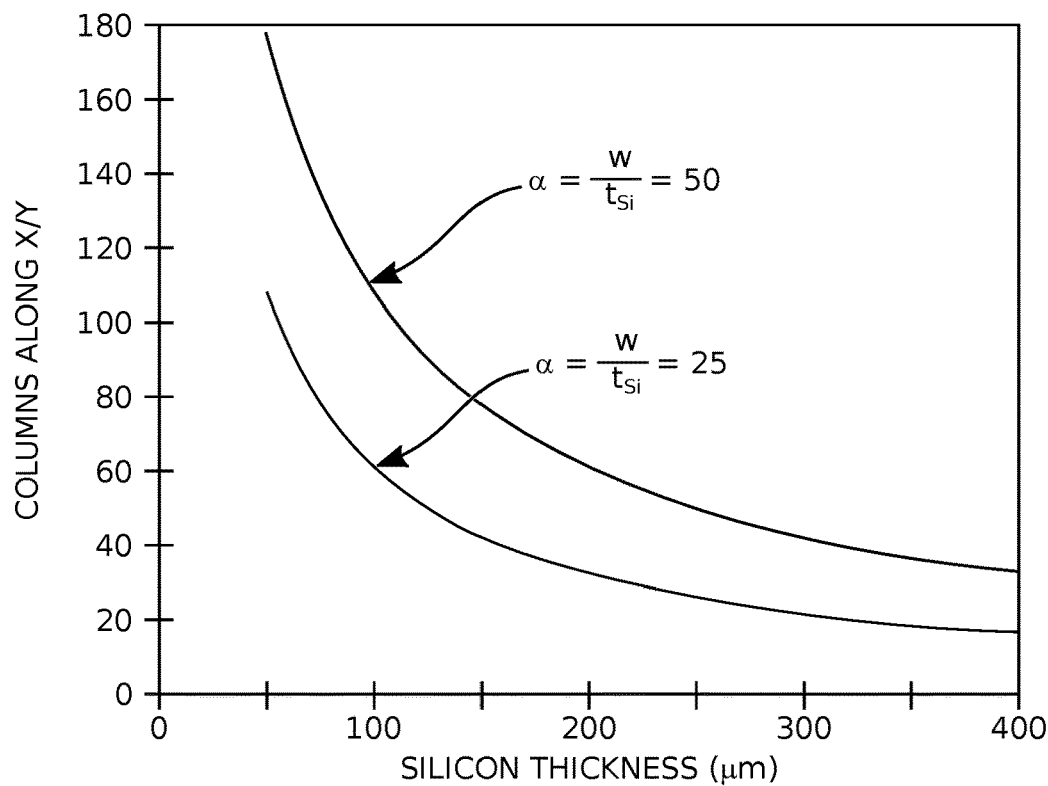
FIGS. 15A through 15C depict the relationship between the number of Si cores, Si thickness, and aspect ratio.
Figure 15B:
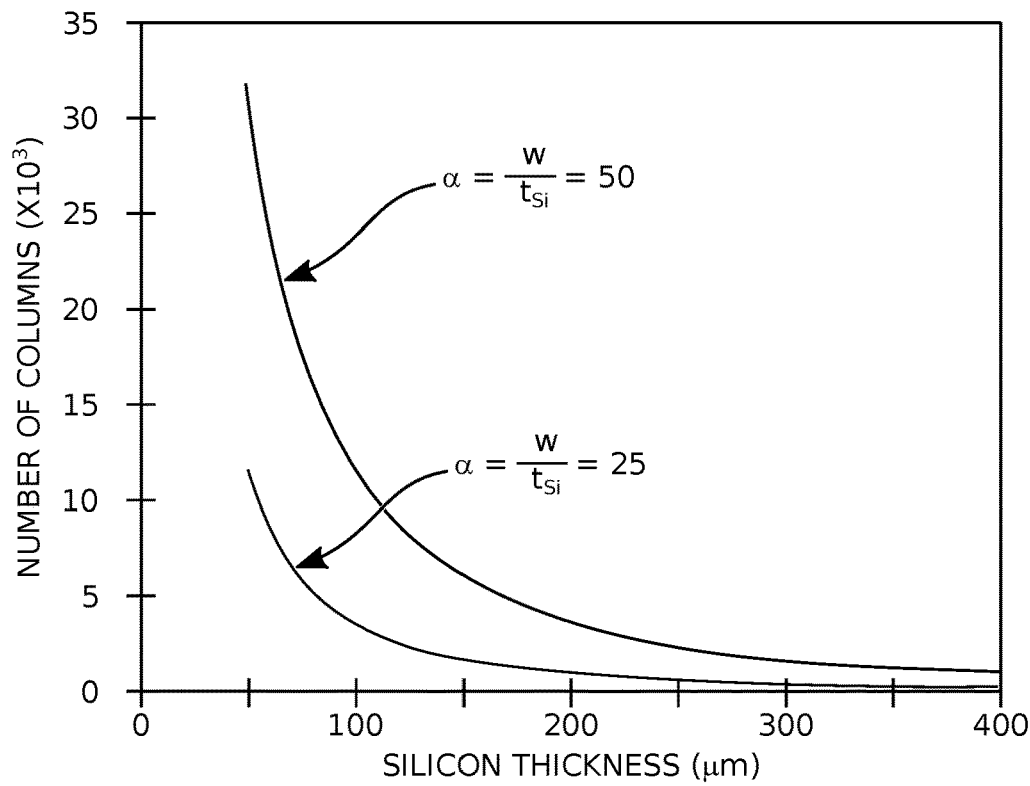
Figure 15C:
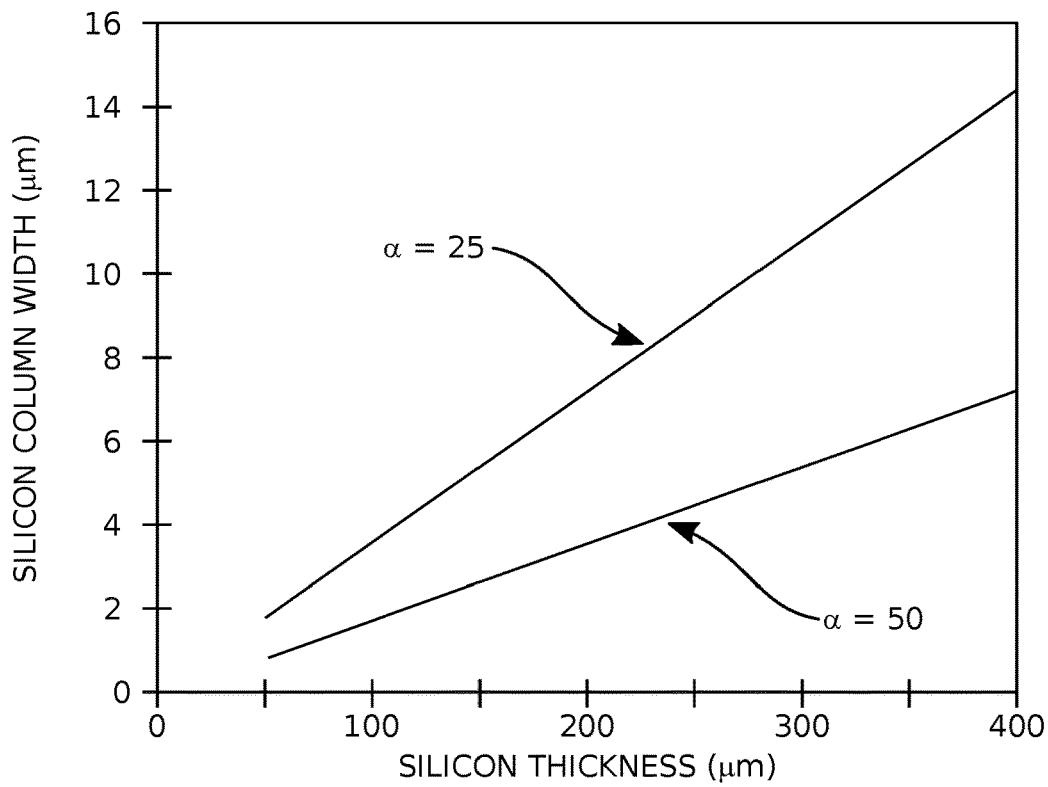

FIGS. 15A through 15C depict the relationship between the number of Si cores, Si thickness, and aspect ratio. FIG. 15A is a graph depicting the number of right prisms that can be generated along each side of the square as a function of silicon thickness, and $\alpha_{SPACE}=\alpha$, for 25 and 50.

FIG. 15B is a graph depicting the total number of right prisms in the capacitor area of 500 by 500µ, which is obtained by multiplying $n_x$ and $n_y$ in FIG. 15A. As can be seen, the number of right prisms decreases as the silicon thickness increases due to the aspect ratio definition as shown in the interdigitated capacitor analysis given above. The same result is true for the number of square holes in the inverse etch structure of FIGS. 11A and 11B. In all figures described below, the silicon thickness is varied between 50 to 400µ and the capacitor cell area is kept constant, fixed to 500 by 500µ dimension.

FIG. 15C is a graph depicting the column height or trench depth as a function of silicon thickness $t_{Si}$. This quantity is discussed below in the analysis of the distributed RC nature of the capacitor and its Q value.

The number of square columns or holes, $n_x$ or $n_y$, in any direction is an integer number and this number is determined by the thickness and the aspect ratio and the square column dimension $C_X=C_Y=C$. The square side dimension C is also a number which is the integer multiple of a selected grid size in the layout system taken as 0.001µ. The combined effect of these variables creates the jagged curves as shown in FIGS. 16A through 18B and 22A. In the comb capacitor analysis presented above, floating-point arithmetic with no snap-to-grid feature is used. Therefore, all those curves are continuous.

Figure 16A:
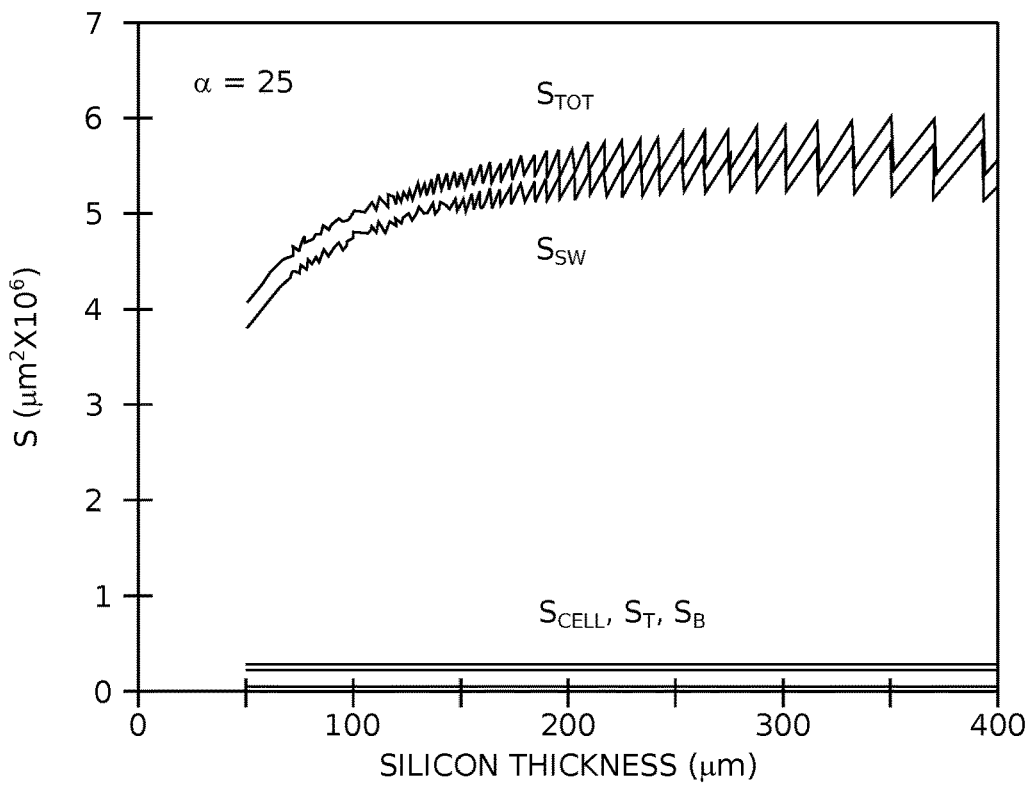
FIGS. 16A and 16B depict the area components of texturing for aspect ratios of 25 and 50, respectively.
Figure 16B:
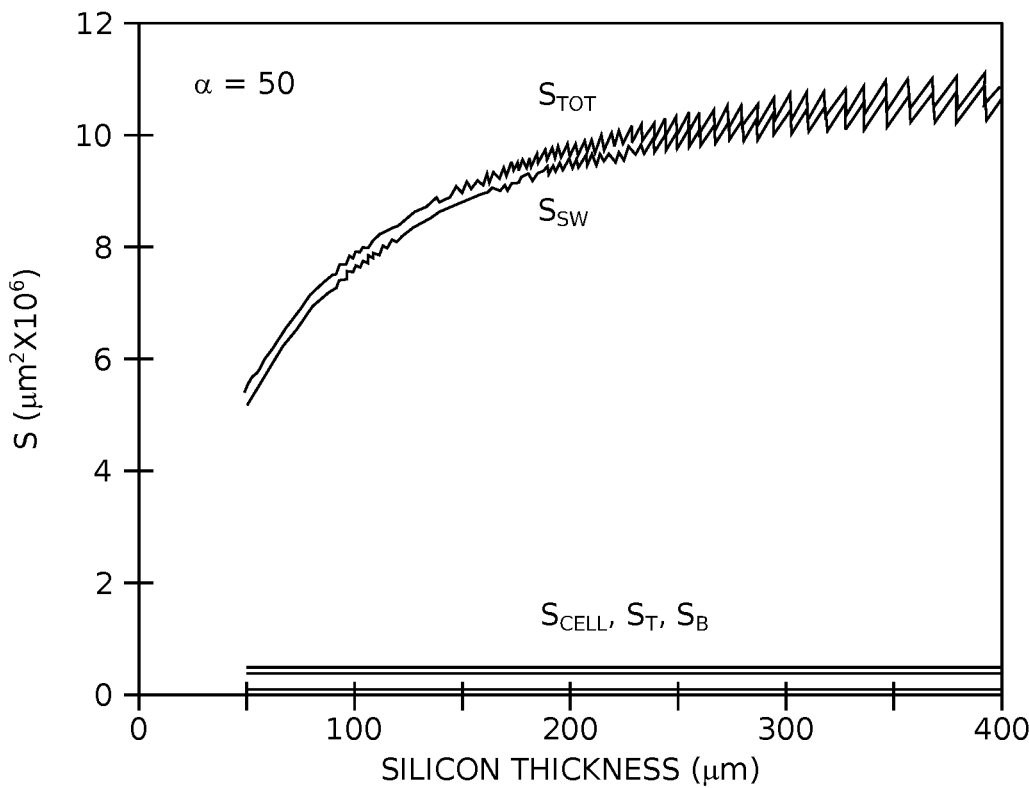

FIGS. 16A and 16B depict the area components of texturing for aspect ratios of 25 and 50, respectively. In the area plots there are several areas of interest: $S_{SW}$, $S_B$, $S_T$, $S_{CELL}$ and $S_{TOT}$ respectively correspond to column sidewall, bottom area etched between the columns, and top area of the columns that is generated result of the texturing. All the area components are shown together and it is clearly seen in FIG. 16A that the sidewall area $S_{SW}$ of the prisms is the majority reason of the area increase, and it increases with silicon thickness.

FIG. 16B shows the same results as FIG. 16A for an aspect ratio of 50. In both figures it is clearly seen that the total capacitor area $S_{TOT}$ is increased very significantly from $S_{CELL}$=25,0000µ² and it is very close to the prism sidewall area $S_{SW}$. The $S_B$, $S_T$, and $S_{CELL}$ curves shown in the lower portion of the plots are difficult to see due to their relatively small magnitude compared to the $S_{TOT}$ and $S_{SW}$ curves and are shown individually in FIG. 17A.

Figure 17A:
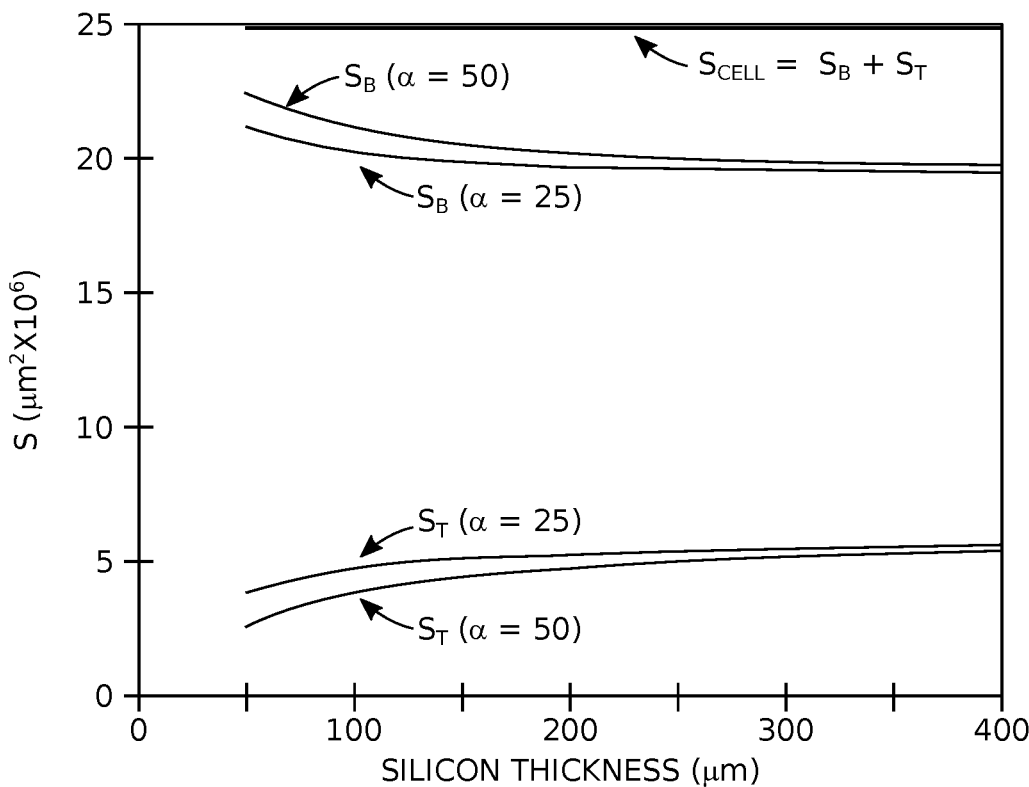
FIGS. 17A through 17C depict the relationship between $S_B$, $S_T$, $S_{CELL}$, $\alpha$, and $\alpha_{SPACE}$.
Figure 17B:
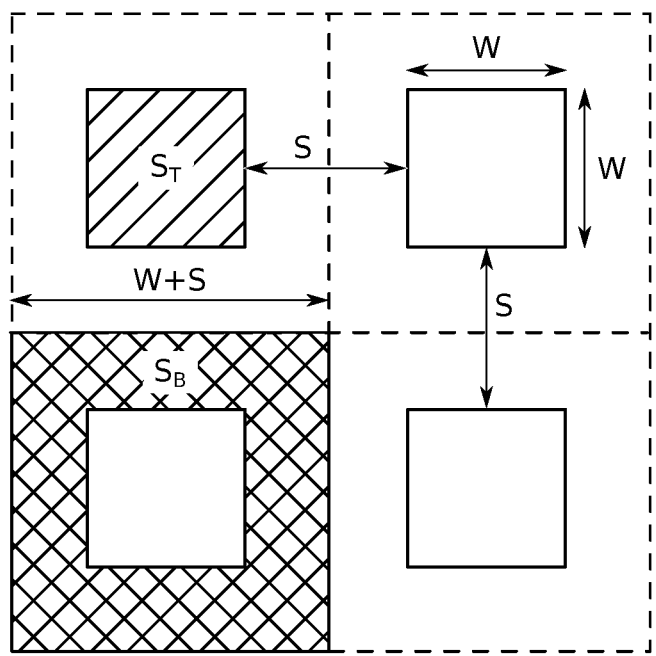
Figure 17C:
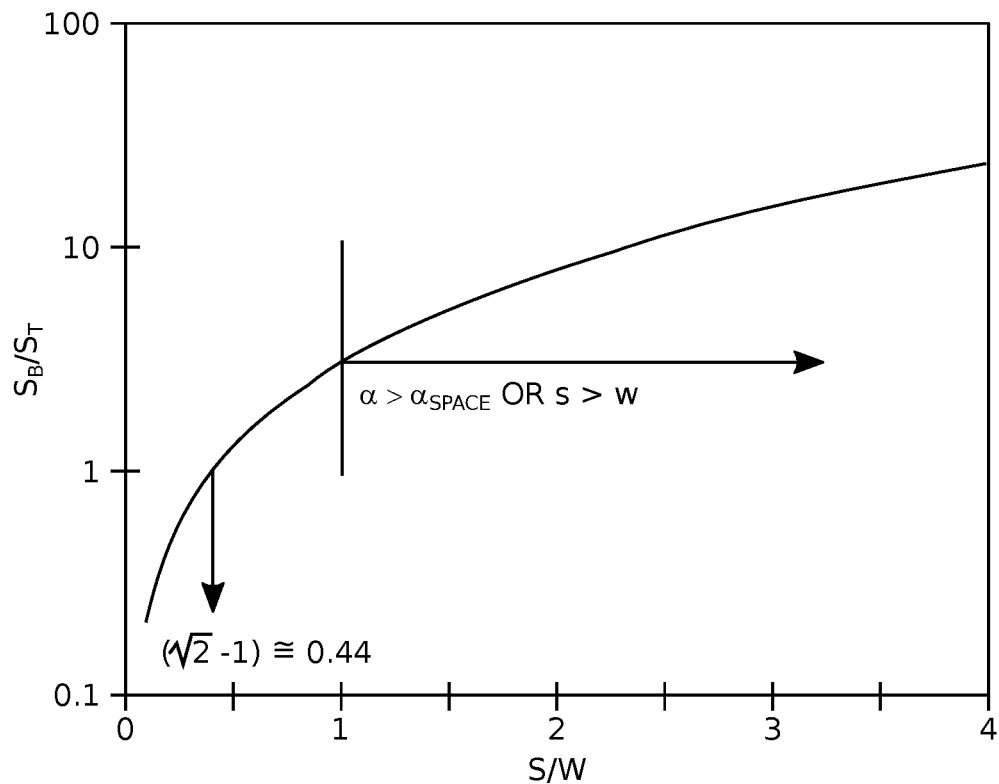

FIGS. 17A through 17C depict the relationship between $S_B$, $S_T$, $S_{CELL}$, α, and $\alpha_{SPACE}$. FIG. 17A depicts $S_B$, $S_T$, and $S_{CELL}$ curves for aspect ratios α=25 and 50. It has to be noted that the sum of $S_B$ and $S_T$, as given in relation (2.4), holds. Another interesting result seen in the figure is the opposite behavior of $S_B$ and $S_T$ with silicon thickness $t_{Si}$ and "always" $S_B > S_T$ for $S_X=S_Y=C_X=C_Y$, which is a result of $\alpha_{SPACE}=\alpha$. The analytic result can be proven by substituting (2.11) and (2.12) in (2.13) and (2.14) giving, $$S_T = \frac{P_x}{2c_x}\frac{P_y}{2c_x}c_x^2 = \frac{P_xP_y}{4} = \frac{S_{CELL}}{4} \quad (2.26)$$

$$S_B = S_{CELL} - \frac{S_{CELL}}{4} = 3\frac{S_{CELL}}{4} \quad (2.27)$$

FIG. 17A demonstrates this property very clearly and is important in showing that the "trench array" capacitance structure always has a better Q than the "column array" capacitance structure, which is explained in detail in the next section.

FIG. 17B is a plan view showing the area around a square of a unit cell. The relations (2.26) and (2.28) derived for $S_X=S_Y=C_X=C_Y$ are the result of $\alpha_{SPACE}=\alpha$. One is also interested in relations (2.26) and (2.27) range of validity and if it is a function of $\alpha$ and $\alpha_{SPACE}$. The analysis can be done based on equating the unit cell square area to the area around the square of the unit cell as, $$(w+s)^2 - w^2 = w^2 \quad (2.28)$$

The arithmetic yields, $$w^2 + 2ws + s^2 - w^2 = w^2 \quad (2.29)$$

The relation between the s and w can be evaluated by re-arranging (2.30) giving the quadratic equation, $$s^2 + 2ws - w^2 = 0 \quad (2.30)$$

The roots of (2.30) are, $$s_{1,2} = \frac{-2w \pm \sqrt{4w^2 + 4w^2}}{2} \quad (2.31)$$

Simplifying (2.31) shows that one of the roots is positive and the other one is negative as, $$s_{1,2} = \frac{-2w \pm 2w\sqrt{2}}{2} \quad (2.32)$$

Since s and w are spacing and width, and they can only have positive values, the only valid solution of (2.30) is the root giving s>0 which can be explicitly written as, $$s = w(\sqrt{2}-1) \rightarrow 0.44w \quad (2.33)$$

As can be seen in (2.33) the valid solution for s is always less than w. Equation (2.30) is written for finding s versus w relations that satisfy equal areas for column top area $S_T$ and in-between areas $S_B$. The resulting relation (2.33) states that for s>0.44w, $S_B$ the in-between area between the columns is always larger than the column top area $S_T$. If both sides of the equation are divided by silicon thickness $t_{Si}$ as, $$\frac{s}{t_{Si}} = \frac{w(\sqrt{2}-1)}{t_{Si}} \quad (2.34)$$

Writing (2.34) in terms of the aspect ratios $\alpha$ and $\alpha_{SPACE}$ gives, $$\frac{1}{\alpha_{SPACE}} = \frac{(\sqrt{2}-1)}{\alpha} \quad (2.35)$$

Manipulating (2.35) gives the conflicting result of (1.8) $\alpha \geq \alpha_{SPACE}$ which has to be satisfied as long as the Bosch process is used. Solving (2.35) gives, $$\alpha = (\sqrt{2}-1)\alpha_{SPACE} \cong 0.44\alpha_{SPACE} \quad (2.36)$$

In other words, condition (2.36) cannot be achieved with Bosch process and Bosch process will always give in-between area $S_B$ between the columns as larger than the top column area $S_T$, which guarantees that "trench array" capacitance series resistance is always smaller than the "column array" capacitors when confined to the same area.

FIG. 17C is a graph depicting the number of times the Q of the "trench array" capacitance is better than "column array" capacitor as a function of $\alpha/\alpha_{SPACE}$. Another interesting aspect is the dependence between $S_B/S_T$ ratio to w/s or aspect ratio ratios, $\alpha/\alpha_{SPACE}$. The critical calculated values are marked on the curve and it should be noted that if the $\alpha/\alpha_{SPACE}$ ratio is on the order of 2, the Q value of the "trench array" capacitance is be better than "column array" capacitor by a factor of 8, independent of frequency and silicon thickness.

Figure 18A:
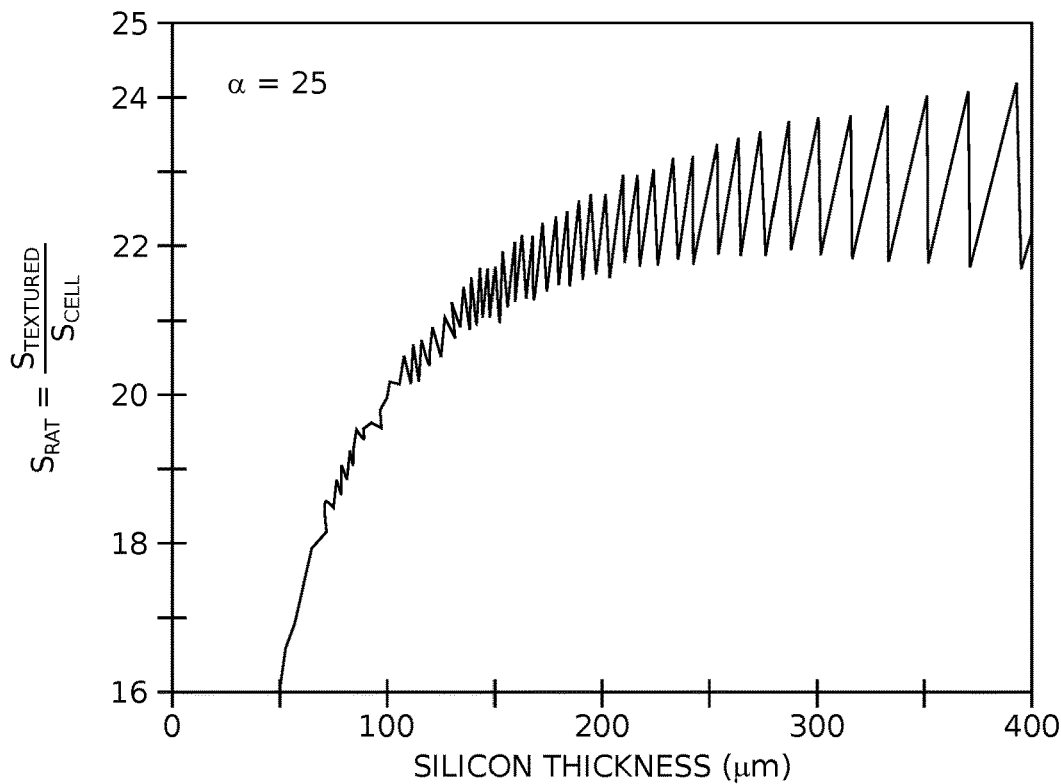
FIGS. 18A and 18B are graphs depicting the ratio of the textured capacitor area to cell area, as analytically derived for $\alpha=25$ and 50, respectively.
Figure 18B:
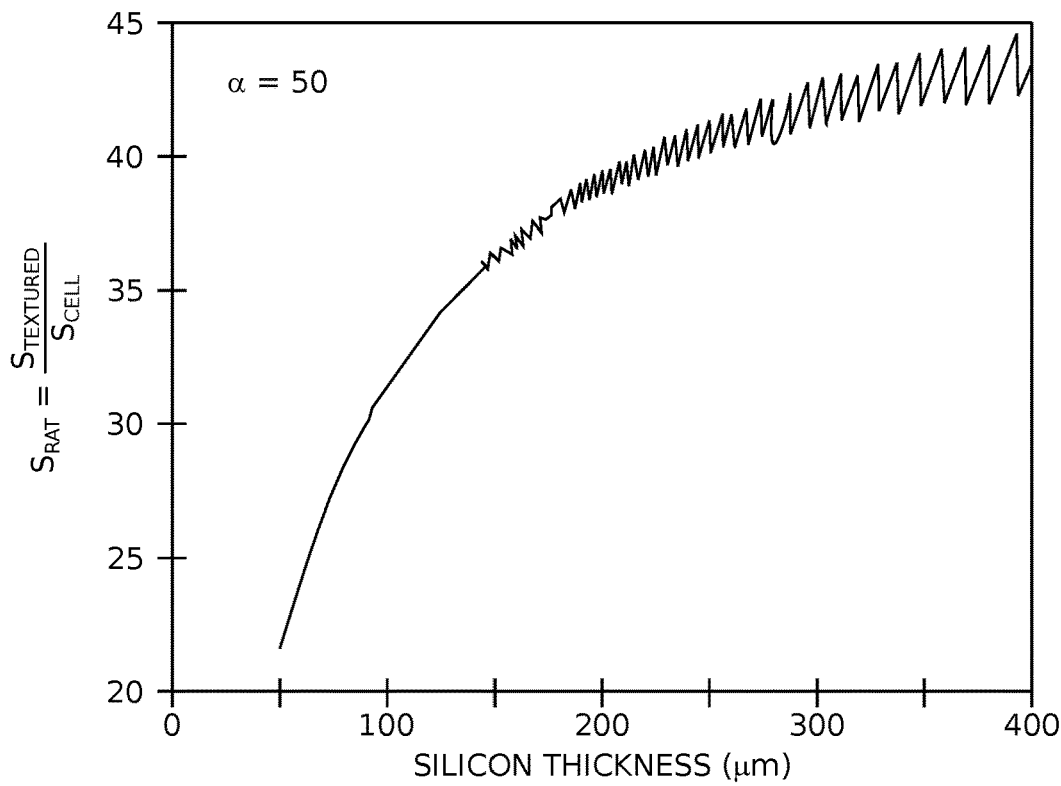

FIGS. 18A and 18B are graphs depicting the ratio of the textured capacitor area to cell area, as analytically derived for $\alpha=25$ and 50, respectively.

Figure 19A:
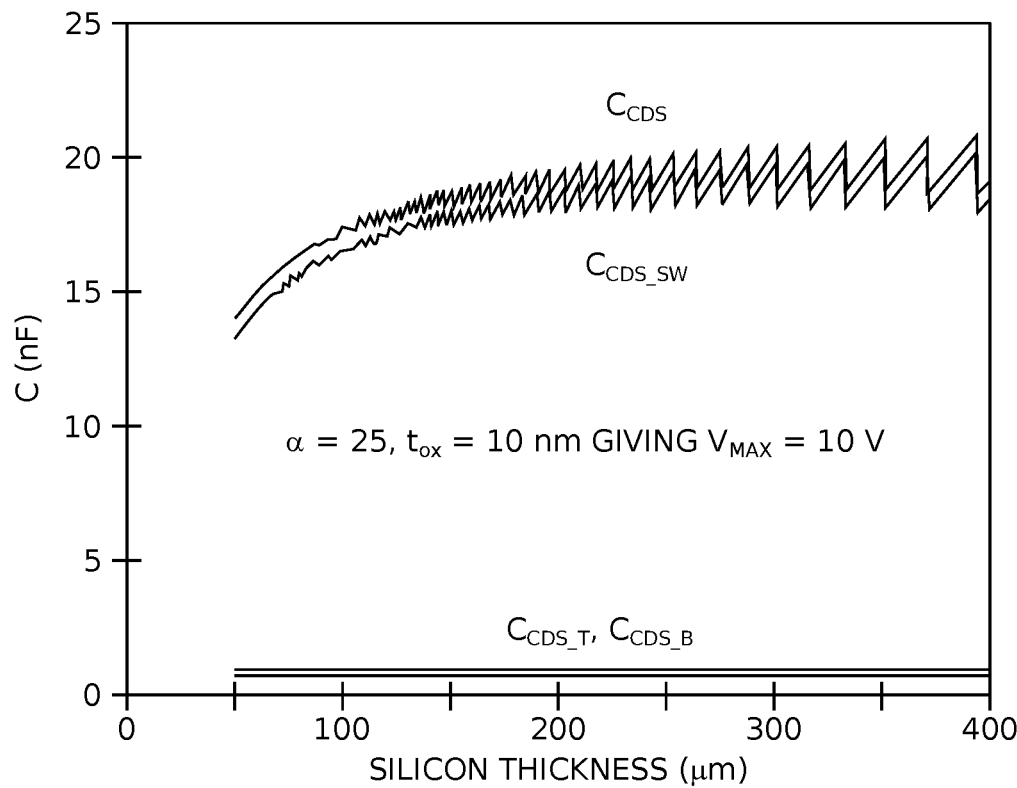
FIGS. 19A through 19C depict the relationship between capacitance and Si thickness $\alpha=25$.
Figure 19B:
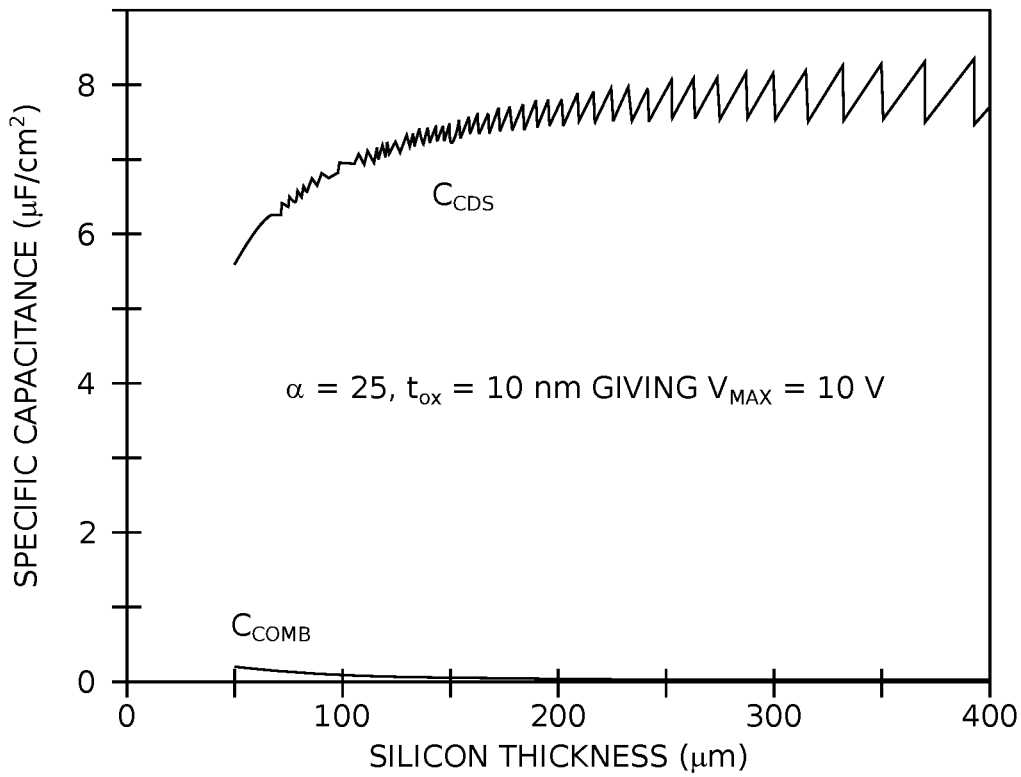
Figure 19C:
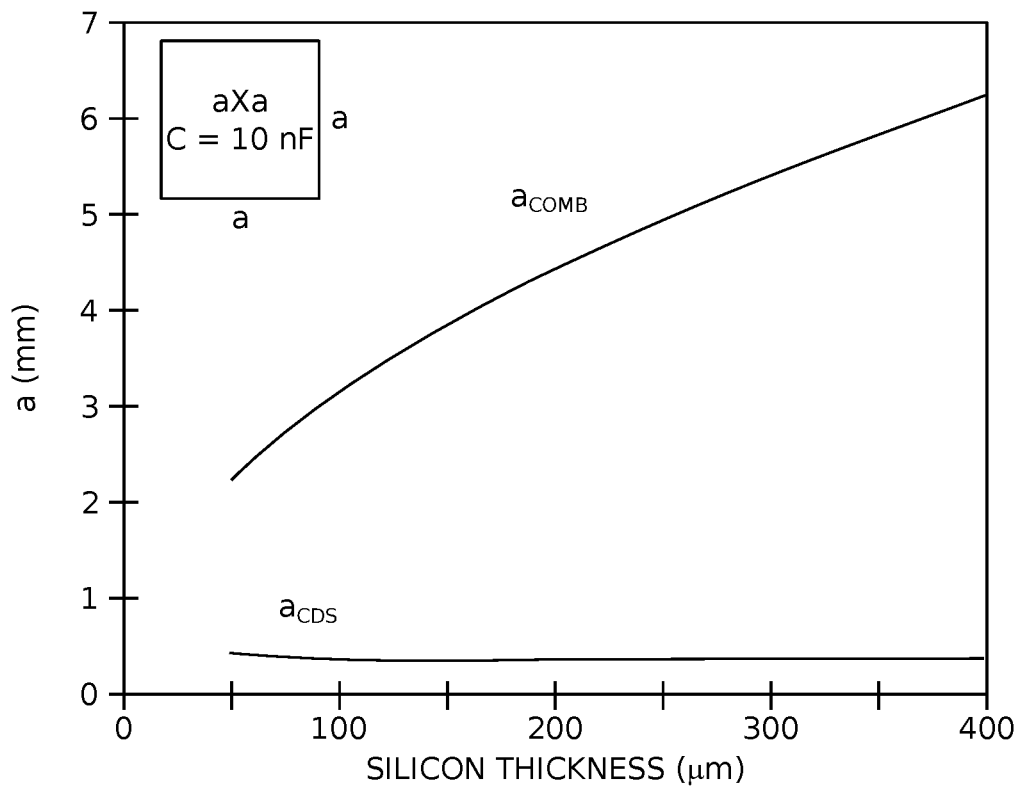

FIGS. 19A through 19C depict the relationship between capacitance and Si thickness $\alpha=25$. FIG. 19A shows the textured CDS capacitance that can be made in the cell area of 500 by 500μ, which is a reasonable area allocated for a silicon interposer capacitor, as a function of silicon thickness along with its top, bottom, and sidewall components $C_{CDS}$, $C_{SW}$, $C_{TOP}$, and $C_{BOT}$ respectively. The symbol $C_{CDS}$ is used for total capacitance due to the fact the capacitor is basically a CDS capacitor with a 10 nm $SiO_2$ thickness, giving 10V of breakdown voltage. As can be seen, the majority of the capacitance again in this case is a result of the Si sidewalls, and a 20 nF capacitor can be built with no difficulty in a 500 by 500μ square.

FIG. 19B shows capacitance density per area for the textured CDS capacitor versus the comb capacitor as a function of silicon thickness. As can be seen, the CDS capacitance that can be built in this area increases with silicon thickness, the completely opposite behavior as compared to comb capacitor case, and it has a much higher capacitance value compared to the comb capacitor.

FIG. 19C depicts the square side dimension "a" as a variable, comparing 10 nF comb and textured CDS capacitors. The magnitude difference between the comb and textured CDS capacitor is so large one cannot clearly see the size of the square side for the textured CDS capacitor.

Figure 20A:
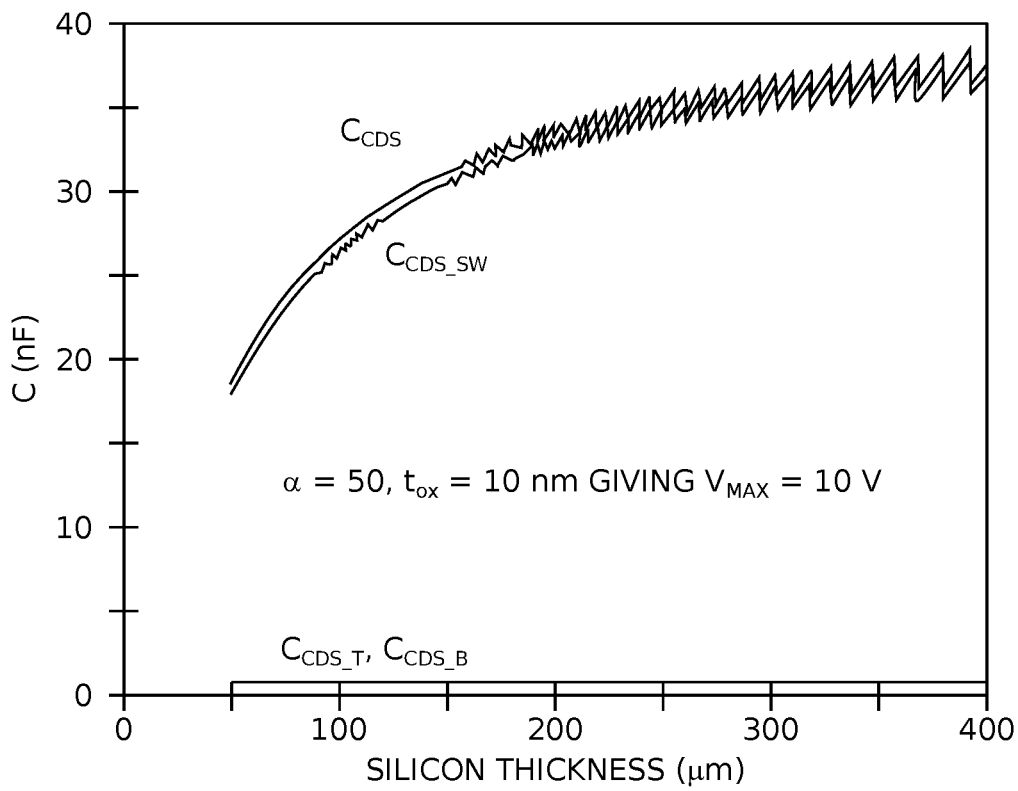
FIGS. 20A through 20C depict the relationship between capacitance and Si thickness, with $\alpha=50$.
Figure 20B:
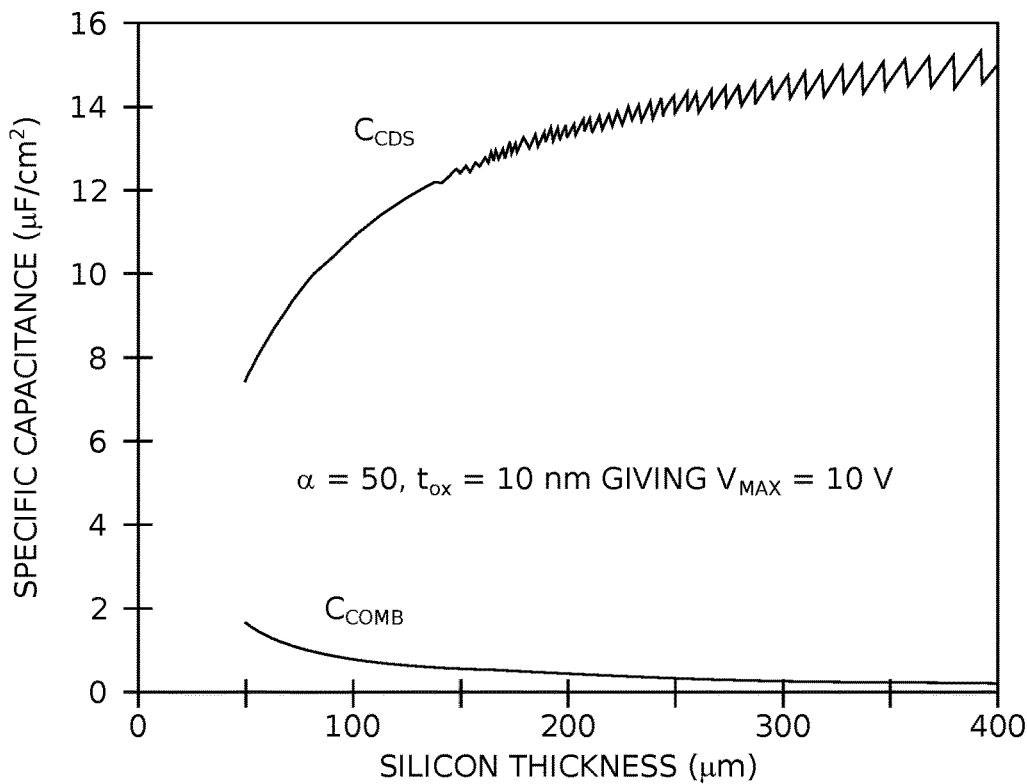
Figure 20C:
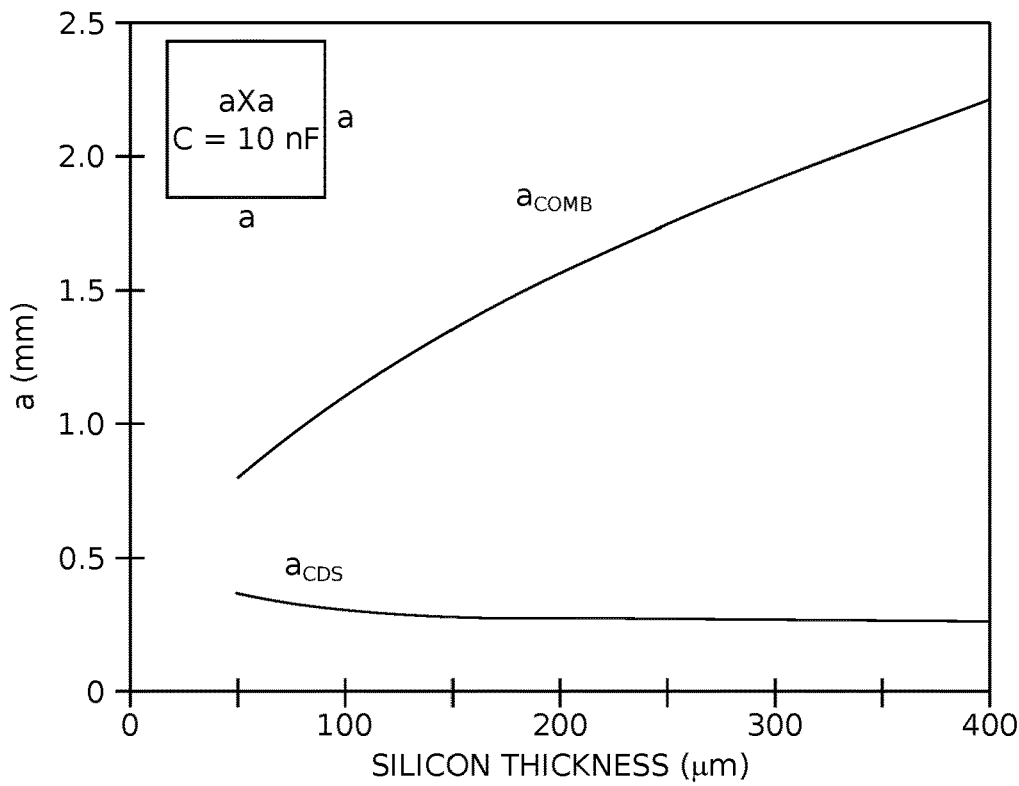

FIGS. 20A through 20C depict the relationship between capacitance and Si thickness, with $\alpha=50$. As can be seen in FIGS. 20A and 20C, the targeted 10 nF capacitor can be built with even a 50μ silicon thickness in an area less than 500 by 500μ square.

Figure 21A:
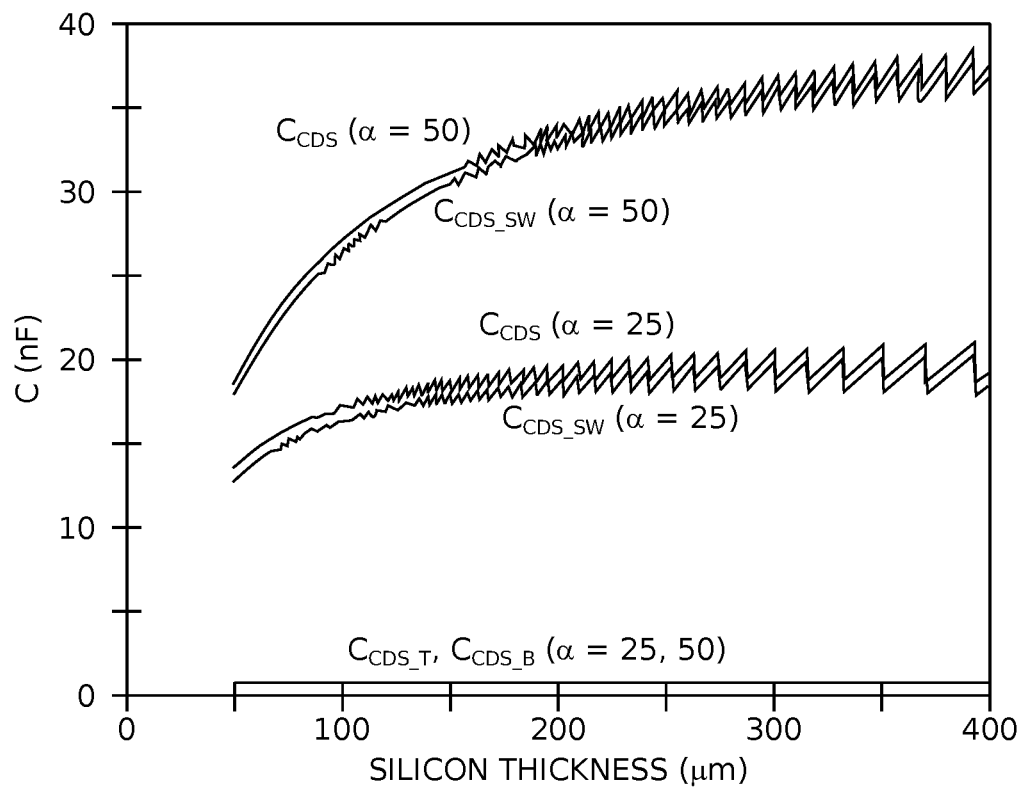
FIGS. 21A through 21E depict several capacitance variables as a function of Si thickness.
Figure 21B:
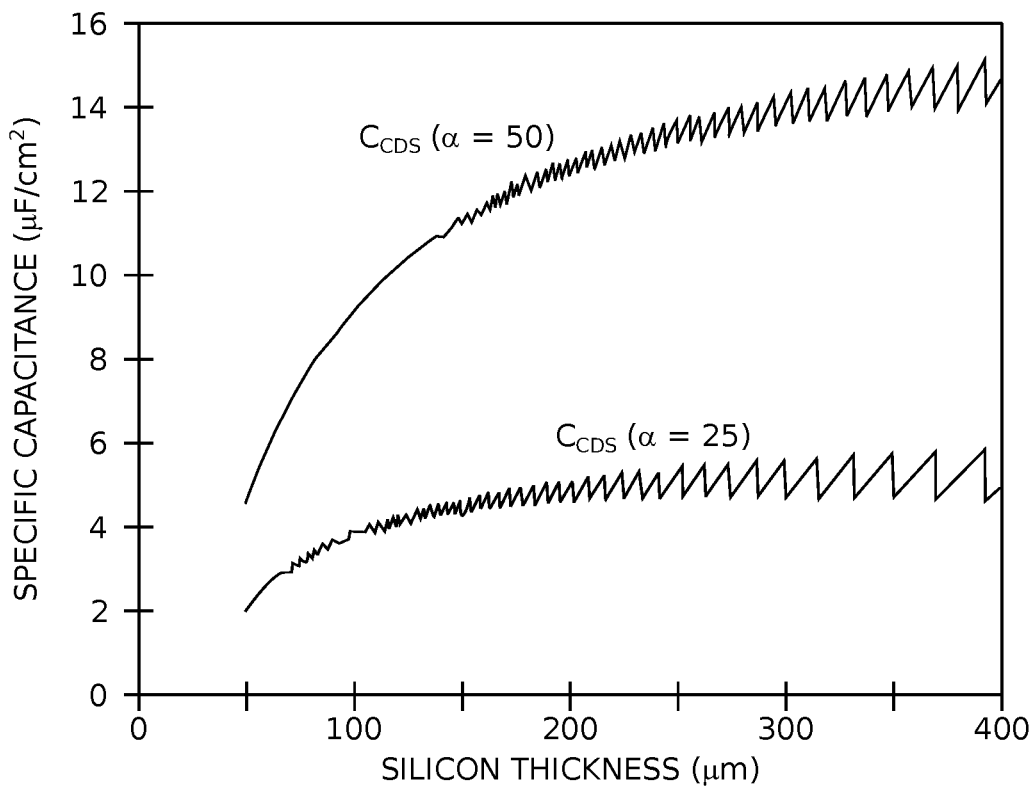
Figure 21C:
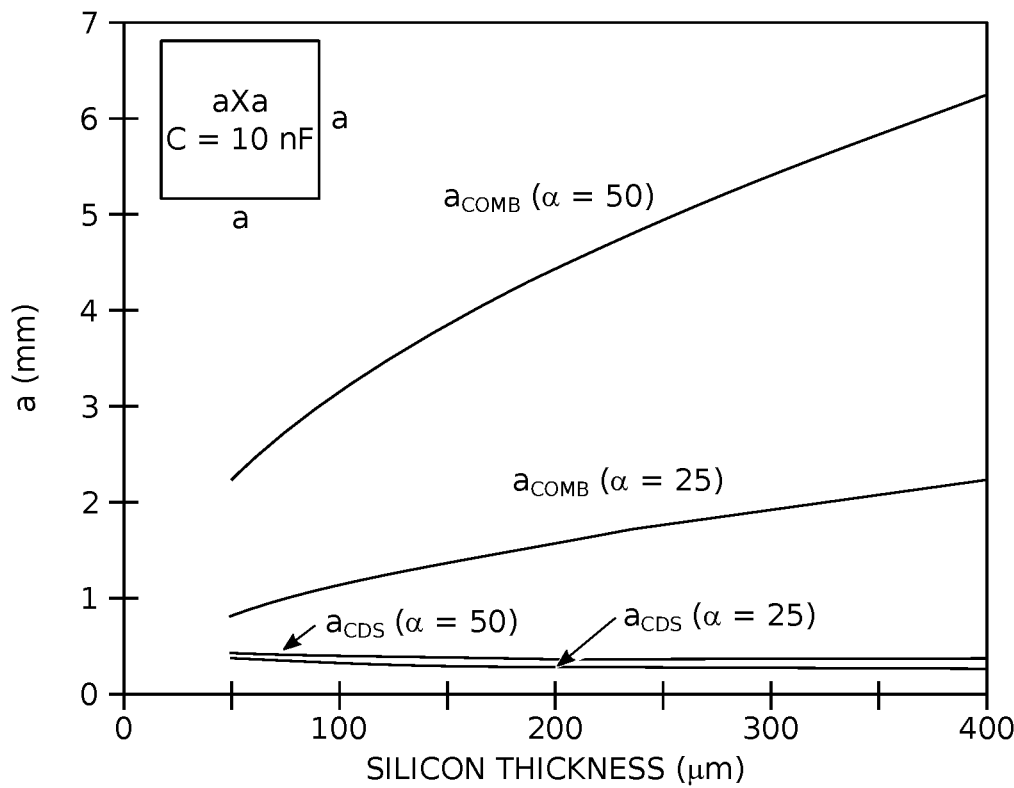
Figure 21D:
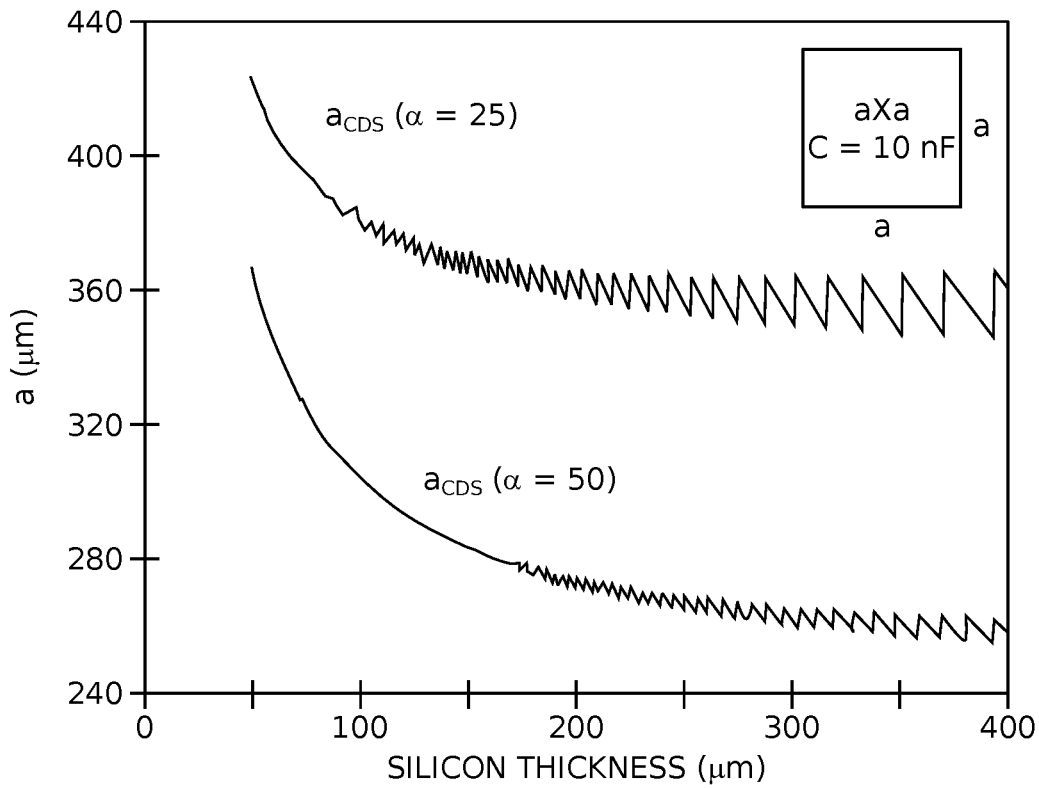

FIGS. 21A through 21E depict several capacitance variables as a function of Si thickness. In FIG. 21A capacitor components $C_{CDS}$, $C_{SW}$, $C_{TOP}$, and $C_{BOT}$ for the textured CDS capacitor are shown for aspect ratios of $\alpha=25$ and 50, as a function of silicon thickness. FIG. 21B shows CDS capacitance per unit area curves, comparing aspect ratios of $\alpha=25$ and 50, as a function of silicon thickness. FIG. 21C depicts the square side dimension "a" as a variable, comparing 10 nF comb and textured CDS capacitors for aspect ratios of $\alpha=25$ and 50, and as a function of silicon thickness ($t_{OX}=10$ nm (100 A), giving $V_{MAX}=10V$). The textured CDS side dimension of the square giving 10 nF of capacitance is much smaller than the comb capacitor. FIG. 21D shows only the textured CDS capacitor for aspect ratios of $\alpha=25$ and 50 as a function of silicon thickness ($t_{OX}=10$ nm (100 A), giving $V_{MAX}=10V$). As can be seen in FIG. 21D, the "target" 10 nF capacitor value can be achieved in a very reasonable area for any silicon thickness using a textured CDS capacitor for aspect ratios of $\alpha=25$ and 50. These example "reasonable values" for the side of the square "a" giving 10 nF capacitance are 360μ and 280μ, respectively for α=25 and 50, at a silicon thicknesses of 150μ. Comparing the textured CDS capacitor, a standard discrete chip capacitor with the same value of capacitance would require a 1 by 2 mm size. Thus, significant board savings can be achieved using CDS capacitor/inductor interposer module, which can be placed right on top of PMIC, occupying no (extra) area larger than the PMIC chip itself. A typical 4 phase DC/DC converter has 4 inductors and 4 capacitors can fit in a silicon interposer placed right on the IC with no external components using the designs disclosed herein. This result is not possible using comb or discrete capacitors.

The increase in the capacitor value associated with the textured CDS capacitor is very significantly for any aspect ratio, in a given area. The 10 nm oxide thickness taken in the simulations yields a 10V breakdown voltage. The capacitance per unit area values are also higher compared to any on-chip MOS structure built giving the same breakdown voltage using the same MOS dielectric stack by $(1+\alpha)$ rule as proven in (2.20), which results in 25-50× increase, which is a direct result of electrode texturing.

The capacitance increases with aspect ratio and with silicon thickness, which is totally opposite from the result obtained in the comb capacitor case. The difference comes from the way the dielectric is formed. The minimum value of the comb capacitor plate-to-plate spacing is controlled by the spacing aspect ratio and silicon thickness in the HARMS process and it increases as the silicon thickness increases. On the other hand, the plate-to-plate spacing in the modified HARMS process is independent of the silicon thickness or aspect ratio. A very thin $SiO_2$ gate oxide (5-15 nm) CDS capacitor can be fabricated, where dielectric thickness is only a function of desired maximum operating voltage.

Figure 21E:
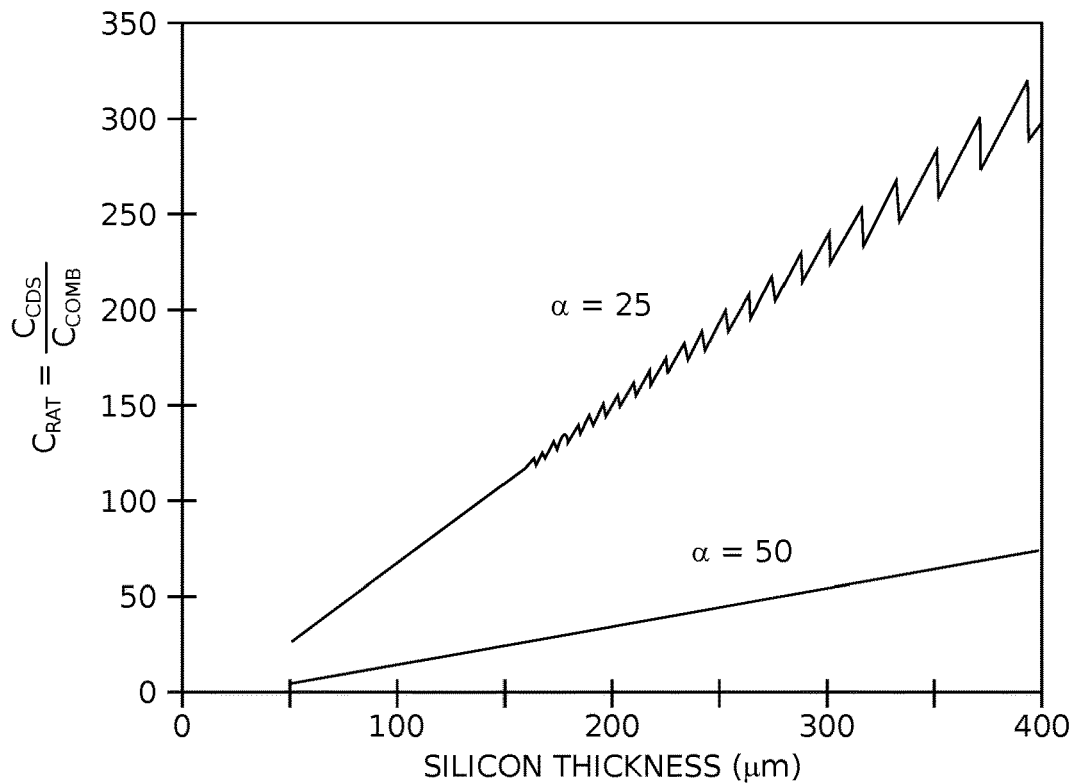

FIG. 21E depicts the ratio of the capacitance increase between the textured CDS capacitor and comb capacitor as a function of silicon thickness for α=25 and 50. Surprisingly, α=25 gives a higher ratio of increase than α=50. This is due to very low capacitance per unit area that one gets in the comb capacitor and shouldn't be misleading. As a result, using larger aspect ratios results in better (higher capacitance) textured CDS capacitors.

Series Resistance and High-Density Vertical RC Delay Line Applications

Capacitance always comes with a series resistance that can also be tailored depending to the application. High capacitance per unit area is a requirement for a DC/DC converter, or PMICs in general. The state-of-the-art maximum frequencies currently used in research are typically below 200 MHz [34-40]. However, in a majority of the DC/DC converters, the switching frequencies rarely exceed 2 MHz.

Figure 22A:
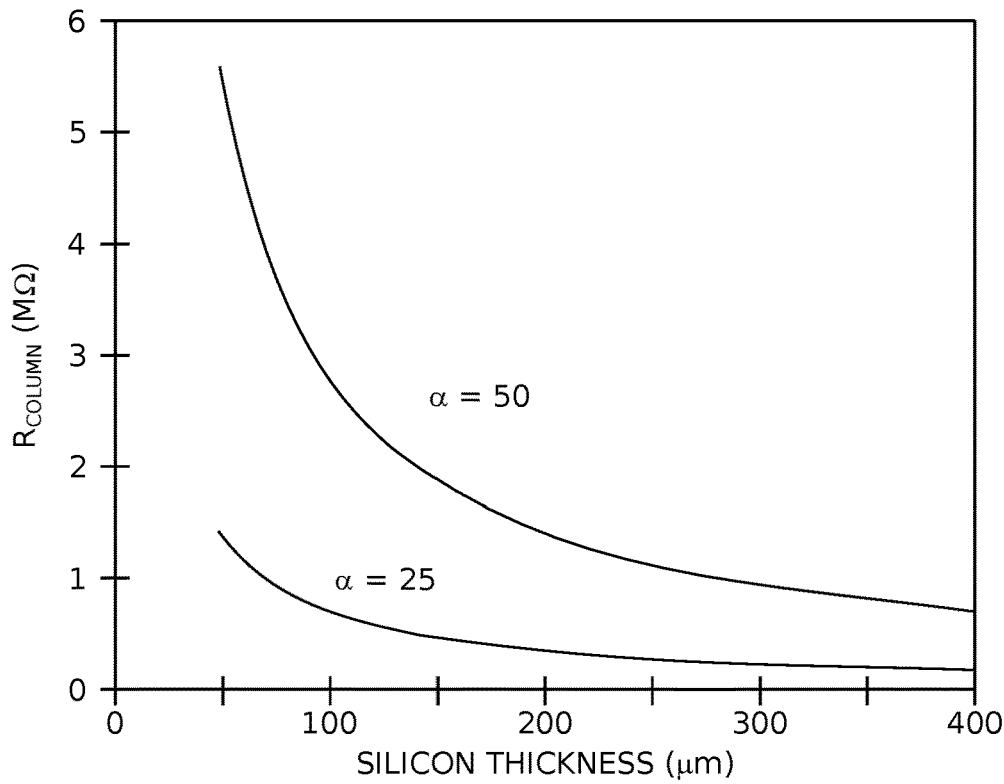
FIGS. 22A through 22H contrast Si thickness as a variable against resistance, Q, RC time constant, and mobility.
Figure 22B:
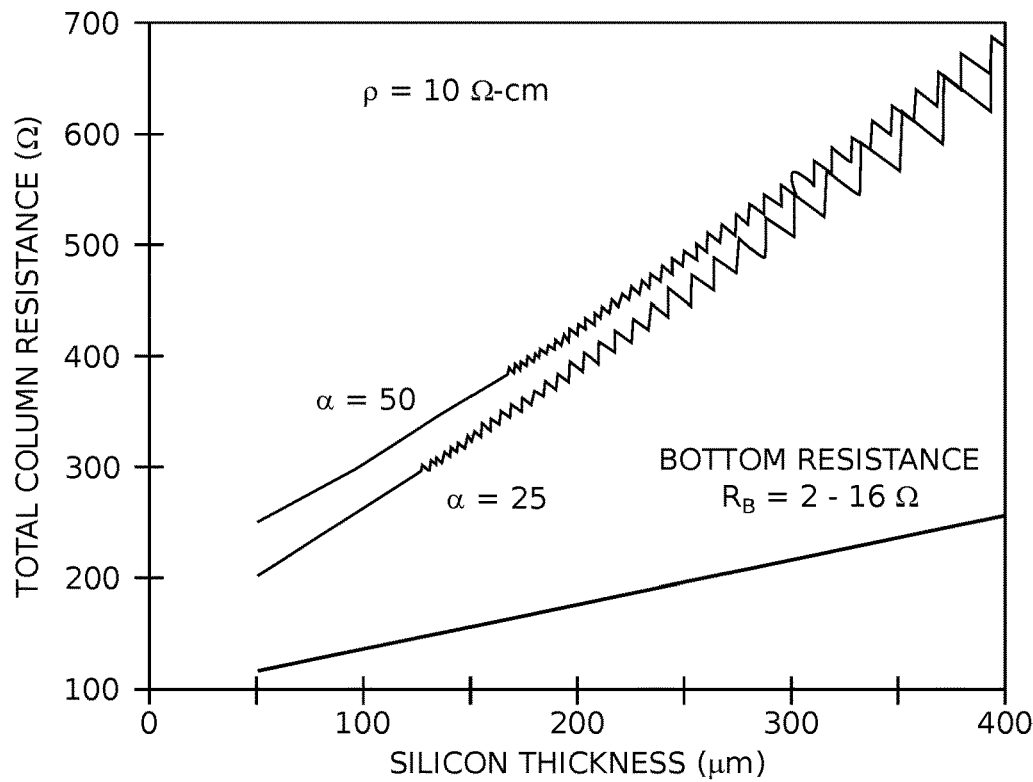

FIGS. 22A through 22H contrast Si thickness as a variable against resistance, Q, RC time constant, and mobility. The effective series resistance (ESR) of a capacitor and its Q value are important parameters, especially in capacitors for high power applications. Most of the series resistance ($R_{COLUMN}$) of the "column array capacitance" configuration is due the columns ($C_Z$) and is shown in FIG. 22A as a function of silicon thickness for α=25 and 50. The resistivity of silicon used in the calculations is 10 Ω·cm, a common starting substrate value in silicon device technology. In the calculations the bottom part where the trenches end is 10% of silicon thickness. In other words, the column height $C_Z$, in "column array capacitor" is 90% of the silicon thickness. As can be seen, each column resistance is a higher than expected value regardless of the silicon thickness. The reason for the large resistances, which are on the order of mega-ohms per column, is due to the high aspect ratio of etching that increases the surface area. The widths of these columns are given in FIG. 15C as a function of silicon thickness and aspect ratios of α=25 and 50, to clarify this point. In the "column array capacitance" configuration there may be thousands of columns in parallel as shown in FIG. 15B, which reduces the series resistance as shown in FIG. 22B. The bottom resistance is 2-16Ω, which is the resistance between the bottom contact and bottom of the trenches. Most of the resistance is still the parallel equivalent resistance of the columns.

The general resistance formula for a prism is;

$$R = \rho \frac{l}{S} \quad (2.37)$$

Where ρ, l, S are resistivity, length, and cross-sectional area where the current goes through respectively.

Figure 22C:
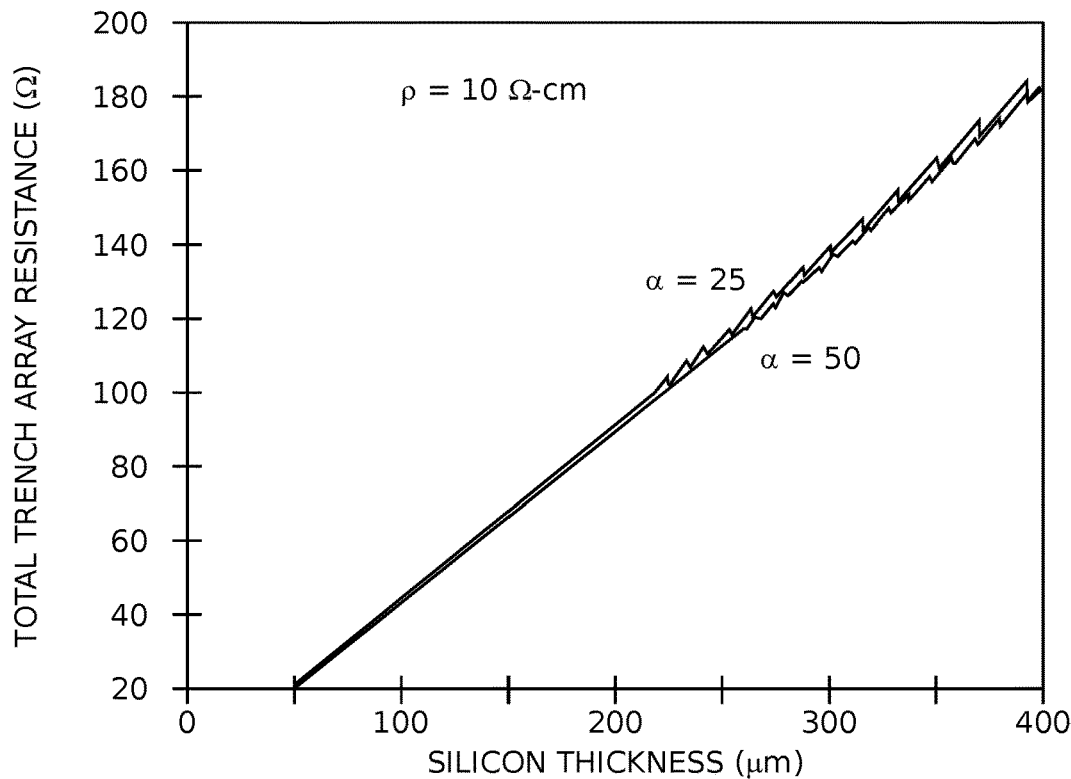
Figure 22D:
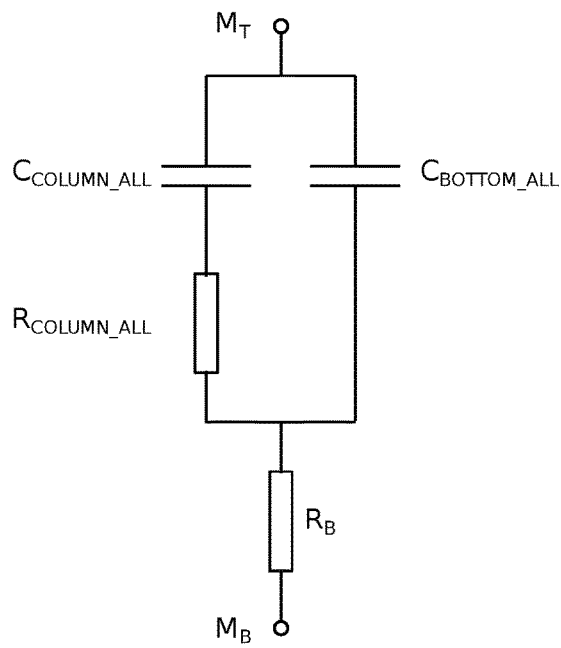
Figure 22E:
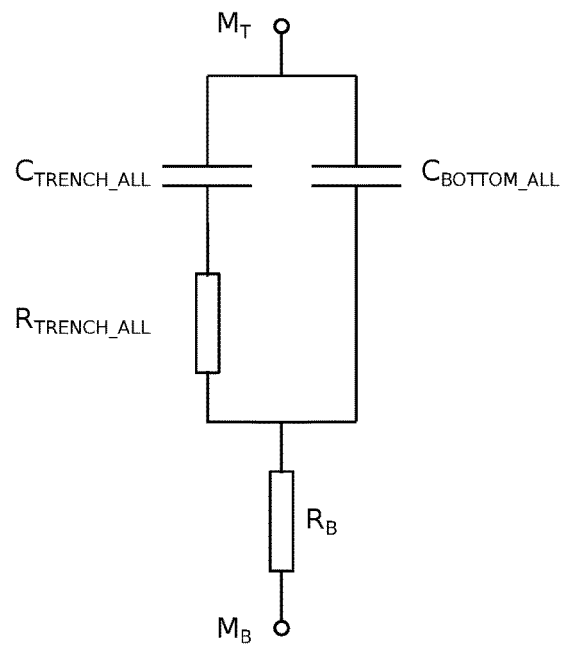
Figure 22F:
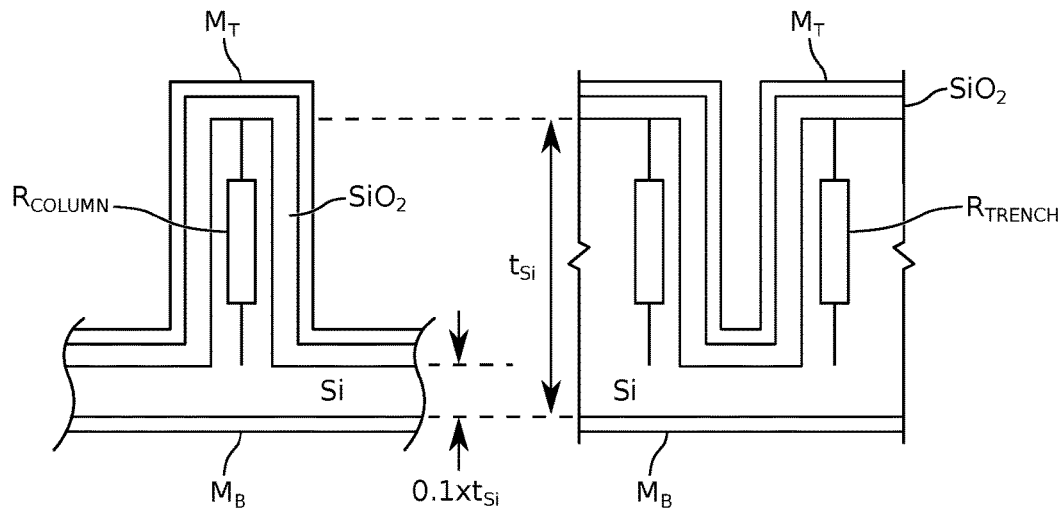
Figure 22G:
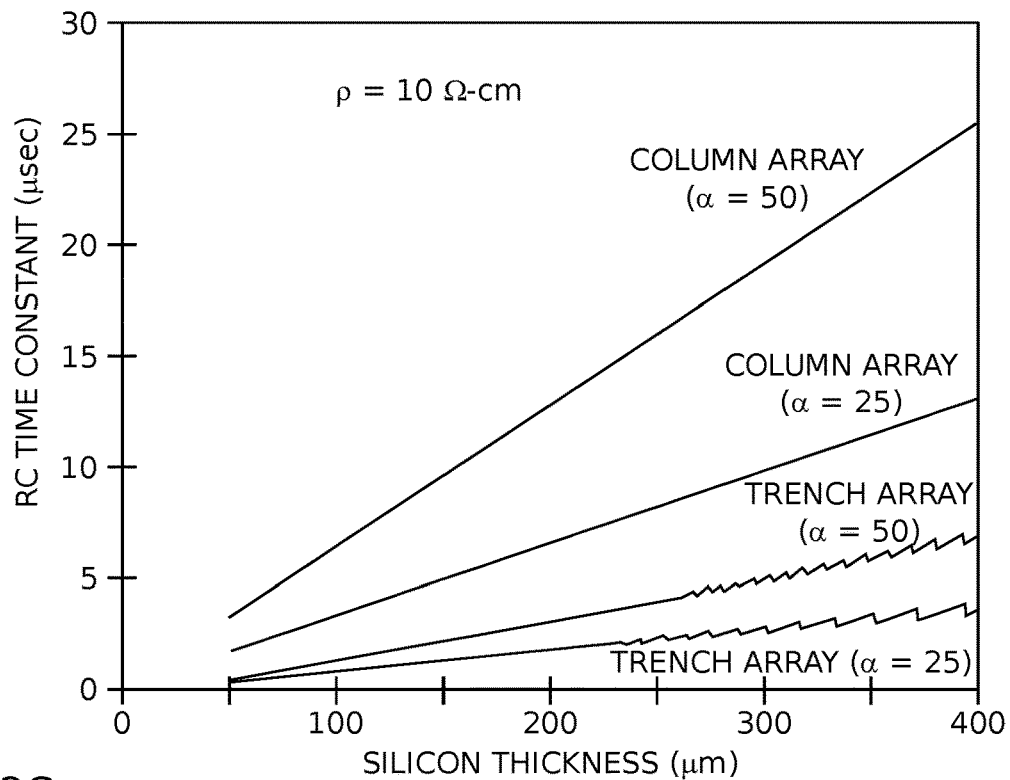

FIG. 22D gives the simplest equivalent circuit of the "Column Array" capacitor structure. FIG. 22F shows side by side geometrical view of the cross-section of the one element "Column Array" and "Trench Array" capacitor structures. $R_{COLUMN}$ shown in FIG. 22F is given by, $$R_{COLUMN\_ALL} = \rho \frac{0.9 t_{Si}}{S_T} \quad (2.38)$$

On the hand the $R_{TRENCH}$ resistance in FIG. 22F is calculated by, $$R_{TRENCH\_ALL} = \rho \frac{0.9 t_{Si}}{S_B} \quad (2.39)$$

Its dependence to silicon thickness is shown in FIG. 22A and the total parallel equivalent $R_{COLUMN\_ALL}$ as a function of silicon thickness is shown in FIG. 22B which is also the same $R_{COLUMN\_ALL}$ in the equivalent circuit shown in FIG. 22D. $R_B$ in FIG. 22B is the resistance between the bottom contact and the bottom of the trenches and its resistance can be approximated by, $$R_B = \rho \frac{0.1 t_{Si}}{S_{CELL}} \quad (2.40)$$

Since $S_B$, the area between the columns, is larger than $S_T$ as shown in FIGS. 17A-17C and as proven for any possible Bosch process, the "trench array capacitance" configuration will give smaller series resistance as well as better structural stability as shown in FIG. 22C.

A good measure of the dynamics of the capacitor is given by the RC time constant and the Q factor. The RC time constant for the "column array" and "trench array" configuration is given in FIG. 22G as a function of silicon thickness, α=25 and 50, for "column array" and "trench array" configurations using a 10 Ω·cm substrate and 10 nm thick gate oxide.

Q factor of a capacitor is formulated as, $$Q = \frac{1}{2\pi f RC} \quad (2.41)$$

Figure 22H:
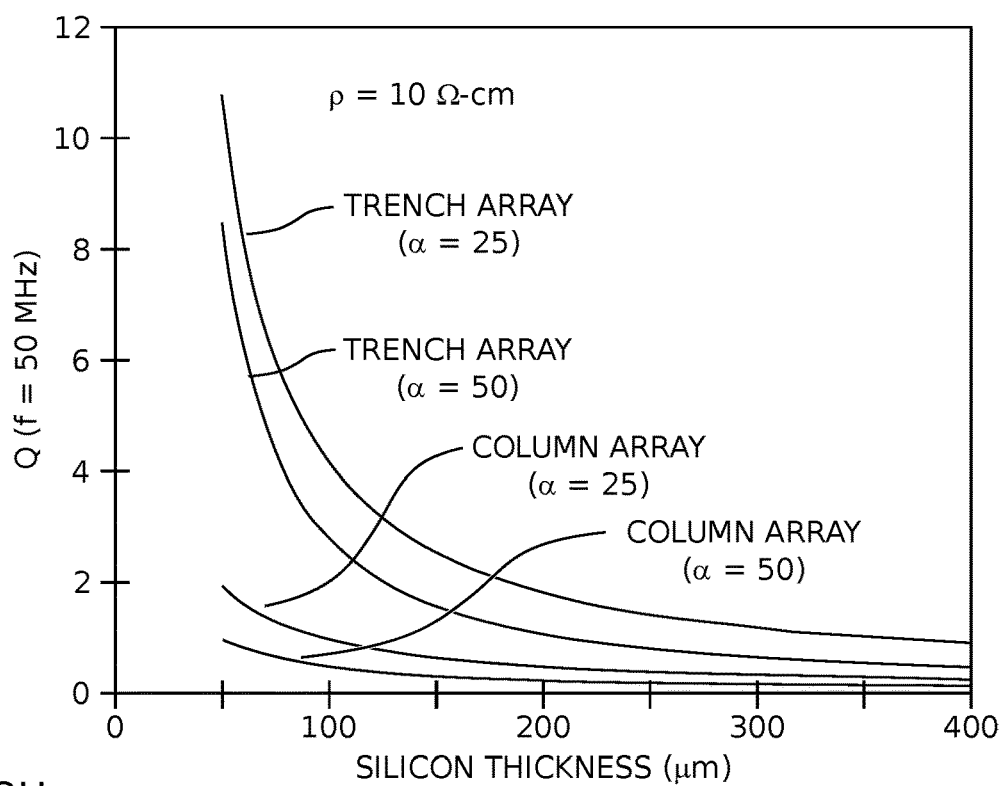

FIG. 22H shows Q at 50 MHz for "column array" and "trench array" configurations using a 0.1 Ω·cm substrate and 10 nm thick gate oxide, as a function of silicon thickness, for α=25 and 50. These are low Q values and the "trench array" clearly is superior to "column array" capacitor structures. 50 MHz was selected to investigate the capacitance applications for the PMIC application space, and easy frequency scalability for this application can go as high as 200 MHz. From FIG. 22H, it can be seen that for a good Q value the substrate resistance must be much lower than 0.1 Ω·cm.

In the investigation of substrate resistance effects on the RC time constant and Q of the capacitor, temperature effects should also be taken into consideration. For this investigation the right variable of choice is doping concentration rather than substrate resistivity. Resistivity is not one of the independent variables of semiconductor carrier transport equations, it is an outcome given with, $$\rho = \frac{1}{\sigma} = \frac{1}{p\mu_p + n\mu_n} \quad (2.42)$$

where p, n, $\mu_p$ and $\mu_n$ are hole and electron concentration, and hole and electron mobilities, respectively.

Figure 23A:
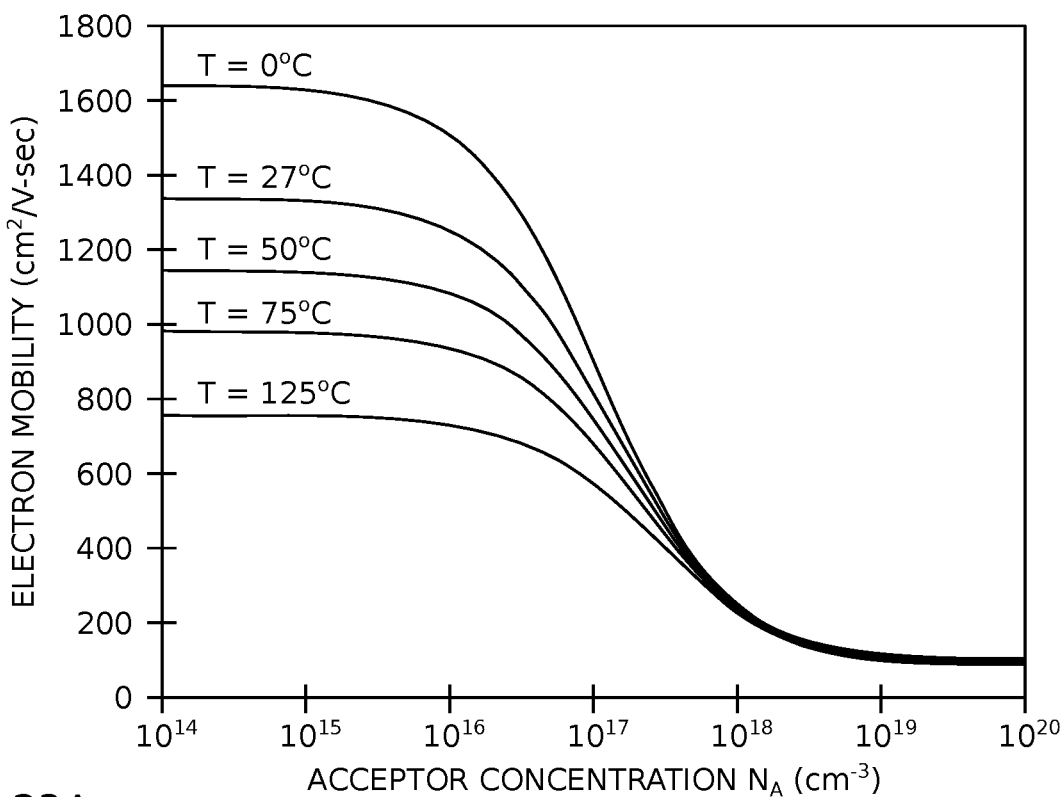
FIGS. 23A through 23C show the electron and hole mobilities, and resistivity as a function of doping concentration, at temperatures of 0, 25, 75, 125° C.
Figure 23B:
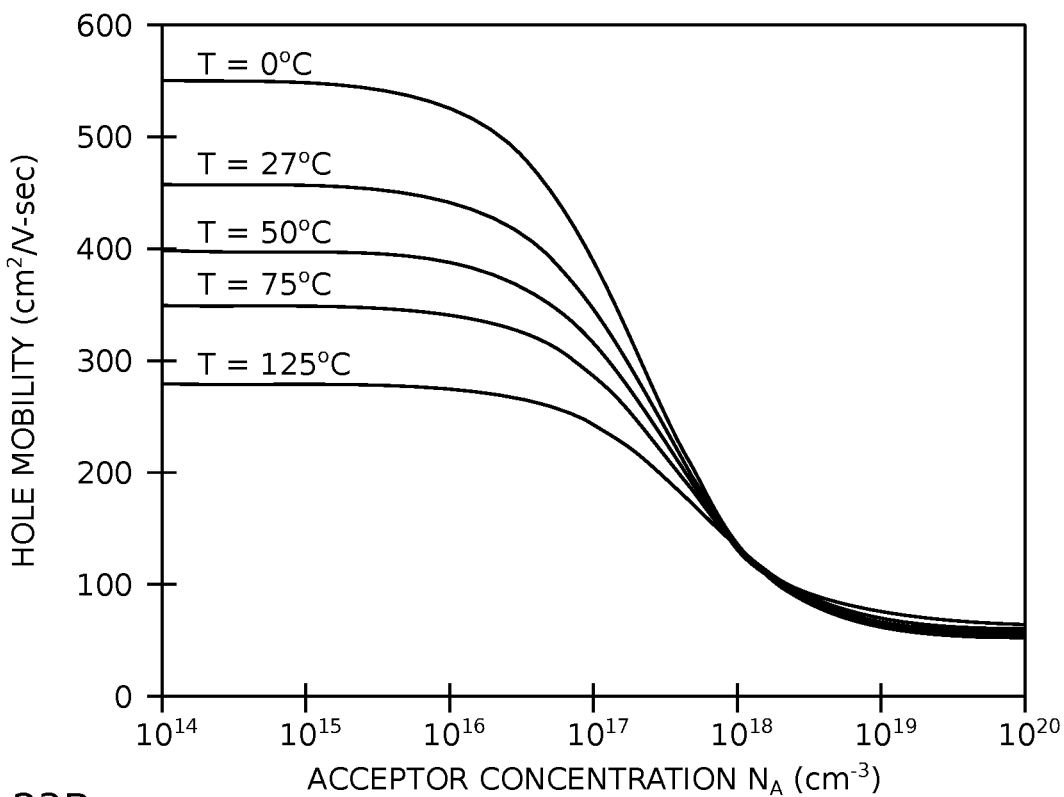
Figure 23C:
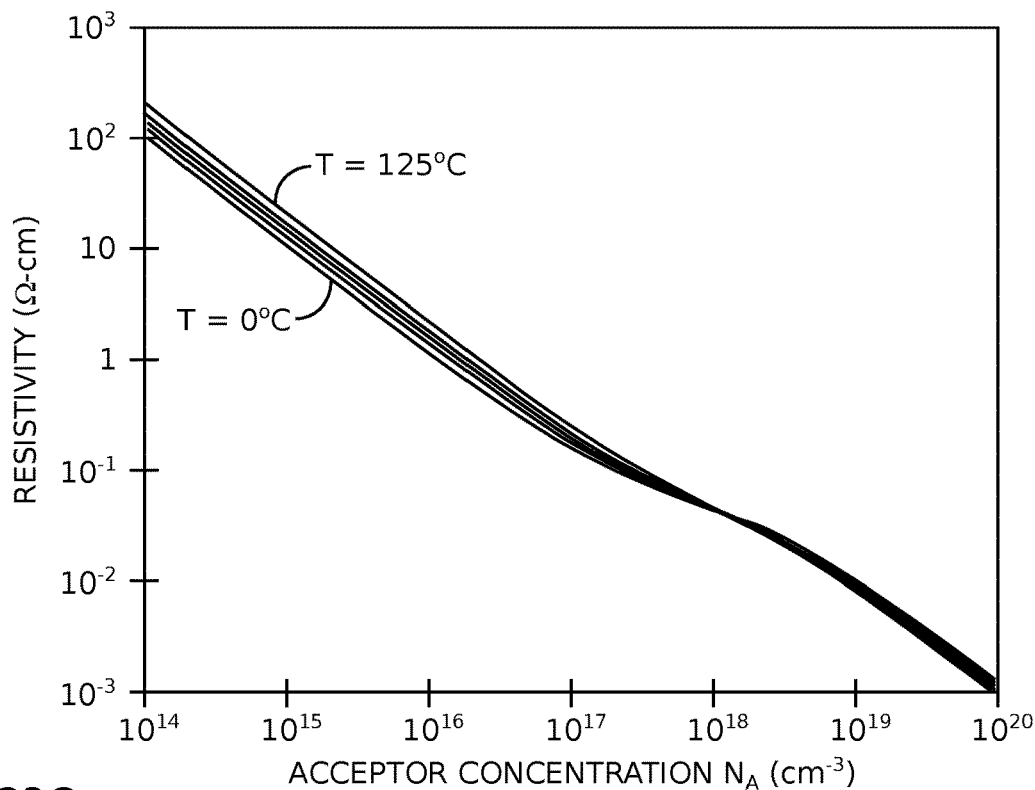
Figure 24A:
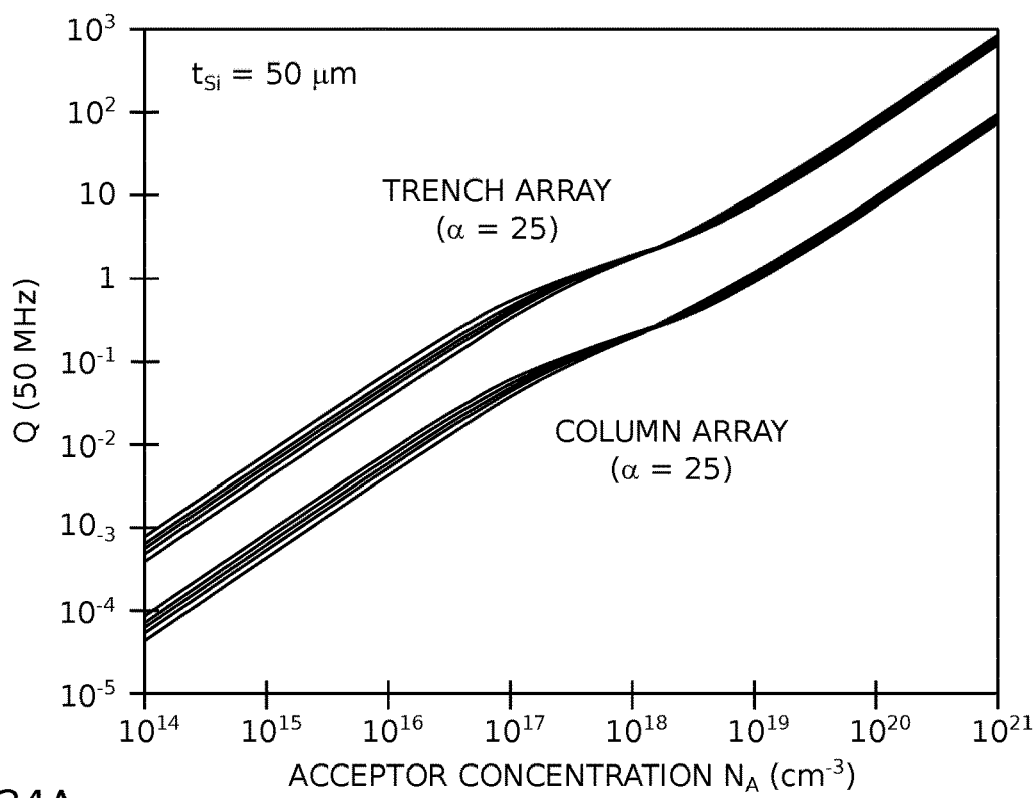
FIGS. 24A through 24D depict Q as a function of doping concentration for temperatures of 0, 27, 50, 75, and 125° C., at silicon thicknesses of 50, 100, 200, and 300µ at 50 MHz.
Figure 24B:
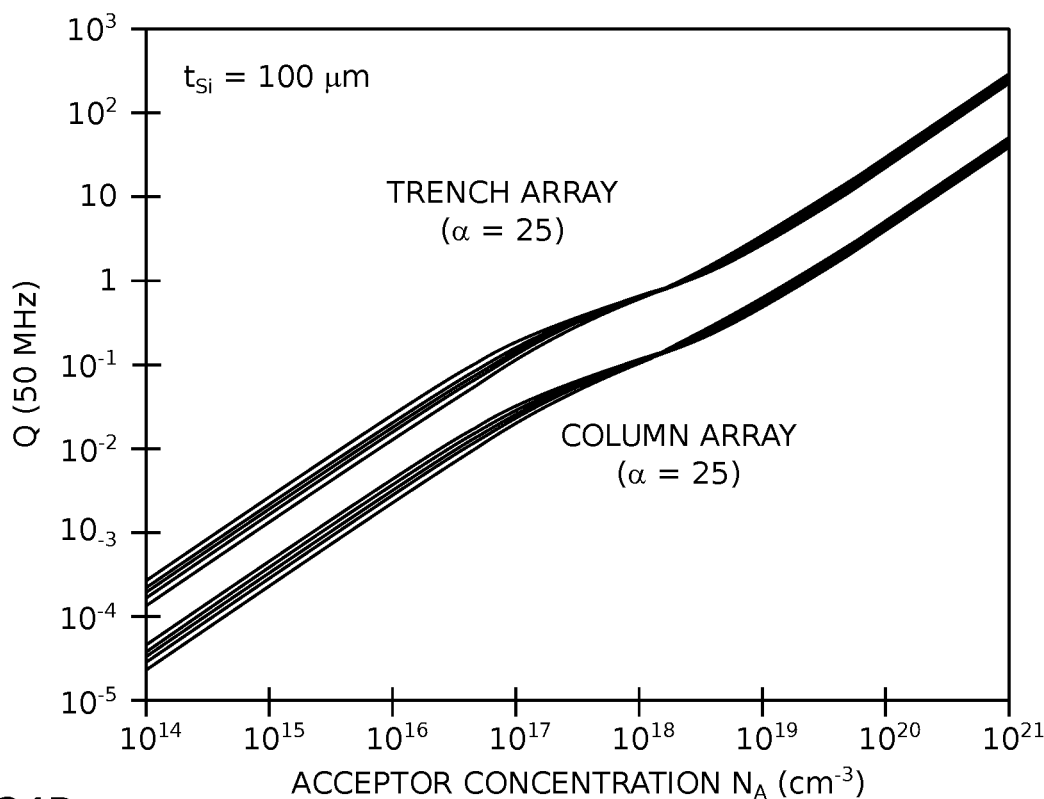
Figure 24C:
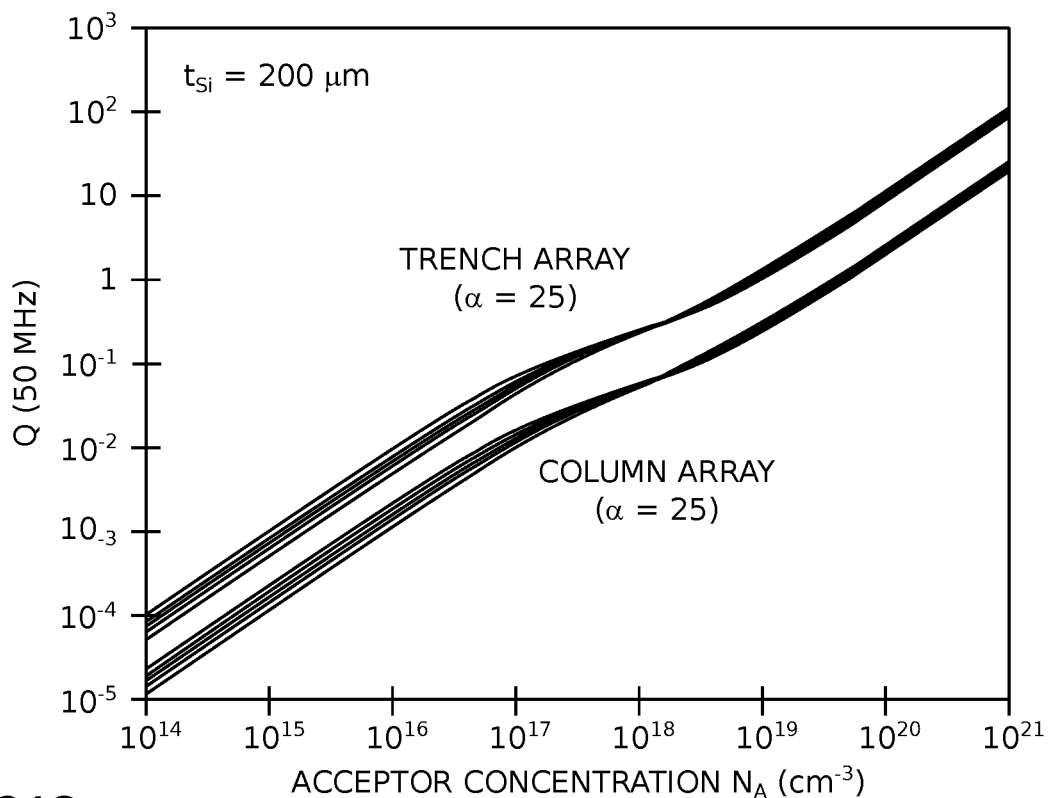
Figure 24D:
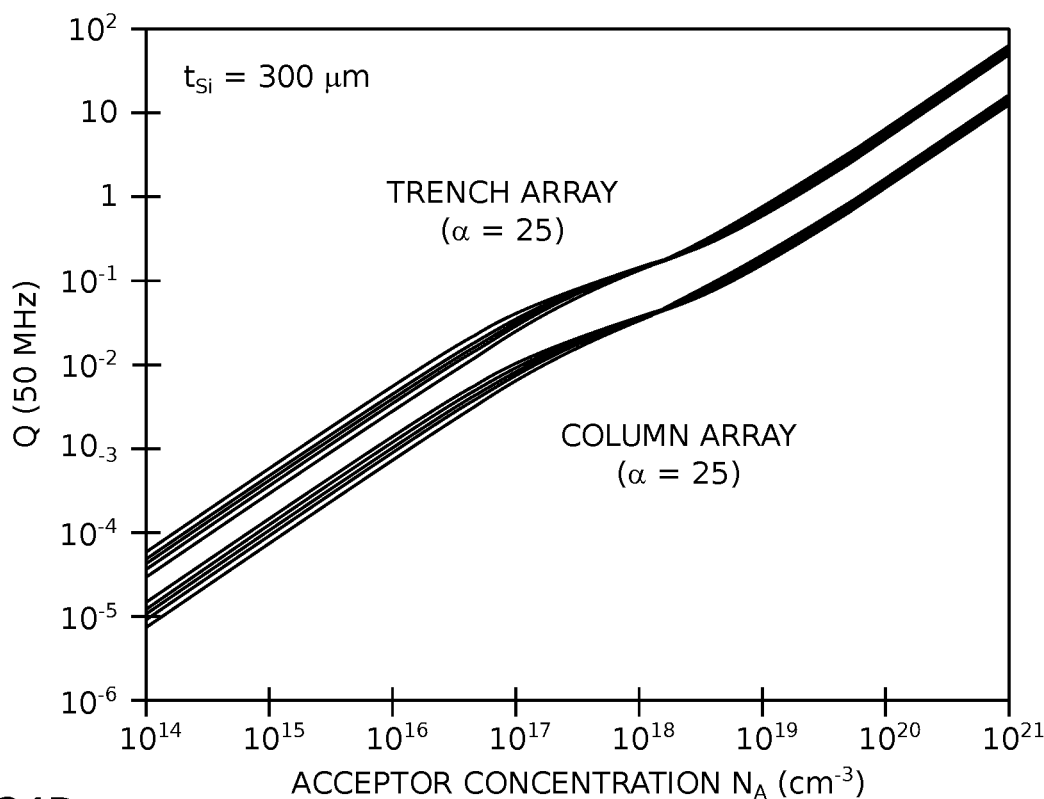

FIGS. 23A through 23C show the electron and hole mobilities, and resistivity as a function of doping concentration, at temperatures of 0, 25, 75, 125° C. Electron and hole mobilities are a strong function of temperature for a doping concentration lower than $10^{17}$ cm$^{-3}$. FIG. 23C shows the resistivity of p type silicon as a function of doping concentration, for temperatures of 0, 25, 75, 125° C. using (2.29) with the temperature and doping concentration dependent mobility relations given at [44]. As can be seen, 0.1 Ω·cm resistivity corresponds to $2 \cdot 10^{17}$ cm$^{-3}$ at 25° C. As a result, for PMIC applications higher doping levels, in the range of $10^{18}$ cm$^{-3}$ levels and higher, are needed for sufficient capacitance. Another parameter of the puzzle is the silicon thickness.

FIGS. 24A through 24D depict Q as a function of doping concentration for temperatures of 0, 27, 50, 75, and 125° C., at silicon thicknesses of 50, 100, 200, and 300μ at 50 MHz. For a Q>10, in the temperature range 0-125° C., substrates with doping densities of $10^{19}$ cm$^{-3}$ are required. As shown, there are essentially no differences across the temperature range.

To this point the analysis of the CDS capacitor assumes an ideal capacitor formed by the gate oxide $C_{OX}$ in between metallization and silicon. However, this is not accurate. Rather, the gate capacitance can be modeled as series combination of 2 capacitors, one being the gate oxide capacitor $C_{OX}$, as previously assumed, and a complex voltage dependent capacitor formed in silicon $C_{Si}$, which requires some device physics more than electrostatics. The series equivalent of two capacitors $C_{OX}$ and $C_{Si}$ is, $$C_{MOS} = \frac{C_{OX} C_{Si}}{C_{OX} + C_{Si}} \quad (2.43)$$

Figure 26A:
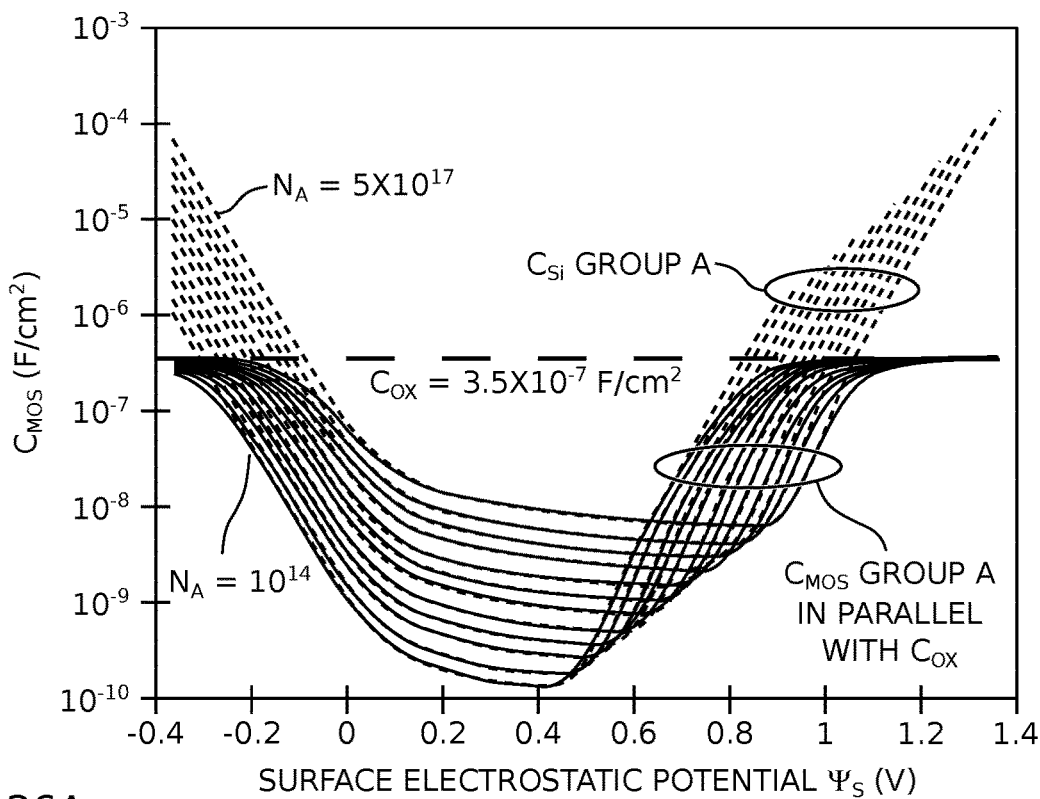
FIGS. 26A through 26E are graphs depicting surface electrostatic potential as a variable.

According to this formulation $C_{MOS}$ is always smaller than the smallest capacitor in series and this very important property must be remembered, as graphically depicted in FIG. 26A. Therefore, the previous results overestimate the capacitance value, but the inaccuracy is not large enough to change the conclusions. The derivation of $C_{Si}$ is complex, but is needed for further understanding, especially for varactor applications.

MOS Capacitor Physics Overview

The CDS capacitors built using the modified HARMS process are basically a MOS type capacitor, and the theory of the MOS capacitor is covered very extensively. MOS capacitor behavior differs from a conventional (e.g., ceramic) capacitor, and this difference becomes greater as the doping level in silicon is lowered. One important factor is the bias voltage dependence of the MOS capacitor. High doping levels create MOS capacitors that behave similarly to conventional capacitors, which have very small DC bias voltage dependencies.

Even though the theory of MOS capacitors is well understood [16-24], all the excellent classical reference device physics and technology books and references in wide circulation explain the exact analytical solution of the Boltzmann-Poisson equation in a manner that is not as clear as it might be. The results given are the same, but the derivation is very short and with minimal mathematical detail [16-24]. To clarify this ambiguity in this work, a significant effort is given to derive the exact one-dimensional analytical solution of the Boltzmann-Poisson equation with no short-cuts, which is for better understanding the CDS capacitor used in this work. Since this requires many ignored derivations in the literature, it starts from semiconductor carrier transport equations.

General Formulation of Semiconductor Transport Equations

Semiconductor carrier transport equations are three coupled non-linear partial differential equations. The first one is the Poisson's equation which relates the charge density ρ to the electro-static potential Ψ with the Maxwell's Equations variables written as [16-18], $$\nabla \vec{D} = \rho \text{ where } \vec{D} = \varepsilon \vec{E} \text{ and } \vec{E} = -\nabla \psi \quad (3.1)$$

where $\vec{D}$ and $\vec{E}$ are Displacement and Electric field vectors and $\varepsilon = \varepsilon_r \varepsilon_0$. For a region having non-homogeneous dielectric distribution, like in the MOS capacitor, Poisson's equation should be written as, $$\nabla(\varepsilon \nabla \psi) = -q(p - n + N_D^+ - N_A^-) \quad (3.2)$$

where q and ε are electron charge and dielectric constant distribution in the region of interest, and p and n are the hole and electron concentration distribution in the region. $N_D^+$ and $N_D^-$ are the three-dimensional ionized donor and acceptor concentration distribution in the region. ψ, p, and n are the main variables of the system which are functions of x, y, and z spatial coordinates as well. The continuity equation for holes is, $$\nabla \vec{J_p} + \frac{1}{q} \frac{\partial p}{\partial t} = -R \quad (3.3)$$

The continuity equation for electrons is, $$\nabla \vec{J_n} - \frac{1}{q} \frac{\partial n}{\partial t} = R \quad (3.4)$$

Where in its simplest form R is the Shockley-Hole-Read generation-recombination term written as, $$R = \frac{pn - n_i}{\tau_p(n + n_i) + \tau_n(p + n_i)} \quad (3.5)$$

where $n_i$, $\tau_p$, and $\tau_n$ are intrinsic electron concentration, life times for holes, and electrons respectively, which are in the order of milliseconds in silicon. In the Shockley-Hole-Read generation-recombination term given in (3.5), the recombination centers are assumed to be located at the mid-gap level. The negative value of R ($pn < n_i^2$) corresponds to net generation of carriers, like in the depletion region, and a positive value for R ($pn > n_i^2$) corresponds to the net recombination of carriers. For large excess carrier concentrations, Auger recombination should also be added to the R term.

Current density equation for holes and electrons both having drift and diffusion terms are expressed as, $$\vec{J}_p = qp\mu_p \vec{E} - qD_p \nabla p \quad (3.6)$$

$$\vec{J}_n = qn\mu_n \vec{E} + qD_n \nabla n \quad (3.7)$$

where $D_p$, $D_n$, $\mu_p$, $\mu_n$, k, T, and q are diffusion coefficient for holes and electrons, hole and electron mobilities Boltzmann constant, temperature in Kelvin, and electron charge. Electron and hole mobilities $\mu_p$ and $\mu_n$ are functions of doping concentration, temperature, and electric field [43, 44]. Einstein relates the diffusion coefficient for holes and electrons, hole and electron mobilities as, $$\frac{D_p}{\mu_p} = \frac{D_n}{\mu_n} = \frac{kT}{q} = v_T \quad (3.8)$$

Where q, T, and k are electron charge ($1.60218 \times 10^{-19}$ C), temperature in Kelvin, and Boltzmann constant ($1.38066 \times 10^{-23}$ J/K), respectively. Thermal voltage $V_T$ at 300° K is 0.02585 volts. Substituting (3.1) and (3.8) in the current density equations (3.6) and (3.7) gives, $$\vec{J}_p = -qp\mu_p \nabla \psi - q\mu_p v_T \nabla_p \quad (3.9)$$

$$\vec{J}_n = -qn\mu_p \nabla \psi + q\mu_n v_T \nabla_n \quad (3.10)$$

Using Boltzmann statistics for non-degenerate doping levels, the electron and hole concentration are related to electrostatic potential $\psi$, quasi Fermi potential for holes $\phi_p$, and electrons $\phi_n$ [19, 21-24, 32, 33] as, $$p = n_i \exp\left(\frac{\phi_p - \psi}{v_T}\right) \quad (3.11)$$

$$n = n_i \exp\left(\frac{\psi - \phi_n}{v_T}\right) \quad (3.12)$$

Remembering the gradient of an exponential relation in calculus, $$\nabla e^u = e^u \nabla u \quad (3.13)$$

And applying it to (3.11) and (3.12) gives, $$\nabla p = p\nabla\left(\frac{\phi_p - \psi}{v_T}\right) = \frac{1}{v_T} p(\nabla \phi_p - \nabla \psi) \quad (3.14)$$

and $$\nabla n = n\nabla\left(\frac{\psi - \phi_n}{v_T}\right) = \frac{1}{v_T} n(\nabla \psi - \nabla \phi_n) \quad (3.15)$$

Substituting (3.14) and (3.15) in (3.9) and in (3.10) gives another formulation of hole and electron current density relations as, $$\vec{J}_p = -q\mu_p \nabla \phi_p \quad (3.16)$$

$$\vec{J}_n = -q\mu_p n \nabla \phi_n \quad (3.17)$$

As can be seen all these formulations are given in three dimensions. For a CDS capacitor the region of interest can be accurately modeled with only one-dimensional analysis where an analytical closed form solution is possible.

One-Dimensional Mathematical Formulation of the Electric Field Versus Surface Potential in MOS Structures Electron and hole carrier concentrations in one dimension and for non-degenerate doping levels can be expressed with Boltzmann statistics [19, 21-24, 32, 33] as, $$n(x) = n_i \exp\left[\frac{\psi(x) - \phi_n(x)}{v_T}\right] \quad (4.1)$$

$$p(x) = n_i \exp\left[\frac{\phi_p(x) - \psi(x)}{v_T}\right] \quad (4.2)$$

where $n_i$, $\Psi$, $\phi n$, and $\phi p$ are intrinsic carrier concentration, electro-static potential, and quasi Fermi potentials for electrons and holes. The thermal equilibrium enforces the relation, $$p \cdot n = n_i^2 \quad (4.3)$$

From the alternate formulation of current density relation given in (3.16) and (3.17), to have zero DC electron and hole current density distribution [$J_n(x) = J_p(x) = 0$ for ALL x] for any electro-static potential distribution $\Psi(x)$, the quasi-Fermi potentials $\phi n$ and $\phi p$ must satisfy, $$\frac{d\phi_n}{dx} = \frac{d\phi_p}{dx} = 0 \quad (4.4)$$

This relationship is not clear with the identical current density formulation given at (3.9) and (3.10), but becomes clear with the alternate formulation for current density relation given at (3.16) and (3.17). In this case $\phi n$ and $\phi p$ quasi-Fermi potentials can be replaced with a constant reference potential $\phi$ satisfying (4.4). Intrinsic electron concentration $n_i$ is also a complex function given as, $$n_i = \sqrt{N_C N_V} \exp\left[-\frac{E_G(T)}{2kT}\right] \quad (4.6)$$

where $N_V$ and $N_C$ are effective density of states in the valance and conduction bands and $E_G$ is the semiconductor band-gap. The intrinsic electron concentration $n_i$ at 300° K is $1.45 \times 10^{10}$ cm$^{-3}$ for silicon. Band-gap versus temperature dependence can be represented by the empirical curve-fit formula [21], $$E_G(T) = E_G(0) - \frac{\alpha T^2}{(T + \beta)} \quad (4.7)$$

where T, $E_G(0)$, $\alpha$, and $\beta$ are temperature in Kelvin, along with empirical constants 1.17 eV, $4.73 \times 10^{-4}$, and 636 respectively for silicon [21]. The band gap in silicon at 300° K or $E_G(300)$ is 1.12 eV.

The $\sqrt{N_C N_V}$ in (4.7) is a function of temperature and can be replaced by a single temperature independent constant "A" as, $$\sqrt{N_C N_V} = A \cdot T^{1.5} \tag{4.8}$$

"A" in (3.8) is a constant contains complex functions of hole and electron effective masses in conduction and valance bands, as well as Boltzmann and Planck constants [21]. "A" can be taken as $7.132 \times 10^{15}$ for silicon. The net charge density $\rho(x)$ is, $$\rho(x) = p(x) - n(x) + N_D^+(x) - N_A^-(x) \tag{4.9}$$

The analysis is performed for uniformly doped silicon, so therefore the x dependencies in $N_D^+(x)$ and $N_A^-(x)$ can be removed in (3.9).

Sufficiently far away from the $SiO_2$-to-silicon interface at the surface, and towards the bulk where $x \to \infty$, the charge density, $\Psi$, and the electric field are zero. Solving (4.9) with this assumption gives, $$n_i \exp\left[\frac{\phi}{v_T}\right] - n_i \exp\left[-\frac{\phi}{v_T}\right] + N_D^+ - N_A^- = 0 \tag{4.10}$$

$$N_D^+ - N_A^- = -2n_i \sinh\left(\frac{\phi}{v_T}\right) \tag{4.11}$$

Where Sin h(t) in (3.11) and Cos h(t) in (3.25-3.27) is given by, $$\sinh(t) = \frac{e^t - e^{-t}}{2} \text{ and } \cosh(t) = \frac{e^t + e^{-t}}{2} \tag{4.12}$$

As a result, the one-dimension Poisson's Equation for non-homogeneous dielectric distribution becomes, $$\frac{d}{dx}\left(\varepsilon_r \frac{d\psi}{dx}\right) = -\frac{q}{\varepsilon_0} \rho(x) \tag{4.11}$$

It is useful to note that the magnitude of the electric field is related to the electro-static potential in one dimension by, $$E = -\frac{d\psi}{dx} \tag{4.12}$$

Substituting (4.10) in (4.11) and for uniform dielectric distribution (4.11) and for thermal equilibrium condition can be written as, $$\frac{d}{dx}\left(\frac{d\psi}{dx}\right) = -\frac{q}{\varepsilon_{Si}} \rho(x) \text{ where } \varepsilon_{Si} = \varepsilon_{rSi} \varepsilon_0 \tag{4.13}$$

Substituting (4.12) in (4.13) gives, $$\frac{dE}{dx} = \frac{q}{\varepsilon_{Si}} \rho(x) \tag{4.14}$$

Since carrier concentrations p(x) and n(x) are exponentially related to the electro-static potential, (4.14) is a non-linear differential equation for which a closed form analytical solution does not exist. Substituting (3.11) in (3.14) gives the non-liner differential equation explicitly as, $$\frac{dE}{dx} = \frac{2qn_i}{\varepsilon_{Si}}\left[\sinh\left(\frac{\psi - \phi}{v_T}\right) + \sinh\left(\frac{\phi}{v_T}\right)\right] \tag{4.15}$$

Equation (4.15) can only be solved using discrete variable methods numerically and the solution gives very valuable information [32, 33]. Since only the surface charge density as a function of surface potential $\Psi_S$ need be known to obtain many of the physical and electrical characteristics of the CDS capacitor or MOS devices in general, this approach is even more valuable and elegant.

All the literature presented below points to the classic book of physics "The Feynman's Lecture of Physics" by Richard Feynman [18]. Reading all three marvelous volumes of freshman physics gives the feeling like learning physics all over again even for a seasoned physicist. In the Vol II, pp 7-9 Richard Feynman wrote, "This equation is readily solved in general [multiply both sides by $$2\left(\frac{d\phi}{dx}\right),$$

and integrate with respect to x]." However, this way of arriving at the solution may be a bit indirect and confusing for many. A more systematic and rigorous way, like using the Leibnitz's chain rule, is, $$\frac{dE}{dx} = \frac{dE}{d\psi}\frac{d\psi}{dx} \tag{4.16}$$

Focusing only on the left-hand side of the equation (4.15) for now and substituting (4.12) into (4.16) gives, $$\frac{d}{dx}\left(\frac{d\psi}{dx}\right) = -\frac{dE}{dx} = -\frac{dE}{d\psi}\frac{d\psi}{dx} \tag{4.17}$$

On the right of the equation there is another $$\frac{d\psi}{dx}$$

and substituting (4.12) in (4.17) one more time gives, $$\frac{d}{dx}\left(\frac{d\psi}{dx}\right) = -\frac{dE}{dx} = -\frac{dE}{d\psi}(-E) \tag{4.18}$$

giving $$E\frac{dE}{d\psi} = \frac{q}{\varepsilon_{Si}} \rho(\psi) \tag{4.19}$$

This is the result given in all the literature using Feynman's hint, here derived by employing Leibnitz's chain rule instead of a "magical constant" and it can be generalized for many other applications as well. From here on the math and physics remain the same as published in the literature. Moving $d\Psi$ to the right-hand side of (4.19) gives, $$EdE = \frac{q}{\varepsilon_{Si}} \rho(\psi) d\psi \tag{4.20}$$

As can be seen, the non-linearity in the equation (4.11) has disappeared, and both left and right-hand sides are analytically intergrable integrals in terms of E and $\Psi$ as, $$\int EdE = \frac{q}{\varepsilon_{Si}} \int \rho(\psi) d\psi \tag{4.21}$$

Where $E_S$ is the electric field in the $SiO_2$-silicon interface at the surface and surface potential $\Psi_S$. Integrating the left hand side is straightforward giving, $$\int EdE = \frac{1}{2} E_S^2 = \frac{q}{\varepsilon_{Si}} \int \rho(\psi) d\psi \tag{4.22}$$

The integration of the right-hand side can be explicitly written as, $$\frac{2qn_i}{\varepsilon_{Si}} \int \left[\sinh\left(\frac{\psi - \phi}{v_T}\right) + \sinh\left(\frac{\phi}{v_T}\right)\right] d\psi \tag{4.23}$$

The integration of (4.23) is trivial and gives, $$\frac{2qn_i}{\varepsilon_{Si}} \left[v_T \cosh\left(\frac{\psi - \phi}{v_T}\right) + \psi \sinh\left(\frac{\phi}{v_T}\right) + K\right] \tag{4.24}$$

Integration constant K is solved with the boundary condition $$K = -v_T \cosh\left(\frac{\phi}{v_T}\right) \tag{4.25}$$

finally, $$E_S^2 = \frac{4qn_i v_T}{\varepsilon_{Si}} \left[\cosh\left(\frac{\psi_S - \phi}{v_T}\right) + \frac{\psi_S}{v_T} \sinh\left(\frac{\phi}{v_T}\right) - \cosh\left(\frac{\phi}{v_T}\right)\right] \tag{4.26}$$

$$E_S = 2u\sqrt{\frac{qn_i v_T}{\varepsilon_{Si}} \left[\cosh\left(\frac{\psi_S - \phi}{v_T}\right) + \frac{\psi_S}{v_T} \sinh\left(\frac{\phi}{v_T}\right) - \cosh\left(\frac{\phi}{v_T}\right)\right]} \tag{4.27}$$

where u is the sign of $\psi_S$.

Figure 25:
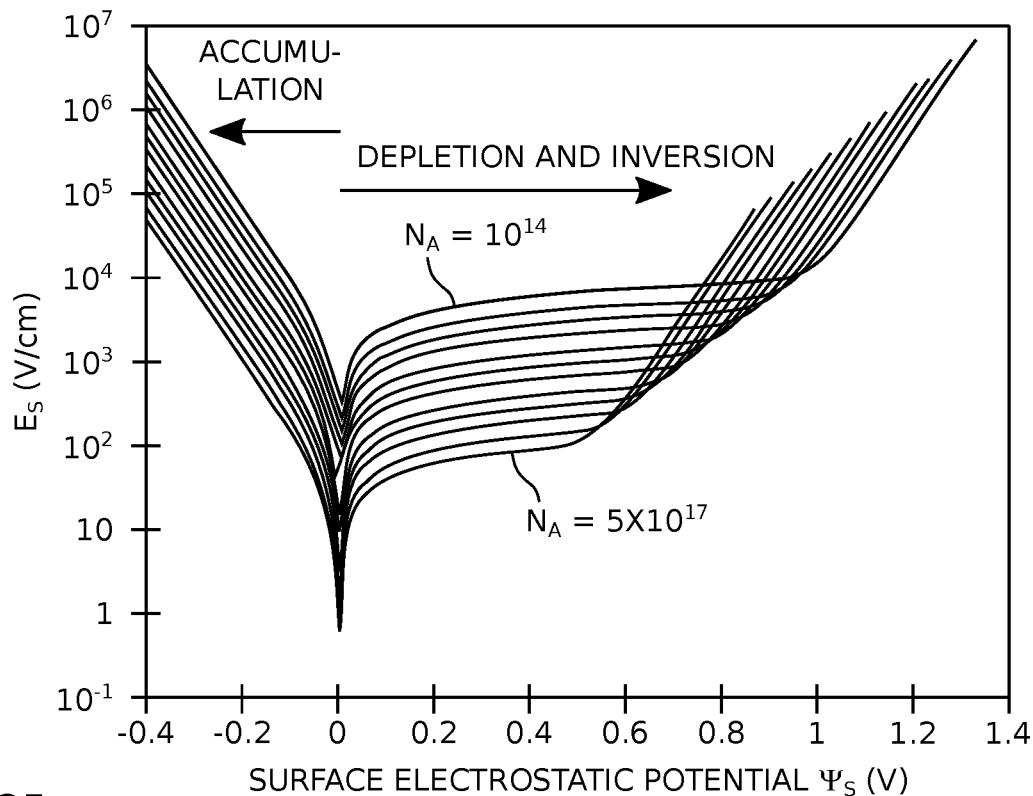
FIG. 25 shows the electric field at the Si—$SiO_2$ interface $E_S$, as a function of surface potential $\psi_S$ for p type uniform silicon doping concentrations of $10^{14}$, $2\times10^{14}$, $5\times10^{14}$, $10^{15}$, $2\times10^{15}$, $5\times10^{15}$, $10^{16}$, $2\times10^{16}$, $5\times10^{16}$, $10^{17}$, $2\times10^{17}$, $5\times10^{17}$ $cm^{-3}$ respectively for 10 nm $SiO_2$ oxide at 27° C.

FIG. 25 shows the electric field at the Si—$SiO_2$ interface $E_S$, as a function of surface potential $\psi_S$ for p type uniform silicon doping concentrations of $10^{14}$, $2\times10^{14}$, $5\times10^{14}$, $10^{15}$, $2\times10^{15}$, $5\times10^{15}$, $10^{16}$, $2\times10^{16}$, $5\times10^{16}$, $10^{17}$, $2\times10^{17}$, $5\times10^{17}$ cm$^{-3}$ respectively for 10 nm $SiO_2$ oxide at 27° C.

The gate voltage $V_G$ is given by the sum of Flat-Band Voltage $V_{FB}$, Surface Potential $\psi_S$, and the voltage drop $V_{OX}$ across the gate oxide with a thickness of $t_{OX}$. $V_{OX}$ is calculated by calculating the displacement vector in the oxide using the Gauss's pillbox method giving continuity of the normal component of the displacement vector [16, 17] stated as, $$D_{1n} = D_{2n} \rightarrow \varepsilon_{Si} E_S = \varepsilon_{OX} E_{OX} \tag{4.28}$$

where $E_{OX}$ is the electric field in the gate oxide. Since the electric field at the silicon-$SiO_2$ interface is known as given in (4.27), $E_{OX}$ can be solved from (4.28) giving, $$E_{OX} = \frac{\varepsilon_{Si}}{\varepsilon_{OX}} E_S \tag{4.29}$$

The voltage across an electric field is calculated by the line integral of the electric field [16, 17]. For a parallel plate capacitor, the electric field is constant between the plates and equal to the voltage difference between plates divided by the plate separation $t_{OX}$ giving, $$V_{OX} = \frac{\varepsilon_{Si}}{\varepsilon_{OX}} E_S t_{OX} \tag{4.30}$$

As a result, the gate voltage becomes, $$V_G = V_{FB} + \psi_S + t_{OX} E_S \frac{\varepsilon_{Si}}{\varepsilon_{OX}} \tag{4.31}$$

Where flat band voltage $V_{FB}$ is related to the work function differences between the gate and silicon $\Phi_{MS}$ and surface charge density at silicon-$SiO_2$ interface, along with trapped fixed oxide charge density integral given as, $$V_{FB} = \Phi_{MS} - \frac{Q_i}{C_{OX}} - \frac{1}{\varepsilon_{OX}} \int_0^{t_{OX}} \rho_{OX}(x) x dx \tag{4.32}$$

The $\Phi_{MS}$, work function differences between the gate and silicon is expressed as, $$\Phi_{MS} = \Phi_M - \Phi_S = \Phi_M - \left(\chi - \frac{E_C - E_i}{q} + \phi_F\right) \tag{4.33}$$

Where $\Phi_M$, $\Phi_S$, $\chi$, $E_C$, $E_i$, and q are gate work function, silicon work function, electron affinity of Silicon (4 eV), conduction band and intrinsic level energies, and electron charge respectively.

$\phi_F$ is the bulk potential in silicon which is related to the doping as, $$\phi_F = -v_T \ln\left(\frac{n}{n_i}\right) = v_T \ln\left(\frac{p}{n_i}\right) \tag{4.34}$$

Low Frequency Capacitance in MOS Capacitor, $C_{S,LF}$

Low frequency capacitance versus voltage is a very important characteristic for the MOS structure. There are 2 capacitors in series, $C_{OX}$ being voltage independent gate oxide capacitor between the gate and silicon, and $C_{S,LF}$ being gate bias voltage dependent capacitor in the silicon. The general relation of low frequency capacitance per unit area in the CDS or MOS capacitor is defined by [19-24], $$C_{LF} = \left|\frac{dQ_S}{dV_G}\right| = \frac{1}{\left(\frac{1}{C_{OX}} + \frac{1}{C_{S,LF}}\right)} \quad (4.35)$$

Charge $Q_S$, can be calculated with the integral form of Poisson's equation and the auxiliary equations given at (4.10) as, $$Q_S = \varepsilon_{Si} E_S(\psi_S) \quad (4.36)$$

$Q_S$ and $V_G$ are functions of the surface potential $\psi_S$. Combining (4.36) in (4.35) and $V_G$ from (4.31) gives, $$C_{LF} = \left|\frac{dQ_S}{dV_G}\right| = \varepsilon_{Si} \frac{dE_S}{d\left(\psi_S + t_{OX} E_S \frac{\varepsilon_{Si}}{\varepsilon_{OX}}\right)} = \frac{1}{\left(\frac{1}{C_{OX}} + \frac{1}{C_{S,LF}}\right)} \quad (4.37)$$

Differentiation in (4.37) gives the low frequency capacitance of the MOS capacitor $C_{S,LF}$ explicitly as, $$C_{S,LF} = \varepsilon_{Si}\sqrt{\frac{qn_i v_T}{\varepsilon_{Si}}} \frac{\left|\text{Sinh}\left(\frac{\psi_S - \phi}{v_T}\right) - \text{Sinh}\left(\frac{\phi}{v_T}\right)\right|}{\sqrt{\left[\text{Cosh}\left(\frac{\psi_S - \phi}{v_T}\right) + \frac{\psi_S}{v_T}\text{Sinh}\left(\frac{\phi}{v_T}\right) - \text{Cosh}\left(\frac{\phi}{v_T}\right)\right]}} \quad (4.38)$$

Simplifying (4.38) gives and writing in terms of $E_S$ gives, $$C_{S,LF} = 2\frac{qn_i}{E_S}\left[\text{Sinh}\left(\frac{\psi_S - \phi}{v_T}\right) + \text{Sinh}\left(\frac{\phi}{v_T}\right)\right] \quad (4.39)$$

Figure 26B:
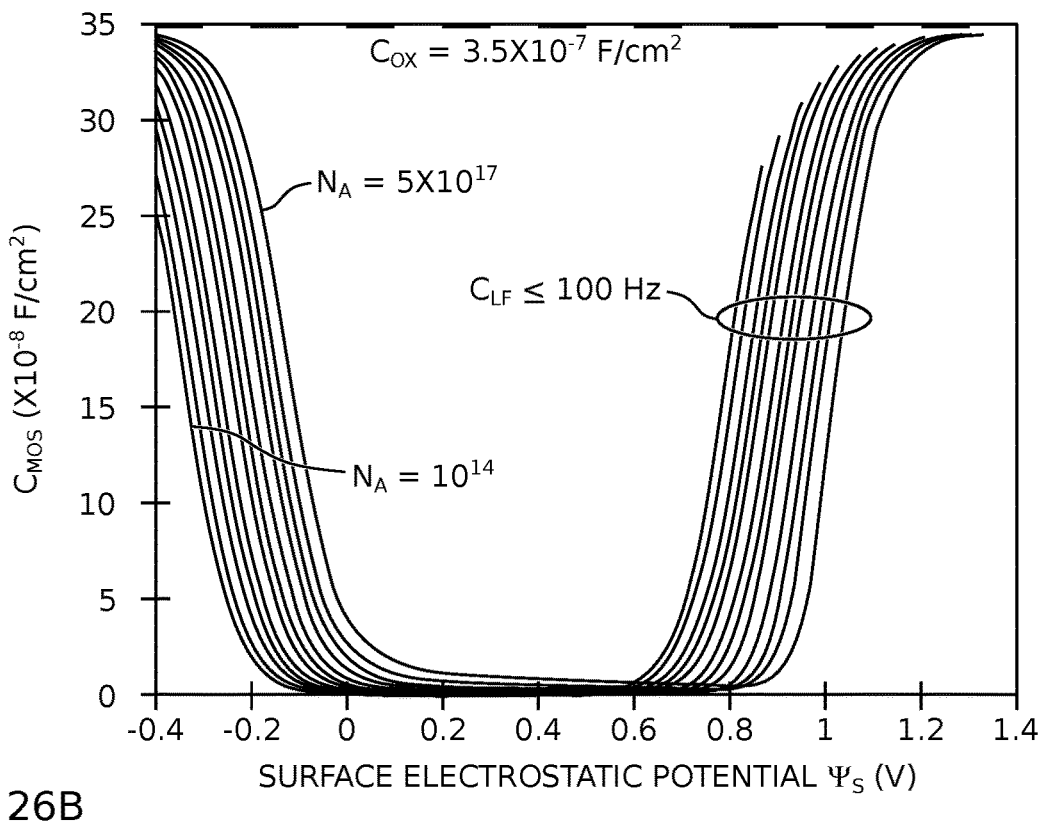

FIGS. 26A through 26E are graphs depicting surface electrostatic potential as a variable with $t_{OX}$=10 nm and $V_{MAX}$=10V. For example, FIG. 26B shows the low frequency $C_{Si}$ part of the capacitance at the Si—SiO$_2$ interface, as a function of surface potential $\psi_S$ for p type uniform silicon doping concentrations of $10^{14}$, $2\times10^{14}$, $5\times10^{14}$, $10^{15}$, $2\times10^{15}$, $5\times10^{15}$, $10^{16}$, $2\times10^{16}$, $5\times10^{16}$, $10^{17}$, $2\times10^{17}$, $5\times10^{17}$ cm$^{-3}$ respectively for 10 nm SiO$_2$ oxide at 27° C.

Flat Band Capacitance

Another important capacitance definition is the flat-band capacitance $C_{FB}$ when $\psi_S$=0, given using Debye Length as, $$C_{FB} = \frac{1}{\left(\frac{1}{C_{OX}} + \frac{L_D}{\varepsilon_{Si}}\right)} \quad (4.40)$$

where extrinsic Debye Length is given as, $$L_D = \sqrt{\frac{\varepsilon_{Si} v_T}{q|N_D^+ - N_A^-|}} \quad (4.41)$$

Deep Depletion Capacitance

Another important capacitance mode that can be encountered in CDS or MOS capacitor is known as "Deep Depletion Capacitance". If the gate voltage changes faster than the electrons can be generated at the Si—SiO$_2$ interface, there can be no inversion layer generation. This statement can be verified by solving the continuity equation for holes and electrons (4.3) and (4.4) for sinusoidal or transient boundary conditions. Measurement data also shows that low frequency curves are only for frequencies below 100 Hz, much lower frequencies than in most electronic devices in use. In this case the gate voltage causes the depletion layer to go deeper than the maximum depletion layer as defined on the onset of the strong inversion. For p type silicon, since this mode corresponds to "no electron generation" at the Si—SiO$_2$ interface, Poisson's equation without the electron concentration, and with only the hole concentration term in the charge expression, can be written as, $$\rho(x) = n_i \exp\left[\frac{\phi_p(x) - \psi(x)}{v_T}\right] + N_D^+ - N_A^- \quad (4.42)$$

With this charge relation the Poisson's equation that needs to be solved becomes, $$\frac{dE}{dx} = \frac{qn_i}{\varepsilon_{Si}}\left[2\text{Sinh}\left(\frac{\phi}{v_T}\right) - \exp\left(\frac{\phi - \psi}{v_T}\right)\right] \quad (4.43)$$

Applying the chain rule as above, $$\frac{dE}{dx} = \frac{dE}{d\psi}\frac{d\psi}{dx} = \frac{qn_i}{\varepsilon_{Si}}\left[2\text{Sinh}\left(\frac{\phi}{v_T}\right) - \exp\left(\frac{\phi - \psi}{v_T}\right)\right] \quad (4.44)$$

$$E\frac{dE}{d\psi} = -\frac{qn_i}{\varepsilon_{Si}}\left[2\text{Sinh}\left(\frac{\phi}{v_T}\right) - \exp\left(\frac{\phi - \psi}{v_T}\right)\right] \quad (4.45)$$

Finally giving electric field at the interface as, $$E_{S,DD} = \sqrt{\frac{2qn_i v_T}{\varepsilon_{Si}}\left\{2\frac{\psi_S}{v_T}\text{Sinh}\left(\frac{\phi}{v_T}\right) + \exp\left(\frac{\phi}{v_T}\right)\cdot\left[\exp\left(-\frac{\psi_S}{v_T}\right) - 1\right]\right\}} \quad (4.46)$$

The deep depletion gate voltage, $V_{G,DD}$ for this condition becomes, $$V_{G,DD} = V_{FB} + \psi_S + t_{OX} E_{S,DD}(\psi_S)\frac{\varepsilon_{Si}}{\varepsilon_{OX}} \quad (4.47)$$

The resulting deep depletion capacitance $C_{S,DD}$ becomes, $$C_{S,DD} = \left|\frac{qn_i}{E_{S,DD}}\left[2\text{Sinh}\left(\frac{\phi}{v_T}\right) - \exp\left(\frac{\phi - \psi_S}{v_T}\right)\right]\right| \quad (4.48)$$

High Frequency Capacitance

The high frequency MOS capacitance function is the same as the deep depletion capacitance relation as given in (4.48), but at a different gate voltage given as, $$V_{G,HF} = V_{FB} + \psi_S + t_{OX} E_S(\psi_S)\frac{\varepsilon_{Si}}{\varepsilon_{OX}} \quad (4.49)$$

Figure 26C:
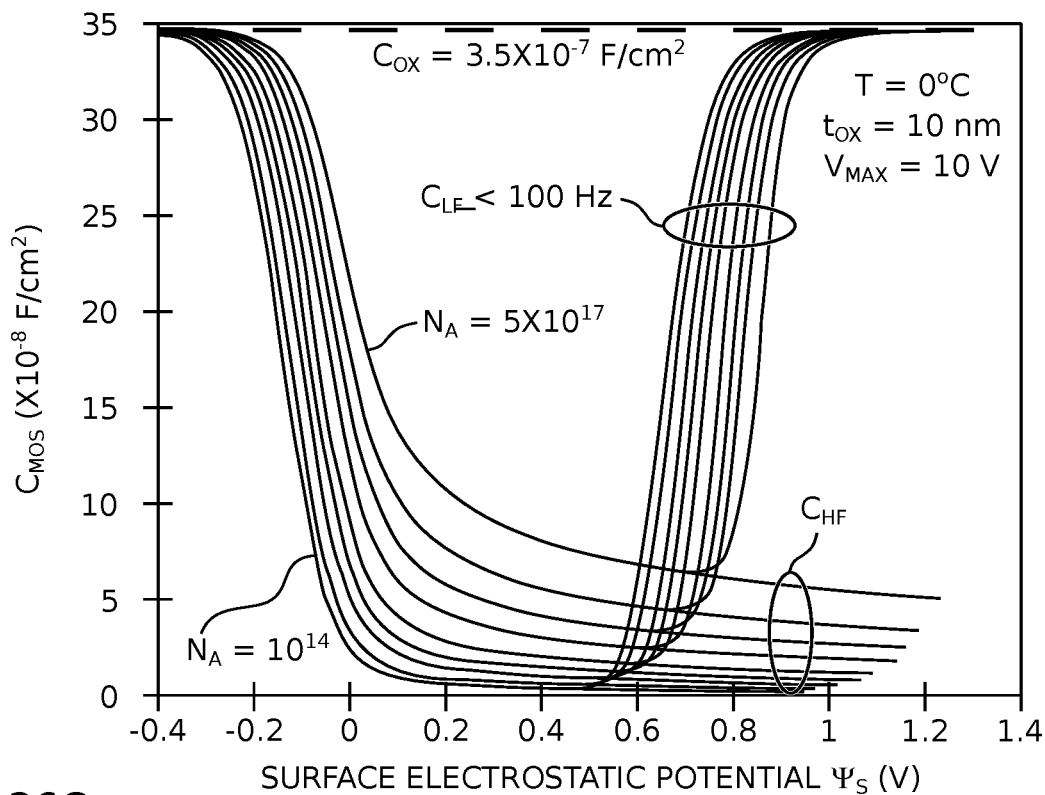
Figure 26D:
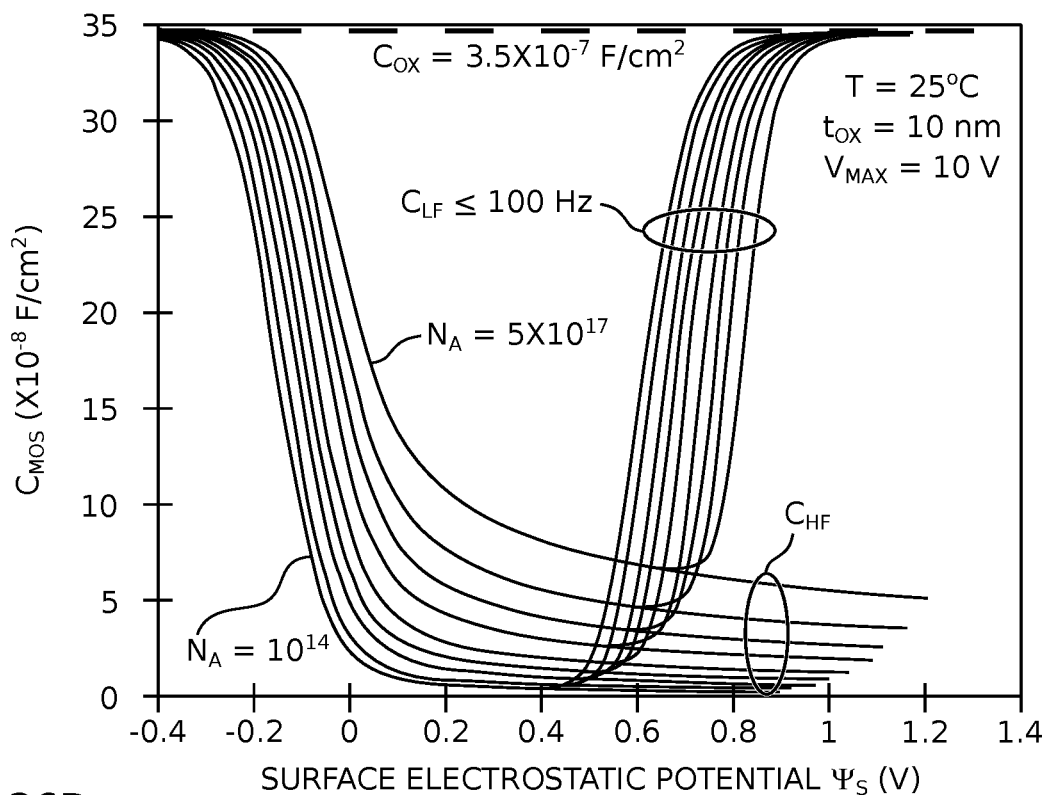
Figure 26E:
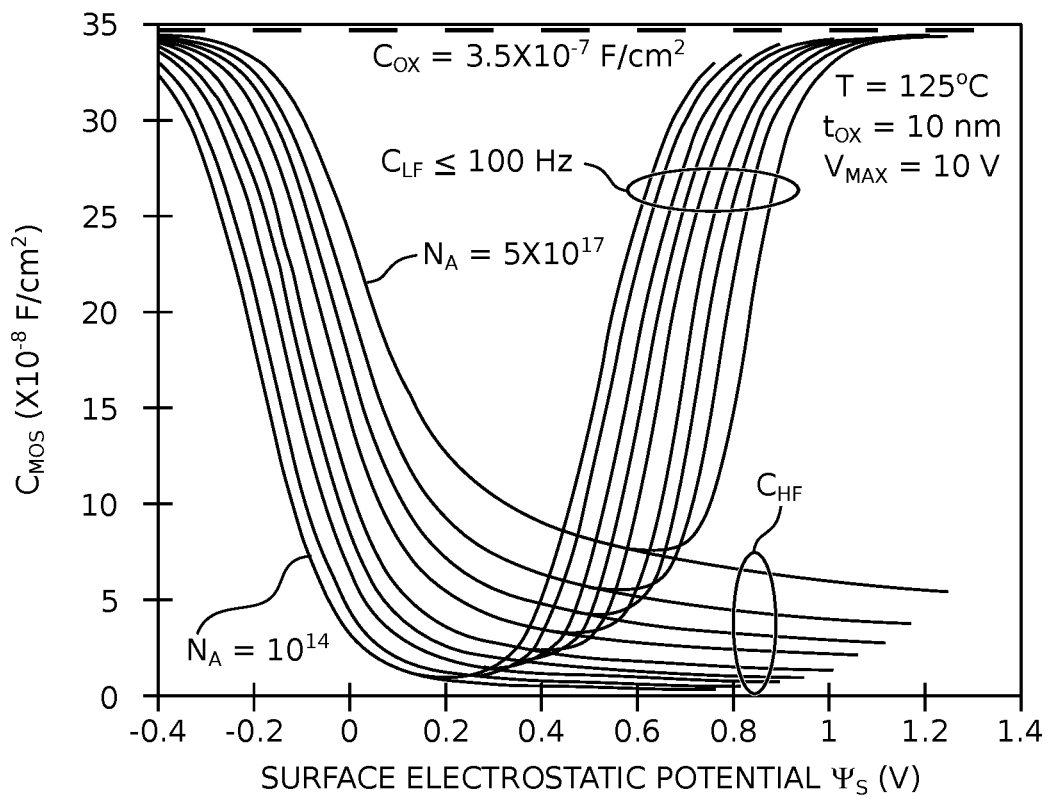

FIG. 26C-26E shows the low frequency and the high frequency of the MOS capacitance at the Si—SiO$_2$ interface, as a function of surface potential $\psi_S$ for p type uniform silicon doping concentrations of $10^{14}$, $2\times10^{14}$, $5\times10^{14}$, $10^{15}$, $2\times10^{15}$, $5\times10^{15}$, $10^{16}$, $2\times10^{16}$, $5\times10^{16}$, $10^{17}$, $2\times10^{17}$, $5\times10^{17}$ cm$^{-3}$ respectively for 10 nm SiO$_2$ oxide at 0, 27, 50, and 125° C.

Figure 27A:
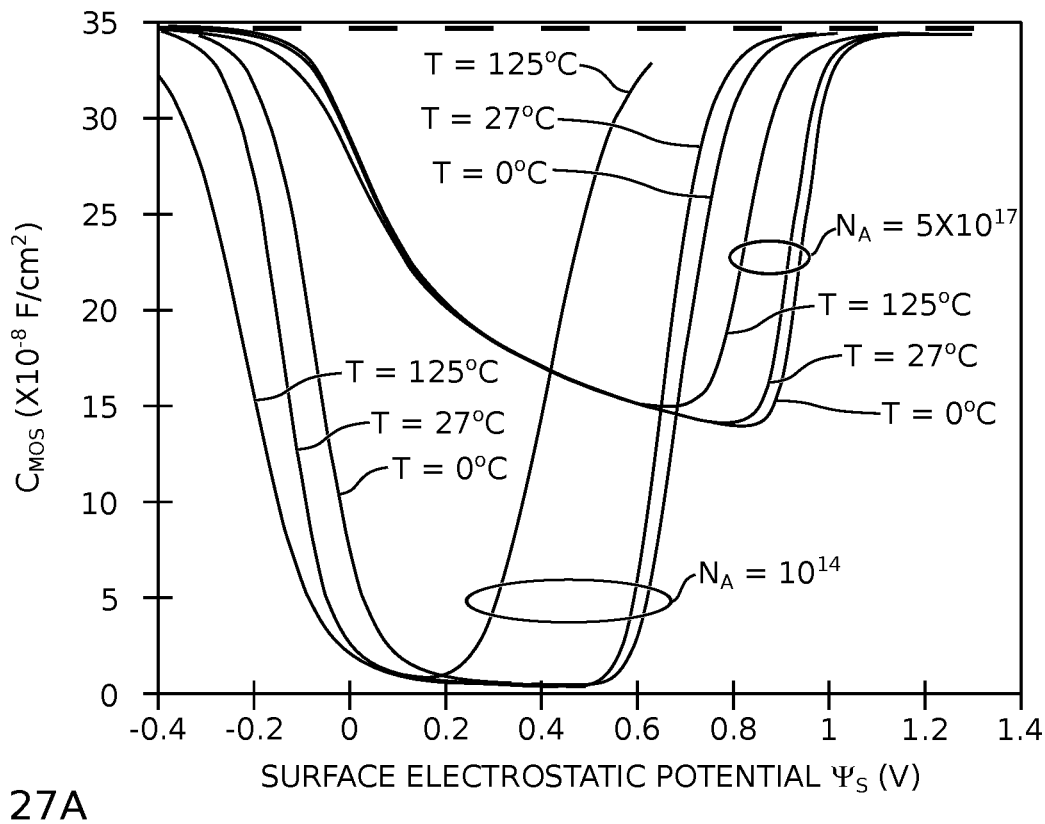
FIGS. 27A and 27B are a graphic summary, respectively, of low and high frequency capacitances for 0, 27, and 125° C. as a function only for p type uniform silicon doping concentrations of p type uniform silicon doping concentrations of $10^{14}$ and $5\times10^{17}$ $cm^{-3}$.
Figure 27B:
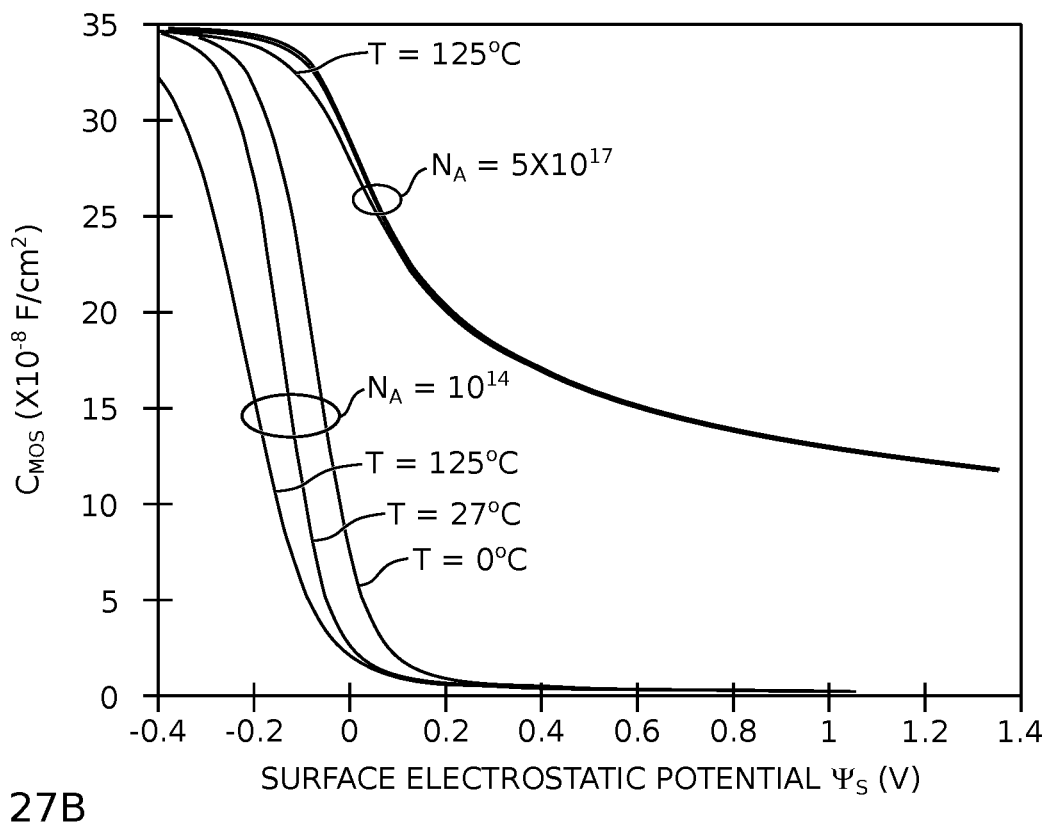

FIGS. 27A and 27B are a graphic summary, respectively, of low and high frequency capacitances for 0, 27, and 125° C. as a function only for p type uniform silicon doping concentrations of p type uniform silicon doping concentrations of $10^{14}$ and $5\times10^{17}$ cm$^{-3}$.

Minimum Capacitance Approximation

Figure 28:
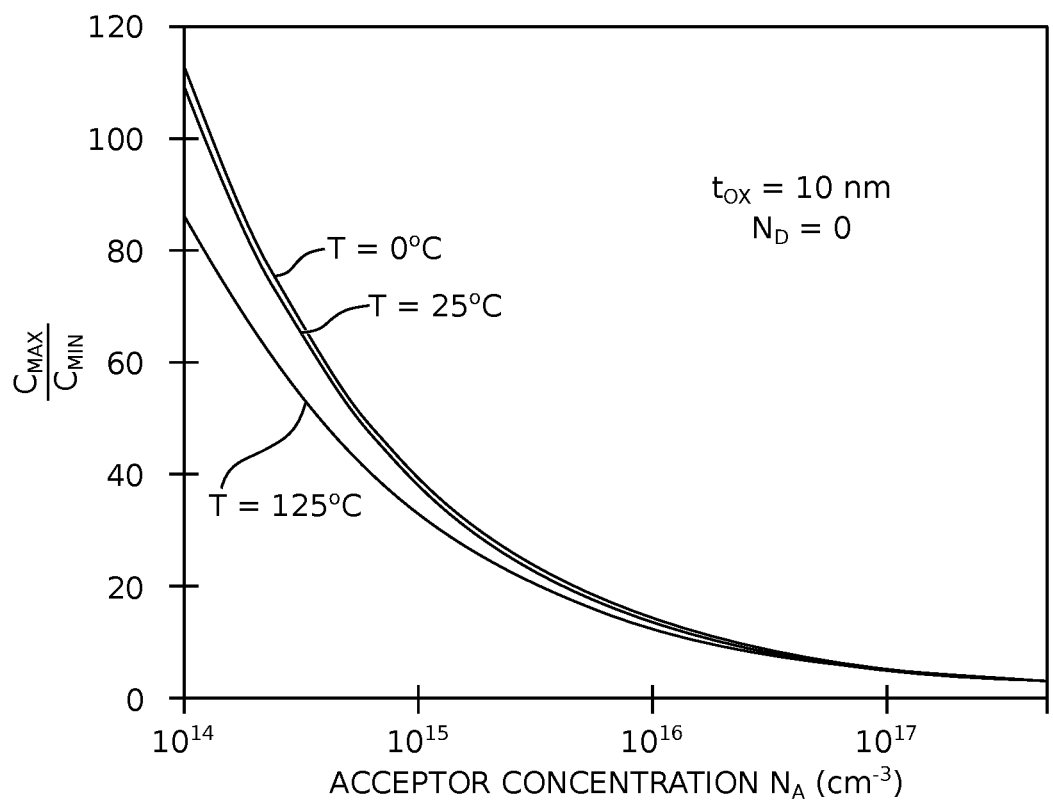
FIG. 28 depicts the $C_{MAX}/C_{MIN}$ ratio, indicating a fairly large varactor tuning range, as approximated from relation (4.50).

FIG. 28 depicts the $C_{MAX}/C_{MIN}$ ratio, indicating a fairly large varactor tuning range, as approximated from relation (4.50), with $t_{OX}$=10 nm and $V_{MAX}$=10V. For varactor applications an important factor is the $C_{MAX}$ to $C_{MIN}$ ratio as a function of oxide thickness and doping concentration. Deriving the exact "minimum capacitance" formulation can get complicated, but for p type silicon its close approximation is given by, $$\frac{1}{C_{MIN}} = \frac{1}{C_{OX}} + \sqrt{\frac{2(2\phi + v_T)}{qN_A\varepsilon_{Si}}} \quad (4.50)$$

Processing the High-Density Capacitors Along with Inductors: Modified HARMS Process There are many ways of processing the capacitor structures along with inductors who are familiar with Silicon processing and Bosch process and HARMS process steps.

Step 1. Picking the Right Substrate Resistivity and Thickness

Substrate resistivity is not an issue of consideration for inductors built by using the HARMS process, as it does not affect the inductor performance. On the other hand, it can be a serious issue for high Q capacitors, which is important for PMIC applications. For other applications where having high Q capacitors are not an issue, like in capacitor applications in non-power RF applications, typical 10 Ω·cm high resistivity substrates can be used as a starting material. Using high resistivity substrates can even be desirable in building very small footprint delay line circuits, filters, varactor applications, snubber circuits, and similar circuits using this property.

Therefore, the first step is to pick the right substrate doping level depending on the application. The thickness of the substrate is another consideration determined mainly by the inductor specification and Si core thickness effect on the inductor value, size, and performance as shown extensively in [1]. Typical silicon thicknesses are 50, 100, 200, and 300µ. Silicon thicknesses of 300µ and higher don't require a bonded SOI wafer, as they can be built directly on the silicon wafer with 1-2µ thermally grown SiO$_2$ serving as the insulator base.

Step 2. Making 2 Different Depth Trenches

In the Modified HARMS process there can be two different trench depths in the same material. The "inductor trench", which is also called "deep trench", goes all the way to the bottom insulator region, which is the SiO$_2$ layer at the substrate bottom where the inductors, transmission lines, comb capacitors, and high current stripes are built. The CDS capacitor trench, which may be referred to as the "shallow trench", goes as deep as possible to the SiO$_2$ layer at the bottom, but not touching it. The CDS capacitor trench is a shallower trench than the inductor trench, but still is a deep trench as far as conventional trenching is concerned, and is used to form the textured electrode. Typically, the CDS capacitor trench is 10-20% of the silicon thickness, whereas the inductor trench goes as deep as the silicon thickness to the top of the SiO$_2$ layer at the bottom. In the conventional HARMS process there is only one trench depth, which goes all the way to the bottom insulator region formed by the SiO$_2$ layer, corresponding to the inductor trench or the deep trench. There can be 2 methods of processing for making deep and shallow trenches.

Step 2.1. Two Mask Bosch Etch Processes

There can be several variations in the process, and one familiar with the technology can adapt the ideas given in this work. Let $b_Z$ be the depth difference between the inductor and CDS capacitor trenches and assume that $b_Z$=2µ as an example. The inductor trench region is patterned by a mask used for inductors, comb capacitors, and transmission lines, and is etched first by masking the regions of the wafer that will be used for capacitors. The first Bosch etch with a target depth of approximately $b_Z$=2µ is performed. Then, the capacitor regions may be patterned as trench array or column array, and the second Bosch etch is performed such that the inductor trench reaches the SiO$_2$ layer at the bottom. As a result, the CDS capacitor trench bottom is at least $b_Z$ higher than the SiO$_2$ layer at the bottom, and won't be touching the insulator. Here it should also be noted that the CDS capacitor trench density etch is always higher than the inductor trench density. This guarantees that the Bosch etch rate in the CDS capacitor etch region is slower than the inductor trench etch rate. This process creates a larger distance between the trench floor and SiO$_2$ layer at the bottom than $b_Z$=2µ. Fine tuning and control can create the desired $b_Z$ very precisely.

Step 2.2. Single Mask Bosch Etch Process

This is the simplest method of making trenches, using a single Bosch etch step and a single mask. The method is based on the density dependent Bosch etch rate explained above. Since the inductor trench region always has a larger etch area per unit area than the CDS capacitor trench, using the trench density dependent trench etch rate property of the Bosch process always assures deeper trench depths in the inductor regions than the CDS capacitor trench areas. This property allows the use of a single trench etch mask, resulting in 2 different depth trenches. Shallow trenches are formed in the capacitor regions and deep trenches, all the way to the insulator, are formed for the inductors, comb capacitors, transmission lines, and high current straps.

Step 3. Insulator Growth

This step is intended for forming the dielectric region of the CDS capacitor. It can be ALD type dielectric deposition or thermally grown higher quality SiO$_2$ on the entire silicon wafer surface. After this step the entire surface of the silicon wafer is covered by the dielectric material of desired thickness based on the desired breakdown voltage of the capacitors. The insulator covers both the inductor silicon fence (core) and the CDS capacitor regions as well. Since silicon is very resistive compared to metal, an oxide or dielectric layer in between the metal and the silicon core does not create a current flow in the Si core parallel to the current in the metal, and therefore doesn't change the electrical performance of the inductor. Alternatively, the dielectric in the capacitor regions can be masked and dielectric overlying the inductor Si core can be removed in an etch step.

Step 4. Top Electrode Conductor Deposition

In this step Al, Cu, Ta, or other low resistivity metals, polycrystalline semiconductors, or doped semiconductors cover the dielectric everywhere using ALD or any other means capable of covering all the high aspect ratio texturing in the capacitor and inductor regions. The inductor winding cross-section is different than in the one explained in the HARMS process in [1], having an insulator between the Si core and the metal forming the winding.

Figure 29:
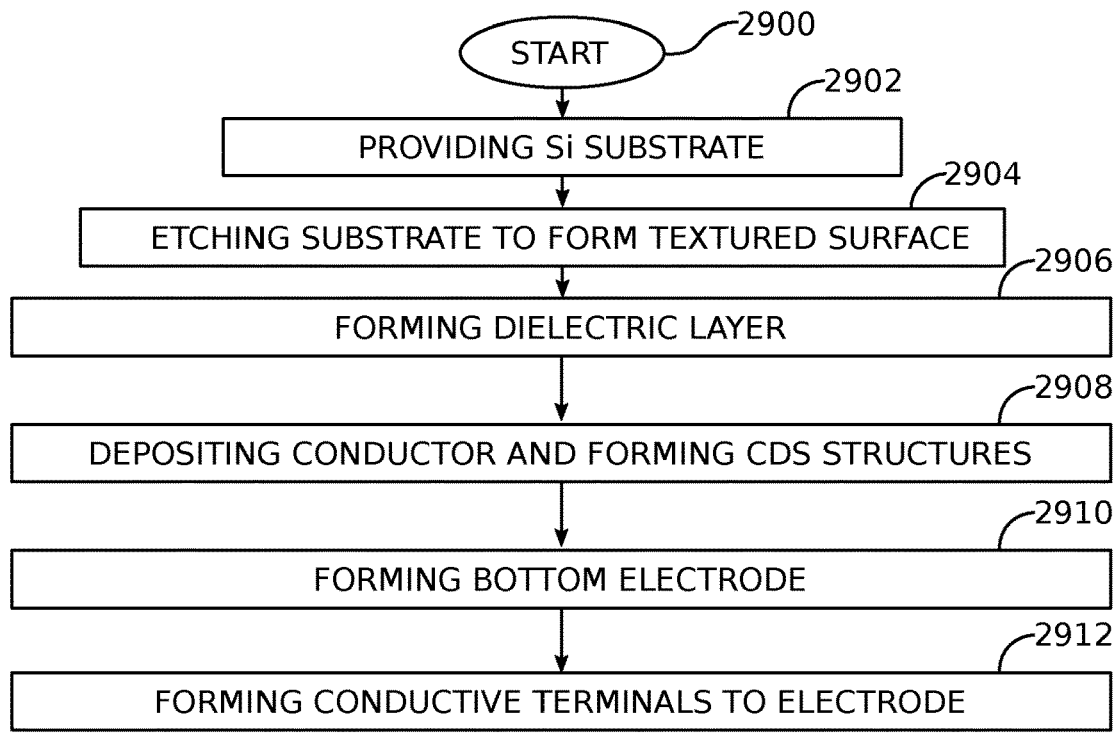
FIG. 29 is a flowchart illustrating a method for fabricating a capacitor with high aspect ratio Si cores.

FIG. 29 is a flowchart illustrating a method for fabricating a capacitor with high aspect ratio Si cores. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 2900.

Step 2902 provides a Si substrate having a planar top surface and a planar bottom surface. Step 2904 etches the Si substrate top surface to form a textured surface including a plurality of adjacent high aspect ratio Si cores. Typically, the Bosch process may be used to perform this step. Step 2906 forms a dielectric layer overlying the Si substrate textured surface, by thermally growing a silicon oxide or nitride insulator or using the ALD process to deposit a dielectric insulator. For example, 10 nm-2,000 nm thick $SiO_2$ can be very reliably and repetitively grown to create 10-200V breakdown voltages. Step 2908 conformally coats the dielectric layer with a top conductor layer forming a plurality of adjacent CDS structures. The top conductor layer typically has a thickness that is less than or equal to four times the conductor skin depth at the capacitor operating frequency, and it may be a metal, polycrystalline semiconductor, a doped semiconductor, or a doped polycrystalline semiconductor. Step 2910 forms a planar bottom conductor layer overlying the Si substrate bottom surface. Step 2912 forms first and second electrically conductive terminals respectively connected to the top and bottom conductive layers.

As noted in detail above, forming the textured Si substrate top surface in Step 2904 includes forming Si cores having a width ($C_X$), a height ($C_Z$), with an aspect ratio ($\alpha$) of $C_Z$-to-$C_X$ of at least 5:1, separated by a spacing ($S_X$) having a spacing aspect ratio ($\alpha_{SPACE}$) of $C_Z$-to-$C_X$ of at least 5:1.

In one aspect, forming the textured Si substrate top surface in Step 2904 includes etching the Si substrate top surface to form unetched Si cores extending from an etched floor region. Then, forming the first conductive terminal in Step 2912 includes forming the first conductive terminal on the etched floor region, see FIG. 8A. Alternatively, Step 2904 etches the Si substrate top surface to form an unetched top surface region with trenches between unetched Si cores, and Step 2912 forms the first conductive terminal on the unetched top surface region, see FIG. 8C. In another aspect, Step 2904 forms Si cores as adjacent parallel Si ridges (FIG. 9), adjacent columns (FIG. 10A), or as a honeycomb structure (FIG. 11A).

In another aspect, forming the textured Si substrate top surface in Step 2904 includes forming Si cores having a height ($C_Z$), and coating the dielectric layer with the top conductor layer in Step 2908 includes forming CDS structures having a height ($T_Z$), where $C_Z \geq 0.9 T_Z$.

Figure 30:
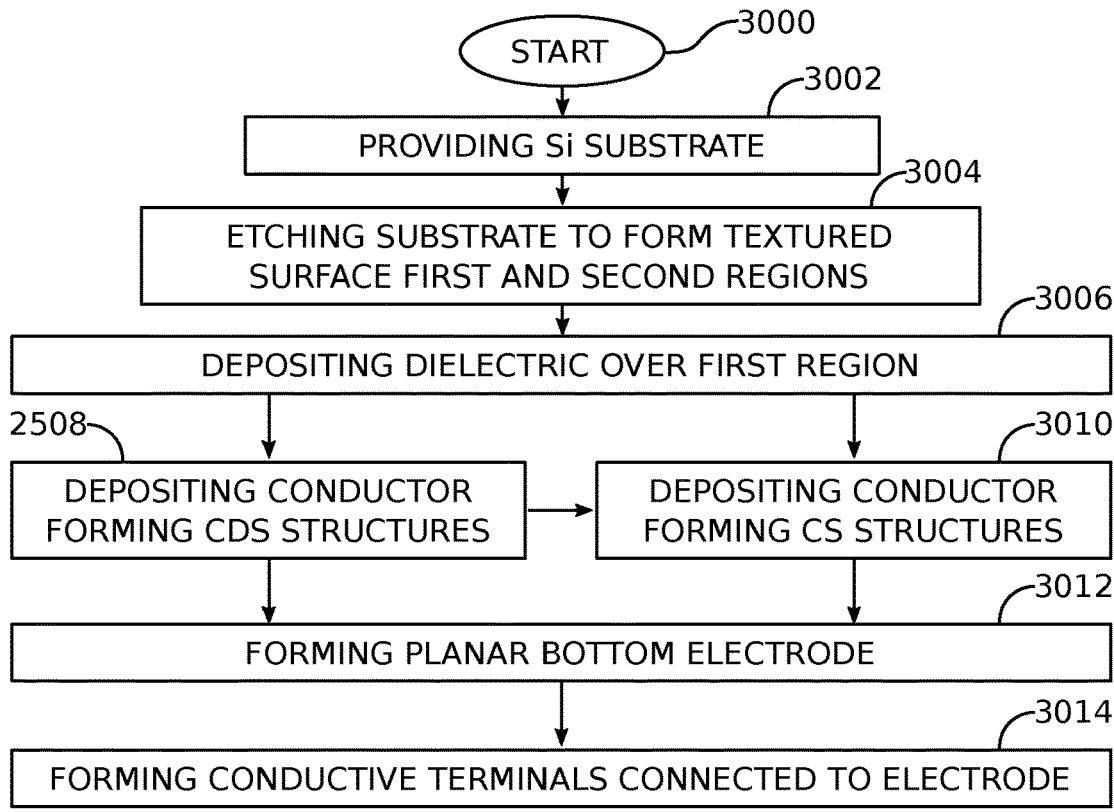
FIG. 30 is a flowchart illustrating a method for fabricating an inductor-capacitor (LC) network with high aspect ratio Si cores.

FIG. 30 is a flowchart illustrating a method for fabricating an inductor-capacitor (LC) network with high aspect ratio Si cores. The method begins at Step 3000. Step 3002 provides a Si substrate having a planar Si top layer and a planar Si bottom layer. Step 3004 etches the Si top layer to form a textured surface first region including a plurality of adjacent high aspect ratio first Si cores, as well as forming a textured surface second region with a continuous high aspect ratio second Si core in the shape of a winding. Step 3006 forms a dielectric layer overlying the first Si cores. In one aspect, the dielectric layer is also formed over the second Si core in the inductor region (FIG. 13B). Step 3008 forms a top conductor layer conformally coating the textured surface first region, creating adjacent CDS structures. Step 3010 forms a top conductor layer overlying the second Si core creating a CS inductor line having a first end connected to the capacitive CDS structures in textured surface first region. As noted above, in some aspects Steps 3004 and 3006 may be combined in a single etch step, or they may be performed as two separate etch steps. Step 3012 forms a planar bottom conductor layer overlying the silicon substrate bottom layer in region underlying the textured surface first region. Step 3014 forms a first electrically conductive terminal to capacitive CDS structures in the textured surface first region, a second electrically conductive terminal to the bottom conductive layer, and a third electrically conductive terminal connected to a second end of the CS inductor line.

In one aspect, providing the Si substrate in Step 3002 includes providing a SOI substrate having a Si top layer thickness (d1) and a silicon dioxide layer thickness (d2) underlying the Si top layer. Etching the Si substrate top surface in Step 3004 includes forming first Si cores in the textured surface first region having a trench depth ($C_{Z1}$) less than d1. Etching the Si substrate top surface in Step 3006 includes forming a second Si core in the textured surface second region having a trench depth ($C_{Z2}$) that is greater than d1, but less than (d1+d2).

In another aspect, forming the first Si cores in the textured surface first region (Step 3004) includes forming first Si cores having a width ($C_{X1}$), a height ($C_{Z1}$), with an aspect ratio ($\alpha_1$) of $C_{Z1}$-to-$C_{X1}$ of at least 5:1, separated by a spacing ($S_{X1}$) having a spacing aspect ratio ($\alpha_{SPACE1}$) of $C_{Z1}$-to-$S_{X1}$ of at least 5:1. Forming the second Si core in the textured surface second region (Step 3006) includes forming a second Si core having a width ($C_{X2}$), a height ($C_{Z2}$), and an aspect ratio ($\alpha_2$) of $C_{Z2}$-to-$C_{X2}$ of at least 5:1, where adjacent sections of the Si core winding are separated by a spacing ($S_{X2}$) having a spacing aspect ratio ($\alpha_{SPACE2}$) of $C_{Z2}$-to-$S_{X2}$ of at least 5:1.

High aspect ratio passive electrical components and associated fabrication processes have been presented. Examples of particular geometries, materials, and process steps have been presented to illustrate the invention. However, the invention is not limited to merely these examples. Other variations and embodiments of the invention will occur to those skilled in the art.

I claim:

1. A high aspect ratio capacitor comprising:
a single-piece silicon (Si) substrate having a first surface and a second surface;
a plurality of at least three Si cores extending from the substrate first surface, each Si core have a height ($C_Z$) and an equal spacing ($S_X$) between adjacent Si cores by a spacing ($S_X$), with a spacing aspect ratio ($a_{SPACE}$) of $C_Z$-to-$S_X$ of at least 5:1;
a dielectric layer conformally coating the Si cores;
an electrical conductor layer conformally coating the dielectric layer; and
an electrode formed on the substrate second surface, underlying the plurality of Si cores.

2. The capacitor of claim 1 wherein the combination of each Si core, overlying dielectric layer, and overlying electrical conductor form a conductor-dielectric-silicon (CDS) structure having an overall height ($T_Z$), where each Si core height ($C_Z$) comprises at least 90% of the overall height ($T_Z$).

3. The capacitor of claim 2 wherein a first plurality of adjacent CDS structures have a first CDS structure height per area and a first capacitance between adjacent first plurality CDS structures; and wherein a second plurality of adjacent CDS structures have a second CDS structure height per area, greater than the first CDS structure height per area, and a second capacitance between adjacent second plurality CDS structures, greater than the first capacitance.

4. The capacitor of claim 2 wherein a first plurality of adjacent CDS structures each have a first CDS Si core aspect ratio per area and a first capacitance between adjacent first plurality CDS structures; and wherein a second plurality of adjacent CDS structure each have a second CDS Si core aspect ratio per area, greater than the first CDS Si core aspect ratio and a second capacitance between adjacent second plurality CDS structures, greater than the first capacitance.

5. The capacitor of claim 2 wherein a first plurality of adjacent CDS structures have a first dielectric layer thickness, a first capacitor breakdown voltage, and a first capacitance per unit area; and wherein a second plurality of adjacent CDS structures have a second dielectric layer thickness greater than the first dielectric layer thickness, a second capacitor breakdown voltage greater than the first capacitor breakdown voltage, and a second capacitance per unit area less than the first capacitance per unit area.

6. The capacitor of claim 2 wherein the electrical conductor layer overlying a first plurality of CDS structures forms a first textured conductive surface area with a first capacitance density; and wherein the electrical conductive layer overlying a second plurality of CDS structures forms a second textured surface area, greater than the first textures surface area, with a second capacitance density greater than the first capacity density.

7. The capacitor of claim 1 wherein each Si core has a length ($C_Y$) and a width ($C_X$), where $C_Y > C_X$.

8. The capacitor of claim 1 wherein the CDS Si cores have an aspect ratio (a) of $C_Z$-to-$C_X$ of at least 5:1.

9. The capacitor of claim 1 wherein the Si cores have a width ($C_X$), an aspect ratio (a) $C_Z$-to-$C_X$ of at least 5:1, and where the aspect ratio (a) is equal to the spacing aspect ratio ($a_{SPACE}$).

10. The capacitor of claim 1 wherein the substrate is an interposer integrated circuit (IC);

the capacitor further comprising:
a first electrically conductive terminal connected to the electrical conductor layer; and
a second electrically conductive terminal connected to the electrode formed on the substrate second surface.

11. The capacitor of claim 1 wherein each Si core vertical surface comprises a series of sidewall scallops aligned in a z-plane, where each scallop is responsive to a separate step of etching.

12. A high aspect ratio conductor-dielectric-silicon (CDS) capacitor comprising:

a single-piece silicon (Si) substrate having a textured first surface and a second surface;
a textured electrode conformally coating the substrate textured first surface comprising a plurality of adjacent high aspect ratio CDS structures, each CDS structure including:
a Si core;
a dielectric layer overlying the Si core;
an electrical conductor layer overlying the dielectric layer;
a planar electrode formed on the substrate second surface, underlying the textured electrode; and
wherein the CDS Si cores have a width ($C_X$), a height ($C_Z$), and an aspect ratio (a) of $C_Z$-to-$C_X$ of at least 5:1, and wherein adjacent CDS structure Si core centers are separated by a spacing ($S_X$) and have a spacing aspect ratio ($a_{SPACE}$) of $C_Z$-to-$S_X$ of at least 5:1.

13. The capacitor of claim 12 wherein each CDS Si core has a length ($C_Y$), where $C_Y > C_X$.

14. The capacitor of claim 13 wherein the textured electrode forms a plurality of parallel trenches between adjacent CDS structures.

15. The capacitor of claim 12 wherein the Si core comprises at least 90% of the CDS structure height.

16. The capacitor of claim 12 wherein the plurality of adjacent CDS structures includes a first plurality of adjacent CDS structures having a first CDS structure height per area and a first capacitance between adjacent first plurality CDS structures; and wherein the plurality of adjacent CDS structures includes a second plurality of adjacent CDS structures having a second CDS structure height per area, greater than the first CDS structure height per area, and a second capacitance between adjacent second plurality CDS structures, greater than the first capacitance.

17. The capacitor of claim 12 wherein the plurality of adjacent CDS structures includes a first plurality of adjacent CDS structures having a first CDS Si core aspect ratio per area and a first capacitance between adjacent first plurality CDS structures; and wherein the plurality of adjacent CDS structures includes a second plurality of adjacent CDS structure having a second CDS Si core aspect ratio per area, greater than the first CDS Si core aspect ratio, and a second capacitance between adjacent second plurality CDS structures, greater than the first capacitance.

18. The capacitor of claim 12 wherein the plurality of adjacent CDS structures includes a first plurality of adjacent CDS structures having a first dielectric layer thickness, a first capacitor breakdown voltage, and a first capacitance per unit area; and wherein the plurality of adjacent CDS structures includes a second plurality of adjacent CDS structures having a second dielectric layer thickness greater than the first dielectric layer thickness, a second capacitor breakdown voltage greater than the first capacitor breakdown voltage, and a second capacitance per unit area less than the first capacitance per unit area.

19. The capacitor of claim 12 wherein the CDS structure conductor layer thickness is less than or equal to four times the conductor skin depth at the capacitor operating frequency.

20. The capacitor of claim 12 wherein the substrate is an interposer integrated circuit (IC);

the capacitor further comprising:
a first electrically conductive terminal connected to the textured electrode; and
a second electrically conductive terminal connected to the planar electrode.

21. The capacitor of claim 12 wherein the combination of a first plurality of CDS structure electrical conductor layers forms a first textured conductive surface area with a first capacitance density; and wherein the combination of a second plurality of CDS structure electrical conductor layers forms a second textured surface area, greater than the first textures surface area, with a second capacitance density greater than the first capacity density.

22. The capacitor of claim 12 wherein the CDS structure electrical conductor layer is a material selected from the group consisting of metal, polycrystalline semiconductor, a doped semiconductor, and a doped polycrystalline semiconductor.

23. The capacitor of claim 12 wherein the CDS Si cores have an aspect ratio (a) of $C_Z$-to-$C_X$ of at least 10:1.

24. The capacitor of claim 12 wherein the aspect ratio (a) is equal to the spacing aspect ratio ($a_{SPACE}$).

25. The capacitor of claim 12 wherein the dielectric layer conformally coats the substrate textured first surface underlying the plurality of adjacent Si cores.

26. A high aspect ratio conductor-dielectric-silicon (CDS) capacitor comprising:
    a single-piece silicon (Si) substrate having a textured first surface and a second surface, with adjacent Si cores extending from the textured first surface;
    a dielectric layer conformally coating the Si cores;
    a textured electrode conformally coating the dielectric layer;
    a planar electrode formed on the substrate second surface, underlying the textured electrode; and
    wherein the Si cores have a width ($C_X$), a height ($C_Z$), an aspect ratio (a) of $C_Z$-to-$C_X$ of at least 5:1, extending at a right angle with respect to the substrate first surface.

27. The capacitor of claim 26 wherein the spacing ($S_X$) between Si core centers is identical.

28. The capacitor of claim 26 wherein the Si cores have a spacing between Si cores in an x-plane where the spacing is equal to $C_X$.

29. A high aspect ratio conductor-dielectric-silicon (CDS) capacitor comprising:
    a single-piece silicon (Si) substrate having a textured first surface and a second surface;
    a textured electrode conformally coating the substrate textured first surface comprising a plurality of adjacent high aspect ratio CDS structures, each CDS structure including:
       a Si core;
       a dielectric layer overlying the Si core;
       an electrical conductor layer overlying the dielectric layer;
    a planar electrode formed on the substrate second surface, underlying the textured electrode; and
    wherein the CDS Si cores have a width ($C_X$), a height ($C_Z$), and an aspect ratio (a) of $C_Z$-to-$C_X$ of at least 5:1, and wherein adjacent CDS structure Si cores are separated in an x-plane by a spacing equal to $C_X$.

30. The capacitor of claim 29 wherein each Si core has a length ($C_Y$), where $C_Y > C_X$.

* * * * *

UNITED STATES PATENT AND TRADEMARK OFFICE
CERTIFICATE OF CORRECTION

Page 1 of 1

PATENT NO. : 10,510,828 B2
APPLICATION NO. : 16/217229
DATED : December 17, 2019
INVENTOR(S) : Osman Ersed Akcasu It is certified that error appears in the above-identified patent and that said Letters Patent is hereby corrected as shown below:

On the Title Page

The title is incorrectly printed. The word "radio" should be replaced with the word "ratio".

The name of the assignee is incorrectly printed. The assignee name is as follows:
nanoHenry, Inc.

Signed and Sealed this
Tenth Day of March, 2020

Andrei Iancu
*Director of the United States Patent and Trademark Office*